(12) United States Patent
Seto et al.

(10) Patent No.: US 7,601,819 B2
(45) Date of Patent: Oct. 13, 2009

(54) AZO DYE, COLORED CURABLE COMPOSITION, COLOR FILTER AND PRODUCING METHOD THEREFOR

(75) Inventors: Nobuo Seto, Kanagawa (JP); Nobuo Suziki, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 868 days.

(21) Appl. No.: 11/043,991

(22) Filed: Jan. 28, 2005

(65) Prior Publication Data

US 2005/0175908 A1 Aug. 11, 2005

(30) Foreign Application Priority Data

Jan. 29, 2004 (JP) ............................. 2004-021391
Jan. 29, 2004 (JP) ............................. 2004-021392
Mar. 23, 2004 (JP) ............................. 2004-085658

(51) Int. Cl.
C09B 29/42 (2006.01)
(52) U.S. Cl. ...................... 534/766; 534/767; 534/768; 430/7; 430/270.1
(58) Field of Classification Search ...................... None
See application file for complete search history.

(56) References Cited

U.S. PATENT DOCUMENTS

| | | | |
|---|---|---|---|
| 3,573,272 A | 3/1971 | Kaupp et al. | |
| 4,282,144 A | 8/1981 | Weaver et al. | |
| 5,324,826 A * | 6/1994 | Matzinger | 534/794 |
| 5,446,136 A | 8/1995 | Pape et al. | |
| 7,005,507 B2* | 2/2006 | Pichler et al. | 534/766 |
| 7,109,336 B2* | 9/2006 | Fujiwara et al. | 544/324 |
| 2003/0148216 A1* | 8/2003 | Wang et al. | 430/270.16 |
| 2007/0112134 A1* | 5/2007 | Seto | 525/165 |
| 2009/0092802 A1* | 4/2009 | Kato et al. | 428/195.1 |

FOREIGN PATENT DOCUMENTS

| DE | 23 52 831 A1 | 4/1975 |
|---|---|---|
| EP | 1 508 597 A1 | 2/2005 |
| GB | 1504532 * | 3/1978 |
| JP | 55-161856 A | 12/1980 |
| JP | 1-102469 A | 4/1989 |
| JP | 1-152499 A | 6/1989 |
| JP | 2-181704 A | 7/1990 |
| JP | 2-199403 A | 8/1990 |
| JP | 4-76062 A | 3/1992 |
| JP | 5-273411 A | 10/1993 |
| JP | 6-75375 A | 3/1994 |
| JP | 6-145543 A | 5/1994 |
| JP | 6-184482 A | 7/1994 |
| JP | 7-140654 A | 6/1995 |
| JP | 7-224230 A | 8/1995 |
| JP | 7-111485 B2 | 11/1995 |
| JP | 9-234964 A | 9/1997 |
| JP | 9-277703 A | 10/1997 |
| JP | 2002-14220 A | 1/2002 |
| JP | 2002-14221 A | 1/2002 |
| JP | 2002-14223 A | 1/2002 |
| JP | 2003-246942 A | 9/2003 |
| JP | 2004307633 A | 11/2004 |
| WO | WO 02/083662 A2 | 10/2002 |

OTHER PUBLICATIONS

D. Chapman et al., "Pyrazolopyridines. Part 5. Preparation and Reaction of Pyrazolo-3,4-clpyridines", J. Chem. Soc. Perkin I, 1980, pp. 2398-2404, XP009049302.

* cited by examiner

*Primary Examiner*—Fiona T Powers
(74) *Attorney, Agent, or Firm*—Sughrue Mion, PLLC

(57) ABSTRACT

A dye represented by the following formula (1-1), a colored curable composition using the same, and a colored curable composition including a dye represented by the following formula (1) and at least one dye represented by the following formula (2) or (3):

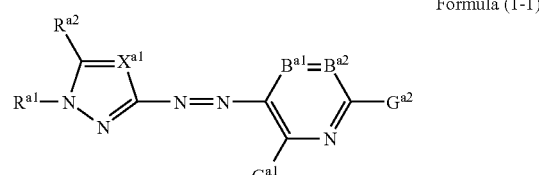

Formula (1-1)

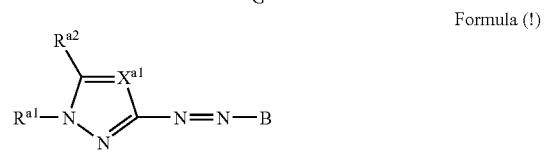

Formula (1)

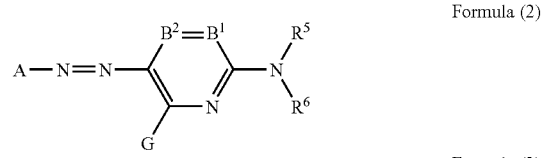

Formula (2)

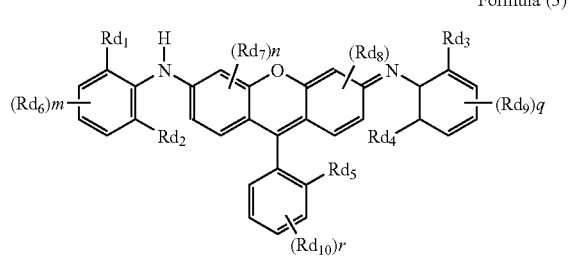

Formula (3)

wherein $R^{a1}$ is an aliphatic group, an aryl group, a heterocyclic group, an acyl group or the like; $X^{a1}$ is —$CR^{a3}$= or N; $R^{a2}$ and $R^{a3}$ are each H or a substituent; B is a coupler residue; A is a residue of a 5-membered heterocyclic diazo component A-$NH_2$; $B^1$ and $B^2$ is —$CR^1$=, —$CR^2$= or N; $R^5$ and $R^6$ is H, an aliphatic group, an aromatic group, a heterocyclic group or the like; G, $R^1$ and $R^2$ is H, halogen, an aliphatic group, an aromatic group, a heterocyclic group, a cyano group, a carboxyl group, a carbamoyl group, an alkoxycarbonyl group or the like; $Rd_1$ to $Rd_4$ is H or an aliphatic group; $Rd_5$ is a sulfo group or a sulfamoyl group; $Rd_6$ to $Rd_{10}$ is a substituent; m, n, p and q=0 to 3; r=0 to 4.

13 Claims, No Drawings

US 7,601,819 B2

AZO DYE, COLORED CURABLE COMPOSITION, COLOR FILTER AND PRODUCING METHOD THEREFOR

CROSS-REFERENCE TO RELATED APPLICATION

This application claims priority under 35 USC 119 from Japanese Patent Application Nos. 2004-021391, 2004-021392 and 2004-085658 the disclosures of which are incorporated by reference herein.

BACKGROUND OF THE INVENTION

1. Field of the Invention

The present invention relates to an azo dye having a novel nitrogen-containing heterocyclic structure, a colored curable composition adapted for forming a color filter for use in a liquid crystal display or a solid state image pickup element, a color filter utilizing such colored curable composition and a producing method therefor, and more particularly to an azo dye having a novel nitrogen-containing heterocyclic structure, a colored curable composition including a nitrogen-containing heterocyclic azo dye, and a color filter and a producing method therefor.

2. Description of the Related Art

Azo dyes, showing optical absorption in various visible regions, have been utilized in various fields as dyes. Azo dyes have recently been utilized in various fields, such as a colorant for synthetic resin, a printing ink, a dye for a sublimation-type heat transfer material, an ink jet ink, a dye for a color filter and the like. One of the major performances required for an azo dye is an absorption spectrum. A color of a dye gives a significant influence on the hue, touch or the like of an article colored with such dye, and provides an important visual effect. For this reason, the absorption spectra of dyes have been investigated for many years. Absorption spectra of azo dyes are reported in various summaries and books, and are detailedly described in the chapters for azo dyes or azo pigments, for example in J. Fabian and H. Hartmann "Light Absorption of Organic Colorants" (Springer-Verlag, Berline, 1980), Heinrich Zollinger "Color Chemistry" (Weinheim, New York, Basel, Cambridge) and Hiroshi Noguchi "Gosei Senryo" (Sankyo Shuppan, 1970).

As a result of recent increases in color images in image recording materials, applications of dyes are becoming more diversified. More specifically, azo dyes are frequently employed for example in a recording material for ink jet recording, a recording material of thermal transfer type, an electrophotographic recording material, a transfer-type silver halide photosensitive material, and a printing ink. The azo dye is also utilized for hair dyeing.

On the other hand, color filters are utilized for recording or reproducing a color image, for example in an image pickup element such as a CCD for use in an image pickup equipment, and in displays such as an LCD or a PDP, and azo dyes are utilized also in such color filters.

In such color image recording material or color filters, there are employed colorants (dyes or pigments) of three primary colors in an additive or subtractive color mixing method, in order to reproduce or record a full-color image. At present, however, there are no colorants having absorption characteristics capable of realizing a preferred color reproduction range, also capable of withstanding various conditions of use and environmental conditions and having satisfactory color hues and satisfactory resistances, and improvements are therefore being strongly desired.

On the other hand, in the color filters, it is already known to use a yellow dye in a green or red filter array as described in Japanese Patent Application Laid-Open (JP-A) Nos. 55-161856 and 6-145543. However, a pyridone azo dye which has been employed as such yellow dye is insufficient in fading stability such as heat resistance and light resistance, and a further improvement is therefore desired. Similarly in a color filter constituted of a yellow filter layer, a magenta filter layer and a cyan filter layer, a further improvement in the fading stability is desired in a yellow dye employed in the yellow filter layer.

Furthermore, the colorants to be employed in these applications are required, commonly, to have absorption characteristics preferable for the color reproduction, a sufficient fading stability under the environmental condition of use and a large molar absorption coefficient.

However, prior azo dyes having a nitrogen-containing 5-membered ring as an azo component, disclosed for example in JP-A Nos. 7-224230, 9-234964, 9-277703 and 2003-246942 are not satisfactory in the color hue, the fading stability and the molar absorption coefficient. Also a method for synthesizing a 5-membered heterocyclic azo dye is disclosed in Journal of Heterocyclic Chemistry, Vol. 22, pp. 813-816 (1985) but does not provide an azo dye satisfactory in the color hue and the spectral absorption coefficient.

On the other hand, as a color filter to be formed on a device for realizing a color structure in a solid state image pickup element or a liquid crystal display element, there is known a color filter in which different layers of the color filter are formed in a mutually adjacent manner in a same plane on a substrate. As examples of such color filter, there are known a color filter constituted of a yellow filter layer, a magenta filter layer and a cyan filter layer, and a color filter constituted of a red filter layer, a green filter layer and a blue filter layer, in which such filter layers are formed in a striped pattern or in a mosaic pattern.

For producing such color filter, there have been proposed various producing methods. Among these, so-called color resist method is widely practiced, in which a patterning step of exposing and developing a dye-containing photosensitive resinous composition is repeated by a necessary number of times.

Such color resist method prepares a color filter in a photolithographic process utilizing colored radiation-sensitive compositions in which pigments are dispersed in various photosensitive compositions, and is considered suitable for preparing a color filter for a color display of a large size or a high definition, since it can provide high resistances to light and heat because of the use of pigments and it can provide a sufficient positional precision by a photolithographic patterning.

In case of preparing a color filter by the pigment dispersion method utilizing a pigment dispersion, a radiation-sensitive composition is coated on a glass substrate by a spin coater or a roll coater to obtain a coated film, which is pattern exposed and developed to obtain colored pixels, and the color filter is obtained by repeating such operation for a desired number of colors. Within such pigment dispersion method, a negative-type photosensitive composition utilizing a photopolymerizable monomer and a photopolymerization initiator in combination with an alkali-soluble resin is disclosed for example in JP-A Nos. 1-102469, 1-152499, 2-181704, 2-199403, 4-76062, 5-273411, 6-184482, 7-140654 and 2002-14223.

However, a higher definition is recently desired for the color filter for use in the solid state image pickup element. The prior pigment dispersion system as described above is incapable of improving the resolution, also is associated with a drawback of causing an unevenness in color due to the presence of coarse pigment particles, and is therefore unsuitable for an application requiring a fine pattern such as a solid state image pickup element.

In consideration of such situation, it is already proposed to use a dye for example in JP-A Nos. 6-75375 and 2002-14221. Also a positive-type photosensitive composition is proposed for example in JP-B No. 7-111485 and JP-A No. 2002-14223. However, a dye containing curable composition has been associated with following drawbacks and further improvements have been desired:

(1) A dye is generally inferior in heat resistance and light resistance to a pigment, and is thus unsatisfactory in the fading resistance;

(2) In case a dye has a low molar absorption coefficient, it is required to add the dye in a large amount, whereby other components in the curable composition, such as a polymerizable compound, a binder and a photopolymerization initiator, have to be decreased in relative manner, thereby eventually resulting in deteriorations in a curing property of the composition at the curing, a heat resistance of a cured portion of the composition or a developability of an uncured portion; and (3) A dye often shows an interaction with other components in the curable composition, whereby it is difficult to regulate the developability (solubility) of a cured portion and an uncured portion.

Thus, the dyes that have been employed in the photosensitive composition are not satisfactory in the fading stability, and, having a low solubility in the photosensitive composition, may show a precipitation in a liquid state or in a coated film and cannot be easily contained at a high concentration.

On the other hand, in the color filters, it is already known to use a yellow dye and a magenta dye in a red filter array as described in JP-A No. 2002-14220. However, a pyrazolone azo dye and a xanthene dye which have been employed for this purpose are insufficient in heat resistance and light resistance. Similarly in a color filter constituted of a yellow filter layer, a magenta filter layer and a cyan filter layer, a further improvement in the fading stability is desired similarly.

SUMMARY OF THE INVENTION

As explained in the foregoing, a dye containing colored curable composition is useful in applications requiring a high definition and a uniformity of color such as a solid state image pickup element, but is still incapable of stably maintaining a color concentration and a color hue of the dye for example by a fading, and improvements of fading stability such as heat resistance and light resistance in the dyes, particularly in yellow dyes and magenta dyes, have been targets. Also an improvement in a dye precipitation has been another target, associated with a low stability in time of a liquid preparation or a coated film resulting from a low solubility of the dyes.

The present invention has been made in consideration of the foregoing, and is to provide:

an azo dye of a novel structure having a satisfactory color hue, a satisfactory fading stability and a high spectral absorption coefficient;

a colored curable composition which has a high sensitivity, a high resolution, a high transmittance, a satisfactory color hue, high heat and light resistances and a high stability in time; and a color filter having a high resolution, a high transmittance, a satisfactory color hue, high heat and light resistances, and a method for producing such color filter with a high productivity.

The present inventors, as a result of intensive investigations, find that a specified nitrogen-containing heterocyclic azo dye has a satisfactory color hue and exhibits satisfactory resistances to heat and light. Also as a result of detailed investigations on various dye compound derivatives having a satisfactory color hue and showing high fading stability to light and heat, the present inventors find that a specified nitrogen-containing heterocyclic azo dye has a satisfactory color hue and is particularly useful in improving the fading stability such as heat resistance and light resistance, and, based on such finding, there are provided a colored curable composition, a color filter and a producing method therefor of the following configurations, thereby attaining the aforementioned objects. Specific means of attaining the aforementioned objectives are as follows.

A first aspect of the present invention is to provide an azo dye represented by the following formula (1-1):

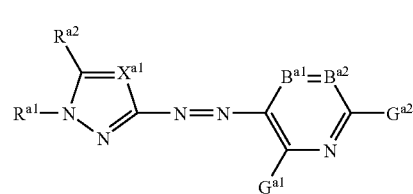

Formula (1-1)

wherein, in the formula (1-1), $R^{a1}$ represents an aliphatic group, an aryl group, a heterocyclic group, an acyl group, an aliphatic oxycarbonyl group, an aryl oxycarbonyl group, a carbamoyl group, an aliphatic sulfonyl group, an aryl sulfonyl group, or a sulfamoyl group; $R^{a2}$ represents a hydrogen atom or a substituent; $X^{a1}$ represents $-CR^{a3}=$ or a nitrogen atom; $B^{a1}$ represents $-CR^{a4}=$ or a nitrogen atom; $B^{a2}$ represents $-CR^{a5}=$ or a nitrogen atom; $B^{a1}$ and $B^{a2}$ are not nitrogen atoms at the same time; $R^{a3}$, $R^{a4}$ and $R^{a5}$ each independently represents a hydrogen atom or a substituent; $G^{a1}$ and $G^{a2}$ each independently represents a hydrogen atom or a substituent; and $R^{a1}$ and $R^{a2}$, $R^{a2}$ and $R^{a3}$, $R^{a4}$ and $R^{a5}$, or $R^{a5}$ and $G^{a2}$ may be mutually bonded to form a 5- to 7-membered ring.

A second aspect of the present invention is to provide a colored curable composition comprising at least one dye represented by the following formula (1):

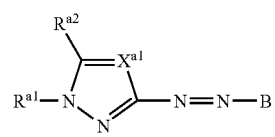

Formula (1)

wherein, in the formula (1), $R^{a1}$ represents an aliphatic group, an aryl group, a heterocyclic group, an acyl group, an aliphatic oxycarbonyl group, an aryl oxycarbonyl group, a carbamoyl group, an aliphatic sulfonyl group, an aryl sulfonyl group, or a sulfamoyl group; $R^{a2}$ represents a hydrogen atom or a substituent; $X^{a1}$ represents $-CR^{a3}=$ or a nitrogen atom; $R^{a3}$ represents a hydrogen atom or a substituent; B represents a coupler residue; and $R^{a1}$ and $R^{a2}$, and $R^{a2}$ and $R^{a3}$ in case where $X^{a1}$ represents $-CR^{a3}=$, may be mutually bonded to form a 5- to 7-membered ring.

A third aspect of the present invention is to provide a color filter comprising at least one dye represented by the following formula (1):

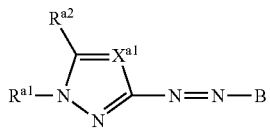

Formula (1)

wherein, in the formula (1), $R^{a1}$ represents an aliphatic group, an aryl group, a heterocyclic group, an acyl group, an aliphatic oxycarbonyl group, an aryl oxycarbonyl group, a carbamoyl group, an aliphatic sulfonyl group, an aryl sulfonyl group, or a sulfamoyl group; $R^{a2}$ represents a hydrogen atom or a substituent; $X^{a1}$ represents $-CR^{a3}=$ or a nitrogen atom; $R^{a3}$ represents a hydrogen atom or a substituent; B represents a coupler residue; and $R^{a1}$ and $R^{a2}$, and $R^{a2}$ and $R^{a3}$ in case where $X^{a1}$ represents $-CR^{a3}=$, may be mutually bonded to form a 5- to 7-membered ring.

A fourth aspect of the present invention is to provide a method of producing a color filter, comprising coating a colored curable composition of the invention on a substrate, carrying out an exposure through a mask and carrying out a development to form a patterned image.

In the aforementioned producing method for color filter, a color filter having desired color hues is produced by repeating the aforementioned process by a number of desired color hues. Also there is preferred an embodiment including, if necessary, a process of curing the patterned image by heating and/or exposure.

DETAILED DESCRIPTION OF THE INVENTION

In the following, a detailed description will be given on the azo dye, the colored curable composition, the color filter and the producing method therefor.

[Azo Dye of the Invention]

In the following, an azo dye of the invention, represented by the formula (1-1) will be explained in detail. The azo dye of the invention is same as a dye of a formula (1-1), explained later as a preferred embodiment of a dye represented by a formula (1).

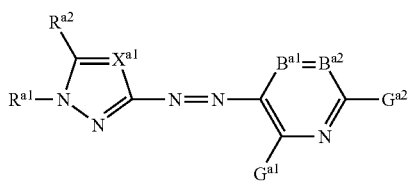

Formula (1-1)

wherein, in the formula (1-1), $R^{a1}$ represents an aliphatic group, an aryl group, a heterocyclic group, an acyl group, an aliphatic oxycarbonyl group, an aryl oxycarbonyl group, a carbamoyl group, an aliphatic sulfonyl group, an aryl sulfonyl group, or a sulfamoyl group; $R^{a2}$ represents a hydrogen atom or a substituent; $X^{a1}$ represents $-CR^{a3}=$ or a nitrogen atom; $B^{a1}$ represents $-CR^{a4}=$ or a nitrogen atom; $B^{a2}$ represents $-CR^{a5}=$ or a nitrogen atom; $B^{a1}$ and $B^{a2}$ are not nitrogen atoms at the same time; $R^{a3}$, $R^{a4}$ and $R^5$ each independently represents a hydrogen atom or a substituent; $G^{a1}$ and $G^{a2}$ each independently represents a hydrogen atom or a substituent; and $R^{a1}$ and $R^{a2}$, $R^{a2}$ and $R^{a3}$, $R^{a4}$ and $R^{a5}$, or $R^{a5}$ and $G^{a2}$ may be mutually bonded to form a 5- to 7-membered ring.

In the formula (1-1), $R^{a1}$ represents an aliphatic group, an aryl group, a heterocyclic group, an acyl group, an aliphatic oxycarbonyl group, an aryl oxycarbonyl group, a carbamoyl group, an aliphatic sulfonyl group, an aryl sulfonyl group, or a sulfamoyl group.

In the aliphatic group represented by $R^{a1}$, an aliphatic portion thereof may be linear, branched or cyclic, and may be saturated or unsaturated. Such aliphatic group can be, for example, an alkyl group, an alkenyl group, a cycloalkyl group or a cycloalkenyl group, which may be non-substituted or substituted. The aliphatic group preferably has 1 to 15 carbon atoms in total, and can preferably be, for example, methyl, ethyl, vinyl, allyl, ethinyl, isopropenyl or 2-ethylhexyl.

The aryl group may have a single ring or condensed rings, and may be non-substituted or substituted. The aryl group which may have a substituent preferably has 6 to 16 carbon atoms in total, and can preferably be, for example, phenyl, 4-nitrophenyl, 2-nitrophenyl, 2-chlorophenyl, 2,4-dichlorophenyl, 2,4-dimethylphenyl, 2-methylphenyl, 4-methoxyphenyl, 2-methoxyphenyl, or 2-methoxycarbonyl-4-nitrophenyl.

The heterocyclic group includes a hetero atom (such as a nitrogen atom, a sulfur atom or an oxygen atom) in a ring structure, which may be a saturated ring or an unsaturated ring. The hetero ring may be a single ring or condensed rings, and may be non-substituted or substituted. The heterocyclic group which may be saturated or unsaturated preferably has 3 to 15 carbon atoms in total, and can preferably be, for example, 3-pyridyl, 2-pyridyl, 2-pyrimidinyl or 2-pyrazinyl.

The acyl group may be aromatic or aliphatic, and preferably has 2 to 15 carbon atoms in total. The acyl group can be, for example, acetyl, pivaloyl or benzoyl.

The aliphatic oxycarbonyl group may have a substituent, and may be saturated or unsaturated. The aliphatic oxycarbonyl group preferably has 1 to 16 carbon atoms in total, and can preferably be, for example, methoxycarbonyl or butoxycarbonyl.

The aryl oxycarbonyl group may have a substituent, and preferably has 7 to 17 carbon atoms in total. The aryl oxycarbonyl group can preferably be, for example, phenoxyocarbonyl.

The carbamoyl group may have a substituent, and preferably has 1 to 12 carbon atoms in total. The carbamoyl group can preferably be, for example, carbamoyl, or dimethylcarbamoyl.

The aliphatic sulfonyl group may have a substituent, and may be saturated or unsaturated. The aliphatic sulfonyl group preferably has 1 to 15 carbon atoms in total, and can preferably be, for example, methanesulfonyl, butanesulfonyl or methoxyethanesulfonyl.

The aryl sulfonyl group may have a substituent and preferably has 6 to 16 carbon atoms in total, and can preferably be, for example, phenylsulfonyl, 4-t-butylphenyl, 4-toluenesulfonyl or 2-toluenesulfonyl.

The sulfamoyl group may have a substituent, and preferably has 0 to 12 carbon atoms in total. The sulfamoyl group can preferably be, for example, sulfamoyl or dimethylsulfamoyl.

For the effects of the invention, $R^{a1}$ is preferably an aliphatic group, an aryl group or a heterocyclic group, more preferably an aryl group or a heterocyclic group, and most preferably an aryl group. Also examples of the substituent that may be present on each group represented by $R^{a1}$ can be similar to those of the substituent on $R^{a2}$ to be explained later.

In the formula (1-1), $R^{a2}$ represents a hydrogen atom or a substituent. The substituent represented by $R^{a2}$ can be any substitutable group, such as an aliphatic group, an aryl group, a heterocyclic group, an acyl group, an acyloxy group, an acylamino group, an aliphatic oxy group, an aryloxy group, a heterocyclic oxy group, an aliphatic oxycarbonyl group, an aryl oxycarbonyl group, a heterocyclic oxycarbonyl group, a carbamoyl group, an aliphatic sulfonyl group, an aryl sulfonyl group, a heterocyclic sulfonyl group, an aliphatic sulfonyloxy group, an aryl sulfonyloxy group, a heterocyclic sulfonyloxy group, a sulfamoyl group, an aliphatic sulfonamide group, an aryl sulfonamide group, a heterocyclic sulfonamide group, an amino group, an aliphatic amino group, an aryl amino group, a heterocyclic amino group, an aliphatic oxycarbonylamino group, an aryl oxycarbonylamino group, a heterocyclic oxycarbonylamino group, an aliphatic sulfinyl group, an aryl sulfinyl group, an aliphatic thio group, an aryl thio group, a hydroxyl group, a cyano group, a sulfo group, a carboxyl group, an aliphatic oxyamino group, an aryl oxyamino group, a carbamoylamino group, a sulfamoylamino group, a halogen atom, a sulfamoylcarbamoyl group, a carbamoylsulfamoyl group, a dialiphatic oxyphosphinyl group, or a diaryloxyphosphinyl group.

For the effects of the invention, $R^{a2}$ is preferably a hydrogen atom, an aliphatic group, an aryl group, an acyloxy group, an acylamino group, an aliphatic oxy group, an aliphatic sulfonyloxy group, an aryl sulfonyloxy group, an aliphatic sulfonamide group, an aryl sulfonamide group, an amino group, an aliphatic amino group, an aryl amino group, an aliphatic oxycarbonylamino group, an aryl oxycarbonylamino group, a heterocyclic oxycarbonylamino group, a hydroxyl group, a cyano group, a sulfo group, a carbamoylamino group, or a sulfamoylamino group, further preferably a hydrogen atom, an aliphatic group, an aryl group, an acyloxy group, an aliphatic oxy group or an aliphatic sulfonyloxy group, and most preferably a hydrogen atom or an aliphatic group.

In the formula (1-1), $X^{a1}$ represents —$CR^{a3}$= or a nitrogen atom; and $R^{a3}$ represents a hydrogen atom or a substituent. The substituent represented by $R^{a3}$ may be any substitutable group, of which examples can be similar to those for the substituent on $R^{a2}$ mentioned above.

For the effects of the invention, $X^{a1}$ is preferably —$CR^{a3}$= where $R^{a3}$ is an aliphatic group, an aryl group, an acyl group, an acylamino group, an aliphatic oxycarbonyl group, an aryl oxycarbonyl group, a carbamoyl group, an aliphatic sulfonyl group, an aryl sulfonyl group, a heterocyclic sulfonyl group, an aliphatic sulfonyloxy group, an aryl sulfonyloxy group, an aliphatic sulfonamide group, an aryl sulfonamide group, a cyano group, or a carboxyl group, or a nitrogen atom, further preferably —$CR^{a3}$= where $R^{a3}$ is an acyl group, an aliphatic oxycarbonyl group, an aliphatic sulfonyl group, an aryl sulfonyl group, a cyano group, or a carboxyl group, or a nitrogen atom, and most preferably —$CR^{a3}$= where $R^{a3}$ is an aliphatic oxycarbonyl group, an aliphatic sulfonyl group, or a cyano group, or a nitrogen atom.

In the formula (1-1), $B^{a1}$ represents —$CR^{a4}$= or a nitrogen atom, and $B^{a2}$ represents —$CR^{a5}$= or a nitrogen atom; $B^{a1}$ and $B^{a2}$ do not represent nitrogen atoms at the same time. Also $R^{a4}$ and $R^{a5}$ each independently represents a hydrogen atom or a substituent.

The substituents represented by $R^{a4}$ and $R^{a5}$ can be any substitutable groups, of which examples can be similar to those of the substituent on $R^{a2}$ explained above.

For the effects of the invention, $R^{a4}$ and $R^{a5}$ each independently is preferably a hydrogen atom, an aliphatic group, an aryl group, a heterocyclic group, an acyl group, an acylamino group, an aliphatic oxy group, an aliphatic oxycarbonyl group, a carbamoyl group, a sulfamoyl group, an aliphatic sulfonamide group, an aryl sulfonamide group, an amino group, an aliphatic amino group, a hydroxyl group, a cyano group, a sulfo group, or a carboxyl group, and more preferably a hydrogen atom, an aliphatic group or a cyano group.

$B^{a1}$ and $B^{a2}$ are preferably such that $B^{a1}$ is —$CR^{a4}$= and $B^{a2}$ is —$CR^{a5}$= or a nitrogen atom, more preferably such that $B^{a1}$ is —$CR^{a4}$= and $B^{a2}$ is $CR^{a5}$=, and in case where $B^{a1}$ is —$CR^{a4}$= and $B^{a2}$ is —$CR^{a5}$=, most preferably $R^{a4}$ is an aliphatic group and $R^{a5}$ is a hydrogen atom or a cyano group.

In the formula (1-1), $G^{a1}$ and $G^{a2}$ each independently represents a hydrogen atom or a substituent. The substituent represented by $G^{a1}$ or $G^{a2}$ can be any substitutable group, and examples thereof can be similar to those represented by $R^{a2}$.

For the effect of the invention, $G^{a1}$ and $G^{a2}$ each independently is preferably a hydrogen atom, an aliphatic group, an aryl group, a heterocyclic group, an acyloxy group, an acylamino group, an aliphatic oxy group, an aryloxy group, a heterocyclic oxy group, an aliphatic sulfonamide group, an aryl sulfonamide group, a heterocyclic sulfonamide group, an amino group, an aliphatic amino group, an aryl amino group, a heterocyclic amino group, an aliphatic oxycarbonylamino group, an aryl oxycarbonylamino group, a heterocyclic oxycarbonylamino group, an aliphatic thio group, an aryl thio group, a hydroxyl group, a cyano group, a sulfo group, a carboxyl group, a carbamoylamino group, a sulfamoylamino group, or a halogen atom, more preferably a hydrogen atom, an aliphatic group, a heterocyclic group, an acylamino group, an aliphatic oxy group, an aryloxy group, an aliphatic sulfonamide group, an aryl sulfonamide group, an aliphatic amino group, an aryl amino group, a heterocyclic amino group, an aliphatic thio group, an aryl thio group, or a halogen atom, and particularly preferably an aliphatic oxy group, an aliphatic amino group, an aryl amino group or an aliphatic thio group. Most preferably, at least either of $G^{a1}$ and $G^{a2}$ is an aliphatic amino group or an aromatic amino group.

$R^{a1}$ and $R^{a2}$, $R^{a2}$ and $R^{a3}$, $R^{a4}$ and $R^{a5}$, or $R^{a5}$ and $G^{a2}$ may be mutually bonded to form a 5- to 7-membered ring. Such 5- to 7-membered ring may be an aromatic ring or a non-aromatic ring. Also the 5- to 7-membered ring may be a carbon ring or a heterocycle. The 5- to 7-membered ring can for example be a benzene ring or a pyridine ring.

The azo dye of the invention is particularly preferably an azo compound represented by the following formula (1-A):

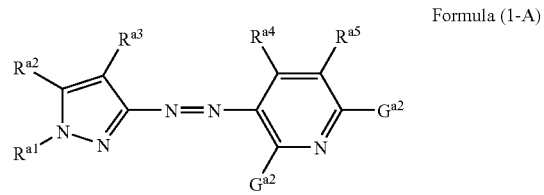

Formula (1-A)

wherein, in the formula (1-A), $Ra^1, Ra^2, Ra^3, Ra^4, Ra^5, Ga^1$ and $Ga^2$ have same meaning as $Ra^1, Ra^2, Ra^3, Ra^4, Ra^5, Ga^1$ and $Ga^2$ as in the formula (1-1).

In the formula (1-A), for the effects of the invention, $R^{a1}$ is preferably an aliphatic group, an aryl group or a heterocyclic group; $R^{a2}$ is preferably a hydrogen atom, an aliphatic group, an aryl group, an acyloxy group, an aliphatic oxy group, an aliphatic sulfonyloxy group, an aryl sulfonyloxy group, a hydroxyl group, or a cyano group; and $R^{a3}$ is preferably an acyl group, an aliphatic oxycarbonyl group, an aliphatic sulfonyl group, an aryl sulfonyl group, a cyano group or a carboxyl group.

Also in the formula (1-A), $R^{a4}$ and $R^{a5}$ each independently is preferably a hydrogen atom, an aliphatic group or a cyano group; and $G^{a1}$ and $G^{a2}$ each independently is preferably a hydrogen atom, an aliphatic group, a heterocyclic group, an acylamino group, an aliphatic oxy group, an aryloxy group, an aliphatic sulfonamide group, an aryl sulfonamide group, an aliphatic amino group, an aryl amino group, a heterocyclic amino group, an aliphatic thio group, an aryl thio group or a halogen atom.

Furthermore, the azo dye represented by the formula (1-A) is most preferably such that $R^{a1}$ is an aryl group; $R^{a2}$ is a hydrogen atom or an aliphatic group; $R^{a3}$ is an aliphatic oxycarbonyl group, an aliphatic sulfonyl group or a cyano group; $R^{a4}$ is an aliphatic group; $R^{a5}$ is a hydrogen atom or a cyano group; $G^{a1}$ and $G^{a2}$ each is an aliphatic oxy group, an aliphatic amino group, an arylamino group or an aliphatic thio group; and at least either of $G^{a1}$ and $G^{a2}$ is an aliphatic amino group or an aryl amino group.

Specific examples of the azo dye of the invention represented by the aforementioned formulae (1-1) and (1-A) include example compounds (1) to (52), (101) and (102) of the formula (1) to be explained later.

[Colored Curable Composition]

A colored curable composition of the invention preferably includes, as a dye, at least one of compounds represented by the following formula (1), and further includes at least one selected from compounds represented by the following formula (2) and compounds represented by the following formula (3). In the following, compounds represented by the formulae (1) to (3) are collectively called "dye of the invention". The colored curable composition of the invention is formed by preferably including a binder, a radiation sensitive compound or a polymerizable monomer. It can be generally formed by utilizing a solvent, and may include other components such as a crosslinking agent if necessary.

-Dye Represented by Formula (1)-

The colored curable composition of the invention includes at least a dye (azo dye; dye of the invention) represented by the following formula (1). Such dye shows a satisfactory color hue, has an excellent stability without precipitation in time in a liquid preparation or in a state of a coated film, and particularly has resistances to heat and light.

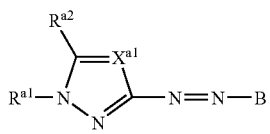

Formula (1)

In the formula (1), an "aliphatic group" may have an aliphatic portion thereof of linear, branched or cyclic, and saturated or unsaturated, including, for example, alkyl, alkenyl, cycloalkyl and cycloalkenyl group, which may be non-substituted or substituted. Also in the formula (1), "aryl" may have a single ring or condensed rings, including for example an aromatic group, and may be non-substituted or substituted with a substituent. In the formula (1), "heterocycle" includes a hetero atom (such as a nitrogen atom, a sulfur atom or an oxygen atom) in a ring structure of a heterocycle portion, which may be a saturated ring or an unsaturated ring, a single ring or condensed rings, and non-substituted or substituted with a substituent.

Also a "substituent" in the formula (1) may be any substitutable group, such as an aliphatic group, an aryl group, a heterocyclic group, an acyl group, an acyloxy group, an acylamino group, an aliphatic oxy group, an aryloxy group, a heterocyclic oxy group, an aliphatic oxycarbonyl group, an aryl oxycarbonyl group, a heterocyclic oxycarbonyl group, a carbamoyl group, an aliphatic sulfonyl group, an aryl sulfonyl group, a heterocyclic sulfonyl group, an aliphatic sulfonyloxy group, an aryl sulfonyloxy group, a heterocyclic sulfonyloxy group, a sulfamoyl group, an aliphatic sulfonamide group, an aryl sulfonamide group, a heterocyclic sulfonamide group, an amino group, an aliphatic amino group, an aryl amino group, a heterocyclic amino group, an aliphatic oxycarbonylamino group, an aryl oxycarbonylamino group, a heterocyclic oxycarbonylamino group, an aliphatic sulfinyl group, an aryl sulfinyl group, an aliphatic thio group, an aryl thio group, a hydroxyl group, a cyano group, a sulfo group, a carboxyl group, an aliphatic oxyamino group, an aryl oxyamino group, a carbamoylamino group, a sulfamoylamino group, a halogen atom, a sulfamoylcarbamoyl group, a carbamoylsulfamoyl group, a dialiphatic oxyphosphinyl group, or a diaryloxyphosphinyl group.

In the following, each group in the formula (1) will be explained in more details.

In the formula (1), $R^{a1}$ represents an aliphatic group, an aryl group, a heterocyclic group, an acyl group, an aliphatic oxycarbonyl group, an aryl oxycarbonyl group, a carbamoyl group, an aliphatic sulfonyl group, an aryl sulfonyl group, or a sulfamoyl group.

An aliphatic group represented by $R^{a1}$ may be non-substituted or substituted, may be saturated or unsaturated, and is preferably an aliphatic group with 1 to 15 carbon atoms in total. It can be, for example, a methyl group, an ethyl group, a vinyl group, an allyl group, an ethinyl group, an isopropenyl group or a 2-ethylhexyl group.

An aryl group represented by $R^{a1}$ may be non-substituted or substituted, and preferably has 6 to 16 carbon atoms in total. It can be, for example, a phenyl group, a 4-nitrophenyl group, a 2-nitrophenyl group, a 2-chlorophenyl group, a 2,4-dichlorophenyl group, a 2,4-dimethylphenyl group, a 2-ethylphenyl group, a 4-methoxyphenyl group, a 2-methoxyphenyl group, or a 2-methoxycarbonyl-4-nitrophenyl group.

A heterocyclic group represented by $R^{a1}$ may be a saturated ring group or an unsaturated ring group, and preferably has 3 to 15 carbon atoms in total. It can be, for example, a 3-pyridyl group, a 2-pyridyl group, a 2-pyrimidinyl group or a 2-pyrazinyl group.

An acyl group represented by $R^{a1}$ may be aromatic or aliphatic, and preferably has 2 to 15 carbon atoms in total. It can be, for example, an acetyl group, a pivaloyl group or a benzoyl group.

An aliphatic oxycarbonyl group represented by $R^{a1}$ may be non-substituted or substituted, and may be saturated or unsaturated, and preferably has 1 to 16 carbon atoms in total. It can be, for example, a methyoxycarbonyl group or a butoxycarbonyl group.

An aryloxycarbonyl group represented by $R^{a1}$ may be non-substituted or substituted, and preferably has 7 to 17 carbon atoms in total. It can be, for example, a phenoxycarbonyl group.

A carbamoyl group represented by $R^{a1}$ may be non-substituted or substituted, and preferably has 1 to 12 carbon atoms in total. It can be, for example, a carbamoyl group or a dimethylcarbamoyl group.

An aliphatic sulfonyl group represented by $R^{a1}$ may be non-substituted or substituted, and may be saturated or unsaturated, and preferably has 1 to 15 carbon atoms in total in an aliphatic portion. It can be, for example, a methanesulfonyl group, a butanesulfonyl group or a methoxyethanesulfonyl group.

An arylsulfonyl group represented by $R^{a1}$ may be non-substituted or substituted, and preferably has 6 to 16 carbon atoms in total. It can be, for example, a phenylsulfonyl group, a 4-t-butylphenylsulfonyl group, a 4-toluenesulfonyl group or a 2-toluenesulfonyl group.

A sulfamoyl group represented by $R^{a1}$ may be non-substituted or substituted, and preferably has 0 to 12 carbon atoms in total. It can be, for example, a sulfamoyl group or a dimethylsulfamoyl group.

Among the foregoing, for more effectively exhibiting the effects of the invention, $R^{a1}$ is preferably an aliphatic group, an aryl group or a heterocyclic group, more preferably an aryl group or a heterocyclic group, and most preferably an aryl group.

In the formula (1-1), $R^{a2}$ represents a hydrogen atom or a substituent; $X^{a1}$ represents —$CR^{a3}$= or a nitrogen atom; and $R^{a3}$ represents a hydrogen atom or a substituent.

A substituent represented by $R^{a2}$ or $R^{a3}$ may be any substitutable group as cited for "substituent" in the foregoing. Among these, for more effectively exhibiting the effects of the invention, $R^{a2}$ and $R^{a3}$ each is preferably selected as follows.

$R^{a2}$ is preferably a hydrogen atom, an aliphatic group, an aryl group, an acyloxy group, an acylamino group, an aliphatic oxy group, an aliphatic sulfonyloxy group, an aryl sulfonyloxy group, an aliphatic sulfonamide group, an aryl sulfonamide group, an amino group, an aliphatic amino group, an aryl amino group, an aliphatic oxycarbonylamino group, an aryl oxycarbonylamino group, a heterocyclic oxycarbonylamino group, a hydroxyl group, a cyano group, a sulfo group, a carbamoylamino group, or a sulfamoylamino group, further preferably a hydrogen atom, an aliphatic group, an aryl group, an acyloxy group, an aliphatic oxy group or an aliphatic sulfonyloxy group, and most preferably a hydrogen atom or an aliphatic group.

Also $R^{a3}$ is preferably an aliphatic group, an aryl group, an acyl group, an acylamino group, an aliphatic oxycarbonyl group, an aryl oxycarbonyl group, a carbamoyl group, an aliphatic sulfonyl group, an aryl sulfonyl group, a heterocyclic sulfonyl group, an aliphatic sulfonyloxy group, an aryl sulfonyloxy group, an aliphatic sulfonamide group, an aryl sulfonamide group, a cyano group, or a carboxyl group, and $X^{a1}$ is preferably selected from —$CR^{a3}$= in such examples and a nitrogen atom. $R^{a3}$ is more preferably an acyl group, an aliphatic oxycarbonyl group, an aliphatic sulfonyl group, an aryl sulfonyl group, a cyano group, or a carboxyl group, and $X^{a1}$ is more preferably selected from —$CR^{a3}$= in such examples and a nitrogen atom. Most preferably $R^{a3}$ is an aliphatic oxycarbonyl group, an aliphatic sulfonyl group, or a cyano group, and $X^{a1}$ is most preferably selected from —$CR^{a3}$= in such examples and a nitrogen atom.

In the formula (1), B represents a coupler residue.

The coupler residue represented by B can be any group capable of coupling with a diazonium salt, such as a hydrocarbon ring group, a heterocyclic group, or a substituted methylene group. The coupler residue B may be such that the dye represented by the formula (1) becomes a non-dissociable dye or a dissociable dye (including a group which is dissociated in an alkaline environment to show a desired color hue). Specific examples of the residue B include groups represented by following (B-1) to (B-13).

(B-1)

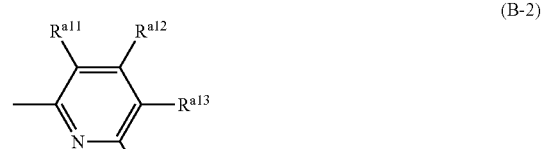
(B-2)

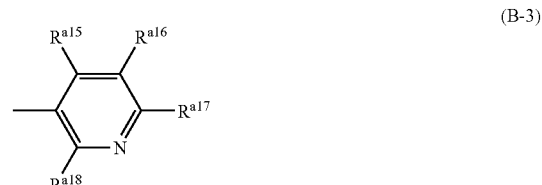
(B-3)

(B-4)

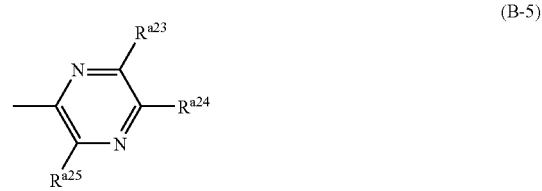
(B-5)

(B-6)

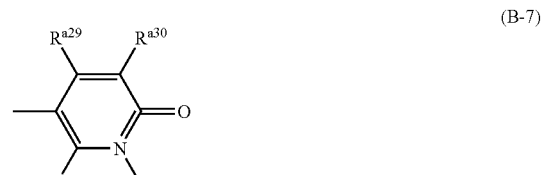
(B-7)

(B-8)

(B-9)

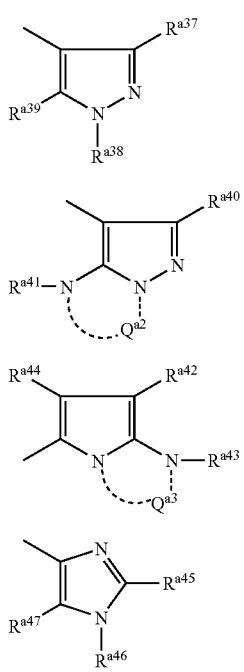

(B-10)

(B-11)

(B-12)

(B-13)

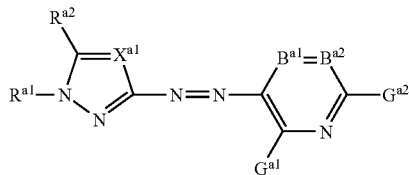

Formula (1-1)

In (B-1) to (B-13), $R^{a6}$ to $R^{a47}$ each represents a hydrogen atom or a substituent. The substituent can be any substitutable group cited in the foregoing as "substituent", and a preferred substituent is an aliphatic group, an aryl group, a heterocyclic group, an acyl group, an acylamino group, an aliphatic oxy group, an aliphatic oxycarbonyl group, a carbamoyl group, a sulfamoyl group, an aliphatic sulfonamide group, an aryl sulfonamide group, an amino group, an aliphatic amino group, a hydroxyl group, a cyano group, a sulfo group, or a carboxyl group.

Two adjacent groups in $R^{a6}$—$R^{a14}$, $R^{a15}$—$R^{a17}$, or $R^{a45}$—$R^{a47}$, also $R^{a19}$ and $R^{a20}$, $R^{a21}$ and $R^{a22}$, $R^{a23}$ and $R^{a24}$, $R^{a29}$ and $R^{a30}$, $R^{a31}$ and $R^{a32}$, $R^{a33}$ and $R^{a34}$, $R^{a35}$ and $R^{36}$ may be mutually bonded, as far as possible, to form a 5- to 7-membered hydrocarbon or hetero ring.

Also $Q^{a1}$ in (B-9), $Q^{a2}$ in (B-11) or $Q^{a3}$ in (B-12) represents a nonmetal atomic group required for forming a 5- to 7-membered ring together with a nitrogen atom.

Among the foregoing, for attaining the effects of the invention more effectively, at least one of $R^{a6}$ and $R^{a8}$; $R^{a11}$ and $R^{a13}$; $R^{a15}$, $R^{a17}$ and $R^{a18}$; $R^{a19}$ and $R^{a22}$; $R^{a24}$ and $R^{a25}$; or $R^{a26}$, $R^{a27}$ and $R^{a28}$ preferably represents a hydroxyl group or a substituted amino group, more preferably a substituted amino group. Similarly, for attaining the effects of the invention more effectively, $R^{a31}$ preferably represents an aliphatic group or an aromatic group, and more preferably an aliphatic group. Also for attaining the effects of the invention more effectively, $R^{a32}$ is preferably a hydroxyl group, and $R^{a39}$ preferably represents a hydroxyl group or an amino group which may be substituted, and more preferably an amino group which may be substituted.

In order that the effects of the invention can be exhibited more effectively, B preferably represents (B-1), (B-3), (B-6) or (B-7) mentioned above.

Also among the dyes represented by the formula (1), a dye represented by the following formula (1-1) is more preferable from the standpoint of attaining the effects of the invention.

In the formula (1-1), $R^{a1}$, $R^{a2}$, $X^{a1}$ and $R^{a3}$ have same meanings as $R^{a1}$, $R^{a2}$, $X^{a1}$ and $R^{a3}$ in the foregoing formula (1) and have same respective preferable ranges.

In the formula (1-1), $B^{a1}$ represents —$CR^{a4}$= or a nitrogen atom, and $B^{a2}$ represents —$CR^{a5}$= or a nitrogen atom; $B^{a1}$ and $B^{a2}$ do not represent nitrogen atoms at the same time. Also $R^{a4}$ and $R^{a5}$ each independently represents a hydrogen atom or a substituent. In the formula (1-1), $R^{a1}$ and $R^{a2}$, $R^{a2}$ and $R^{a3}$, $R^{a4}$ and $R^5$, or $R^{a5}$ and $G^{a2}$ may be mutually bonded to form a 5- to 7-membered ring.

A substituent represented by $R^{a4}$ or $R^{a5}$ may be any substitutable group as described in the foregoing explanation for "substituent". For exhibiting the effects of the invention more effectively, $R^{a4}$ and $R^{a5}$ each is preferably a hydrogen atom, an aliphatic group, an aryl group, a heterocyclic group, an acyl group, an acylamino group, an aliphatic oxy group, an aliphatic oxycarbonyl group, a carbamoyl group, a sulfamoyl group, an aliphatic sulfonamide group, an arylsulfonamide group, an amino group, an aliphatic amino group, a hydroxyl group, a cyano group, a sulfo group, or a carboxyl group, more preferably a hydrogen atom, an aliphatic group or a cyano group.

In the formula (1-1), there is preferred a case where $B^{a1}$ represents —$CR^{a4}$= and $B^{a2}$ represents —$CR^{a5}$= or a nitrogen atom, more preferably a case where $B^{a1}$ a is —$CR^{a4}$= and $B^{a2}$ is —$CR^{a5}$=. In case where $B^{a1}$ represents —$CR^{a4}$= and $B^{a2}$ represents —$CR^{a5}$=, most preferably $R^{a4}$ represents an aliphatic group and $R^{a5}$ represents a hydrogen atom or a cyano group.

In the formula (1-1), $G^{a1}$ and $G^{a2}$ each independently represents a hydrogen atom or a substituent. The substituent represented by $G^{a1}$ or $G^{a2}$ can be any substitutable group, as described in the foregoing explanation for "substituent". For exhibiting the effects of the invention more effectively, $G^{a1}$ and $G^{a2}$ each is preferably a hydrogen atom, an aliphatic group, an aryl group, a heterocyclic group, an acyloxy group, an acylamino group, an aliphatic oxy group, an aryloxy group, a heterocyclic oxy group, an aliphatic sulfonamide group, an aryl sulfonamide group, a heterocyclic sulfonamide group, an amino group, an aliphatic amino group, an aryl amino group, a heterocyclic amino group, an aliphatic oxycarbonylamino group, an aryl oxycarbonylamino group, a heterocyclic oxycarbonylamino group, an aliphatic thio group, an aryl thio group, a hydroxyl group, a cyano group, a sulfo group, a carboxyl group, a carbamoylamino group, a sulfamoylamino group, or a halogen atom, more preferably a hydrogen atom, an aliphatic group, a heterocyclic group, an acylamino group, an aliphatic oxy group, an aryloxy group, an aliphatic sulfonamide group, an aryl sulfonamide group, an aliphatic amino group, an aryl amino group, a heterocyclic amino group, an aliphatic thio group, an aryl thio group, or a halogen atom, and most preferably an aliphatic oxy group, an aliphatic amino group, an aryl amino group or an aliphatic thio group. Further preferably, at least either of $G^{a1}$ and $G^{a2}$ represents an aliphatic amino group or an aromatic amino group.

$R^{a1}$ and $R^{a2}$, $R^{a2}$ and $R^{a3}$, $R^{a4}$ and $R^{a5}$, or $R^{a5}$ and $G^{a2}$ may be mutually bonded to form a 5- to 7-membered ring. Such 5- to 7-membered ring may be an aromatic ring or a non-aromatic ring. Also the 5- to 7-membered ring may be a carbon ring or a heterocycle such as a benzene ring or a pyridine ring.

Also among the dyes represented by the formula (1), a dye represented by the following formula (1-2) is preferred.

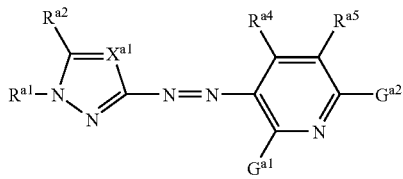

In the formula (1-2), $R^{a1}$, $R^{a2}$, $R^{a3}$, $R^{a4}$, $R^{a5}$, $X^1$, $G^{a1}$, and $G^{a2}$ have the same meaning as those in the formula (1) OR (1-1), and have same preferable embodiments.

In the formula (1-2), for exhibiting the effects of the invention more effectively, there is preferred a case where $R^{a1}$ represents an aliphatic group, an aryl group or a heterocyclic group; $R^{a2}$ represents a hydrogen atom, an aliphatic group, an aryl group, an acyloxy group, an aliphatic oxy group, an aliphatic sulfonyloxy group, an arylsulfonyloxy group, a hydroxyl group, or a cyano group; $R^{a3}$ represents an acyl group, an aliphatic oxycarbonyl group, an aliphatic sulfonyl group, an arylsulfonyl group, a cyano group, or a carboxyl group; $R^{a4}$ and $R^{a5}$ each represents a hydrogen atom, an aliphatic group or a cyano group; and $G^{a1}$ and $G^{a2}$ each represents a hydrogen atom, an aliphatic group, a heterocyclic group, an acylamino group, an aliphatic oxy group, an aryloxy group, an aliphatic sulfonamide group, an arylsulfonamide group, an aliphatic amino group, an arylamino group, a heterocyclic amino group, an aliphatic thio group, an arylthio group, a hydroxyl group, or a halogen atom, and most preferably a case where $R^{a1}$ represents an aryl group; $R^{a2}$ represents a hydrogen atom or an aliphatic group; $R^{a3}$ represents an aliphatic oxycarbonyl group, an aliphatic sulfonyl group, or a cyano group; $R^{a4}$ represents an aliphatic group; $R^{a5}$ represents a hydrogen atom or a cyano group; and $G^{a1}$ and $G^{a2}$ each represents an aliphatic oxy group, an aliphatic amino group, an arylamino group or an aliphatic thio group.

In case the dye represented by the formula (1), (1-1) or (1-2) is water-soluble, it is preferably provided further with an ionic hydrophilic group as a substituent in any position on B, $R^{a1}$, $R^{a2}$, $G^{a1}$ or $G^{a2}$. The ionic hydrophilic group as a substituent includes a sulfo group, a carboxyl group, and a quaternary ammonium group. Such ionic hydrophilic group is preferably a carboxyl group or a sulfo group, particularly preferably a sulfo group. The carboxyl group or the sulfo group may be in a salt state, and a counter ion for forming a salt can be an alkali metal ion (such as sodium ion or potassium ion), or an organic cation (such as tetramethylguanidium ion).

In the following, there are shown specific examples (example compounds 1-102) of the dyes represented by the formula (1), (1-1) or (1-2) (dye of the invention), but the invention is not limited to such examples.

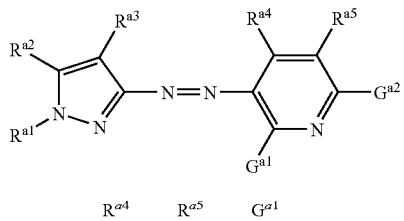

| No. | $R^{a1}$ | $R^{a2}$ | $R^{a3}$ | $R^{a4}$ | $R^{a5}$ | $G^{a1}$ | $G^{a2}$ |
|---|---|---|---|---|---|---|---|
| 1 | —C₆H₄—NO₂ (para) | —H | —CN | —CH₃ | —CN | —NH−CH₂CH₂−O−CH₂CH(C₂H₅)−C₄H₉ | —NH−CH₂CH₂−O−CH₂CH(C₂H₅)−C₄H₉ |
| 2 | —C₆H₄—NO₂ (ortho) | —H | —CN | —CH₃ | —CN | —NH−CH₂CH₂−O−CH₂CH(C₂H₅)−C₄H₉ | —NH−CH₂CH₂−O−CH₂CH(C₂H₅)−C₄H₉ |
| 3 | —C₆H₄—NO₂ (para) | —C₄H₉ | —CN | —CH₃ | —CN | —NH−CH₂−CH(OH)−CH₃ | —NH−CH₂−CH(OH)−CH₃ |
| 4 | —C₆H₄—NO₂ (ortho) | —C₄H₉ | —CN | —CH₃ | —CN | —NH−CH₂−CH(OH)−CH₃ | —NH−CH₂−CH(OH)−CH₃ |
| 5 | —C₆H₄—NO₂ (para) | —C₂H₅ | —CN | —CH₃ | —CN | —NH−CH₂−CH(OH)−CH₃ | —NH−CH₂−CH(OH)−CH₃ |

-continued
| # | | | | | | | |
|---|---|---|---|---|---|---|---|
| 6 | 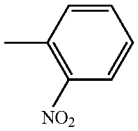 (2-nitrotoluene) | —C₂H₅ | —CN | —CH₃ | —CN | 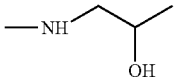 —NH-CH(CH₃)CH₂OH | 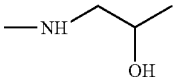 —NH-CH(CH₃)CH₂OH |
| 7 | 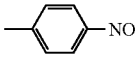 (4-nitrotoluene) | —H | —CN | —CH₃ | —CN | 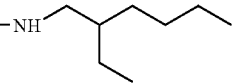 —NH-CH₂CH(C₂H₅)C₄H₉ | —NHCH₃ |
| 8 | 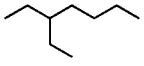 (2-ethylhexyl) | —H | —CN | —CH₃ | —CN | 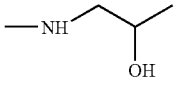 —NH-CH(CH₃)CH₂OH | 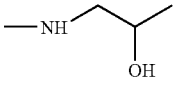 —NH-CH(CH₃)CH₂OH |
| 9 | 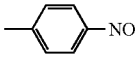 | —C₄H₉ | —CN | —CH₃ | —CN | 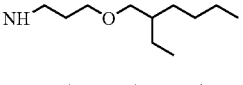 | 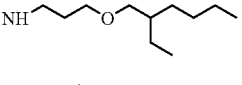 |
| 10 | 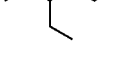 | —H | —CN | —CH₃ | —CN | 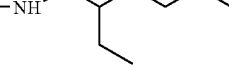 | 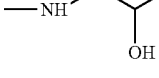 |
| 11 | 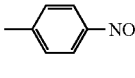 | —H | —CN | —CH₃ | —CN | 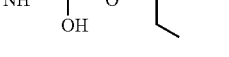 | 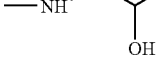 |
| 12 | 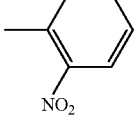 | —H | —CN | —CH₃ | —CN | 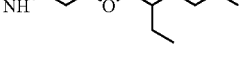 | 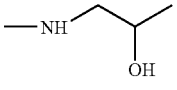 |
| 13 | 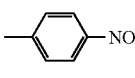 | —H | —CN | —CH₃ | —CN | 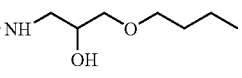 | 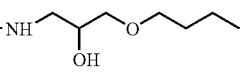 |
| 14 | 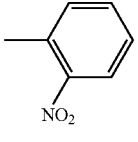 | —H | —CN | —CH₃ | —CN | 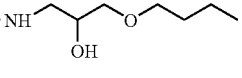 | 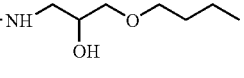 |
| 15 | 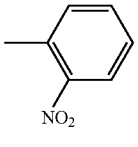 | —H | —CN | —CH₃ | —CN | 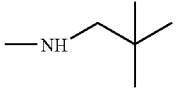 | 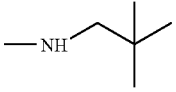 |
| 16 | 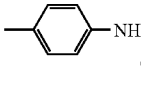 | —H | —CN | —CH₃ | —CN | 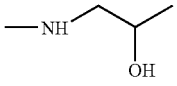 | 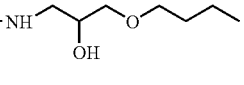 |
| 17 | 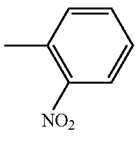 | —H | —CN | —CH₃ | —CN | 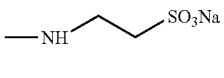 —NH-CH₂CH₂SO₃Na | 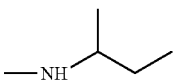 —NH-CH(CH₃)C₂H₅ |
| 18 | 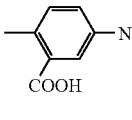 | —H | —CN | —CH₃ | —CN | 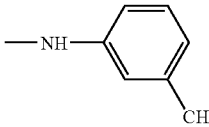 | 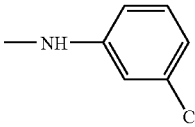 |

-continued

| # | | | | | | |
|---|---|---|---|---|---|---|
| 19 | 3-Cl-phenyl | —CH₃ | —CN | —CH₃ | —CN | —NH-(2,4-diMe-phenyl) | —NH-CH₂-CH(OH)-CH₂OH |
| 20 | 3-(NHSO₂CH₃)-phenyl | —H | —CN | —CH₃ | —CN | —OCH₃ | —NH-CH₂-CH(OH)-CH₂OH |
| 21 | phenyl | —H | —CN | —CH₃ | —CN | —NH-CH(CH₃)CH₂CH₃ | —SCH₃ |
| 22 | 4-NO₂-phenyl | —H | —CN | —CH₃ | —CN | —NH-CH₂-CH(C₂H₅)-C₃H₇ | —OCH₃ |
| 23 | 3-OCH₃-phenyl | —H | —SO₂CH₃ | —CH₃ | —CN | —NH-CH₂-CH(OH)-CH₃ | —NH-CH₂-CH(OH)-CH₃ |
| 24 | 4-OCH₃-phenyl | —H | —CH₂COOH | —CH₃ | —H | —NH-CH₂-CH(OH)-CH₃ | N-(4-OH-piperidinyl) |
| 25 | 4-pyrimidinyl | —H | —CN | —CH₃ | —H | —NH-CH₂-CH(OH)-CH₂-O-CH₂CH(C₂H₅)C₃H₇ | —NH-CH₂-CH(OH)-CH₃ |
| 26 | 4-NO₂-phenyl | —C₄H₉(t) | —CN | —CH₃ | —CN | —N(CH₃)-CH₂CH₂OH | —N(CH₃)-CH₂CH₂OH |
| 27 | 4-SO₃Na-phenyl | —H | —CN | —CH₃ | —CN | —NH-CH₂CH₂OH | —N(CH₃)-phenyl |
| 28 | 4-NO₂-phenyl | phenyl | —CN | —H | —H | —NHC(O)CH₃ | —NH-(1-COCH₃-piperidin-4-yl N-oxide) |
| 29 | phenyl | —OC(O)CH₃ | —CN | —CH₃ | —CN | —NHSO₂CH₃ | —NHC(O)CH₃ |
| 30 | —C₈H₁₇ | —OSO₂CH₃ | —CN | —CH₃ | —CN | —Cl | —O-phenyl |
| 31 | 4-NO₂-phenyl | —H | —CN | —CH₃ | —CN | —NH-CH(CH₃)-CH₂-OC(O)C₂H₅ | —NH-CH(CH₃)C₂H₅ |
| 32 | 2-NO₂-phenyl | —H | —SO₂CH₃ | —CH₃ | —H | —S-CH₂-COOH | —NH-CH₂-CH(OH)-CH₃ |

-continued

| No. | | | | | | |
|---|---|---|---|---|---|---|
| 33 | 4-NO2-C6H4- | —C3H7 | —COC(O)OC2H5 | —CH3 | —CN | —NH-CH2-CH(OH)-CH3 | —NH-CH2-CH(OH)-CH3 |
| 34 | C6H5- | —H | —COC(O)OC2H5 | —CH3 | —H | —NH-CH(CH3)-COOH | —NH-C6H5 |
| 35 | 2,4-Cl2-C6H3- | —OCH3 | —H | —CH3 | —CN | —NH-CH2CH2OH | —NH-CH2CH2OH |
| 36 | 2,4-Cl2-C6H3- | —OCH3 | —H | —CH3 | —CN | —NH-CH2CH2OH | —N(C4H9)-CH2CH2OH |
| 37 | 2,3-(CH3)2-C6H3- | —H | —C(O)CH3 | —CH3 | —CN | —NHSO2-C6H5 | —NH-CH2CH2CH2-COOH |
| 38 | C6H5- | —H | —COOH | —CH3 | —CN | —NH-CH(CH3)-COOH | —S-C6H5 |
| 39 | 4-tBu-2-NO2-C6H3- | —H | —SO2-C6H5 | —H | —CN | —NH-CH2-C(CH3)3 | —NH-CH(CH3)-COOH |

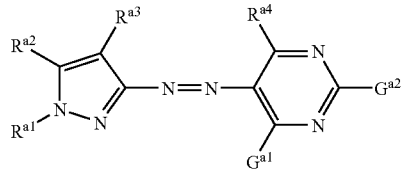

| No. | R$^{a1}$ | R$^{a2}$ | R$^{a3}$ | R$^{a4}$ | G$^{a1}$ | G$^{a2}$ |
|---|---|---|---|---|---|---|
| 40 | 2-NO2-C6H4- | —H | —CN | —NH-CH2-CH(OH)-CH3 | —NH-CH2-CH(OH)-CH3 | —NH-CH2-CH(OH)-CH3 |
| 41 | 4-NO2-C6H4- | —H | —CN | —H | —NH-CH2-CH(OH)-CH3 | —NH-CH2-CH(OH)-CH3 |
| 42 | 2,4-Cl2-C6H3- | —OCH3 | —H | —H | —NH-CH2-CH(OH)-CH3 | —N(CH3)-CH2-CH(OH)-CH3 |

-continued

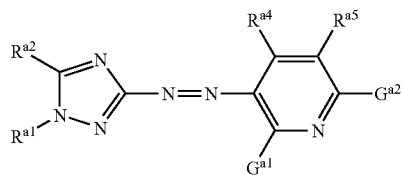

| No. | $R^{a1}$ | $R^{a2}$ | $R^{a4}$ | $R^{a5}$ | $G^{a1}$ | $G^{a2}$ |
|---|---|---|---|---|---|---|
| 43 | 2-nitrophenyl | —H | —CH$_3$ | —CN | —NH-CH$_2$CH$_2$-O-CH$_2$-CH(C$_2$H$_5$)-C$_4$H$_9$ | —NH-CH$_2$CH$_2$-O-CH$_2$-CH(C$_2$H$_5$)-C$_4$H$_9$ |
| 44 | 4-nitrophenyl | —H | —CH$_3$ | —CN | —NH-CH$_2$-CH(C$_2$H$_5$)-C$_4$H$_9$ | —NH-CH$_2$-CH(C$_2$H$_5$)-C$_4$H$_9$ |
| 45 | 4-nitrophenyl | —H | —CH$_3$ | —CN | —NH-CH$_2$CH$_2$-O-CH$_2$-CH(C$_2$H$_5$)-C$_4$H$_9$ | —NH-CH$_2$CH$_2$-O-CH$_2$-CH(C$_2$H$_5$)-C$_4$H$_9$ |
| 46 | 4-nitrophenyl | —CH$_3$ | —CH$_3$ | —H | —NH-CH$_2$-CH(OH)-CH$_2$OH | —NH-CH$_2$-CH(C$_2$H$_5$)-C$_4$H$_9$ |

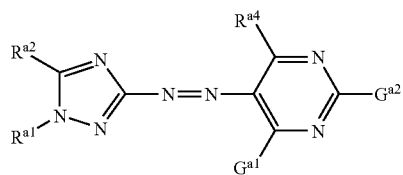

| No. | $R^{a1}$ | $R^{a2}$ | $R^{a4}$ | $G^{a1}$ | $G^{a2}$ |
|---|---|---|---|---|---|
| 47 | 4-nitrophenyl | —H | —H | —NH-CH(CH$_3$)-CH$_2$OH | —NH-CH(CH$_3$)-CH$_2$OH |
| 48 | 2-nitrophenyl | —H | —NH-CH$_2$-CH(OH)-CH$_3$ | —NH-CH$_2$-CH(OH)-CH$_3$ | —NH-CH$_2$-CH(OH)-CH$_3$ |
| 49 | 4-nitrophenyl | —H | —NH-CH$_2$-CH(OH)-CH$_3$ | —NH-CH$_2$-CH(OH)-CH$_3$ | —NH-CH$_2$-C(CH$_3$)$_3$ |

(50)

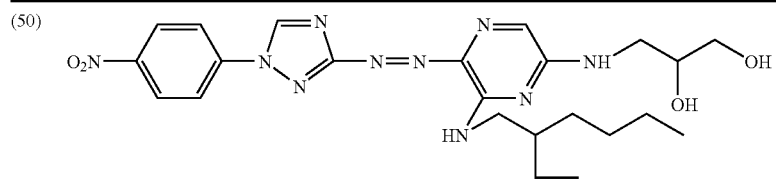

-continued
(51) 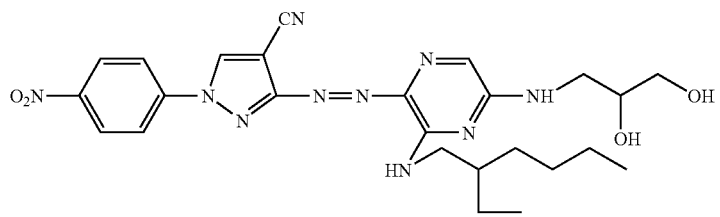
(52) 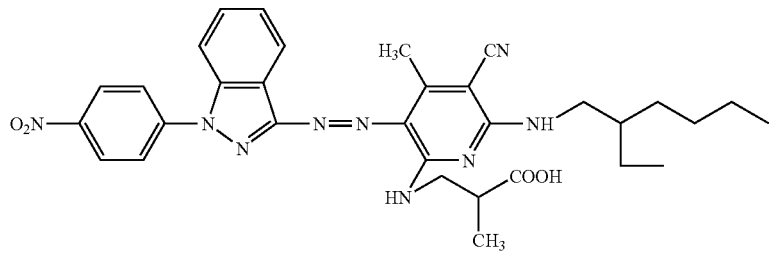
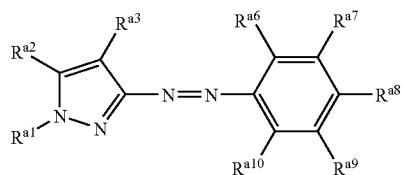
| No. | $R^{a1}$ | $R^{a2}$ | $R^{a3}$ | $R^{a6}$ | $R^{a7}$ | $R^{a8}$ | $R^{a9}$ | $R^{a10}$ |
|---|---|---|---|---|---|---|---|---|
| 53 | 4-nitrophenyl | —H | —CN | —H | —H | —N(C$_2$H$_5$)$_2$ | —H | —NHC(O)CH$_3$ |
| 54 | 2-nitrophenyl | —H | —SO$_2$CH$_3$ | —H | —H | —N(CH$_2$CH$_2$OH)$_2$ | —H | —NHC(O)CH$_3$ |
| 55 | phenyl | —OCH$_3$ | —H | —H | —H | —N(C$_2$H$_5$)$_2$ | —H | —NHC(O)CH$_3$ |
| 56 | 2,4-dichlorophenyl | —OCH$_3$ | —CH$_3$ | —H | —Cl | —N(CH$_3$)CH$_2$COOH | —H | —NHC(O)CH$_2$OH |
| 57 | 2-pyrimidinyl | —CH$_3$ | —CN | —H | —H | —N(CH$_2$CH$_2$OH)$_2$ | —H | —NHC(O)CH$_3$ |
| 58 | 4-nitrophenyl | —C$_4$H$_9$ | —C(O)OC$_2$H$_5$ | —H | —H | —NHCH$_2$COOH | —H | —NHC(O)CH$_3$ |

-continued

| No. | R$^{a1}$ | R$^{a2}$ | R$^{a3}$ | R$^{a4}$ | R$^{a5}$ | R$^{a6}$ | R$^{a7}$ | R$^{a8}$ |
|---|---|---|---|---|---|---|---|---|
| 59 | —C$_8$H$_{17}$ | —H | —CN | —H | —H | —N(C$_2$H$_5$)$_2$ | —H | —NHCOCH$_3$ |
| 60 | 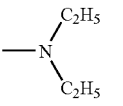 p-NO$_2$-C$_6$H$_4$— | —H | —CN | —H | —H | —OH | —Cl | —H |
| 61 | 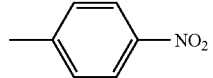 p-NO$_2$-C$_6$H$_4$— | —H | —CN | —H | —Cl | —H | —Cl | —OH |
| 62 | —C$_8$H$_{17}$ | —H | —CN | —H | —H | —OH | —NHCOCH$_3$ | —H |
| 63 | 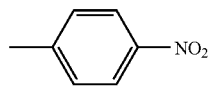 C$_6$H$_5$— | —CH$_3$ | —SO$_2$CH$_3$ | —H | —F | —H | —F | —OH |
| 64 | 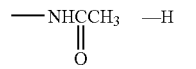 o-NO$_2$-C$_6$H$_4$— | —H | —CN | —H | —H | —OH | —Cl | —H |

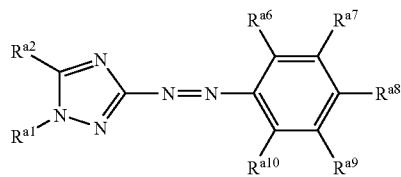

| No. | R$^{a1}$ | R$^{a2}$ | R$^{a6}$ | R$^{a7}$ | R$^{a8}$ | R$^{a9}$ | R$^{a10}$ |
|---|---|---|---|---|---|---|---|
| 65 | 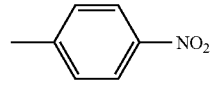 p-NO$_2$-C$_6$H$_4$— | —H | —H | —H | —N(C$_2$H$_5$)$_2$ | —H | —NHCOCH$_3$ |
| 66 | 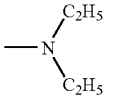 o-NO$_2$-C$_6$H$_4$— | —H | —H | —H | —N(CH$_2$CH$_2$OH)$_2$ | —H | —NHCOC$_2$H$_5$ |
| 67 | 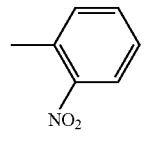 2-pyrimidinyl | —H | —H | —H | —N(C$_2$H$_5$)$_2$ | —H | —NHCOC$_4$H$_9$(t) |
| 68 | 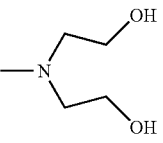 2-COOH-4-NO$_2$-C$_6$H$_3$— | —H | —H | —H | —N(CH$_2$CH$_2$CH$_2$OH)$_2$ | —H | —NHCOC$_4$H$_9$ |
| 69 | 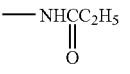 p-NO$_2$-C$_6$H$_4$— | —CH$_3$ | —H | —H | —N(CH$_3$)CH$_2$COOH | —H | —NHSO$_2$CH$_3$ |
| 70 | —C$_8$H$_{17}$ | —CH$_3$ | —H | —H | —N(CH$_3$)CH$_2$COOH | —H | —NHCOC$_2$H$_5$ |

-continued
| No. | (structure) | | | | | | |
|---|---|---|---|---|---|---|---|
| 71 | 3-Cl-C6H4- | —H | —H | —CH3 | —N(C2H5)2 | —H | —CH3 |
| 72 | 4-NO2-C6H4- | —H | —H | —H | —OH | —Cl | —H |
| 73 | 4-NO2-C6H4- | —H | —H | —H | —OH | —NHC(O)C2H5 | —H |
| 74 | —C6H13 | —H | —H | —H | —OH | —F | —H |
| 75 | 4-NO2-C6H4- | —H | —H | —CH3 | —H | —Cl | —OH |
| 76 | C6H5- | —H | —H | —Cl | —H | —NHC(O)C4H9(t) | —OH |
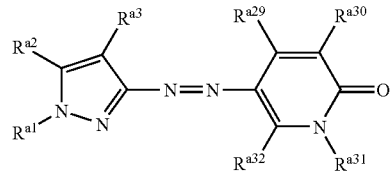
| No. | $R^{a1}$ | $R^{a2}$ | $R^{a3}$ | $R^{a29}$ | $R^{a30}$ | $R^{a31}$ | $R^{a32}$ |
|---|---|---|---|---|---|---|---|
| 77 | 4-NO2-C6H4- | —H | —CN | —CH3 | —CN | —C4H9 | —OH |
| 78 | C6H11- | —H | —CN | —CH3 | —CN | C6H5- | —OH |
| 79 | 2-NO2-C6H4- | —CH3 | —CN | —CH3 | —CN | —C8H17 | —OC(O)CH3 |
| 80 | C6H5- | —H | —CN | —CH3 | —CN | C6H5- | —OH |

-continued
| 81 | 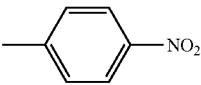 | —H | —SO₂CH₃ | —CH₃ | —CN | —C₄H₉ | —OH |
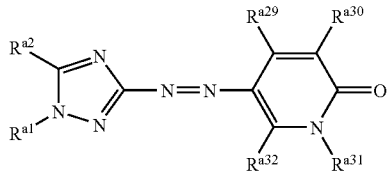
| No. | $R^{a1}$ | $R^{a2}$ | $R^{a29}$ | $R^{a30}$ | $R^{a31}$ | $R^{a32}$ |
|---|---|---|---|---|---|---|
| 82 | 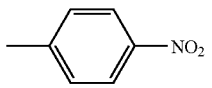 | —H | —CH₃ | —CN | —C₄H₉ | —OH |
| 83 | 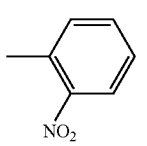 | —H | —CH₃ | —CN | 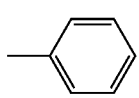 | —OH |
| 84 | 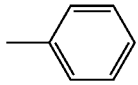 | —H | —CH₃ | —H | —C₈H₁₇ | —OH |
| 85 | —C₈H₁₇ | —H | —CH₃ | —H | —C₄H₉ | —OH |
| 86 | 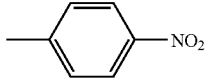 | —H | —CH₃ | —CN | —C₄H₉ | —NH₂ |
(87)
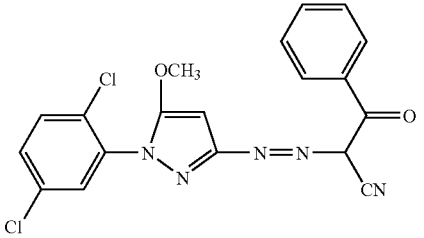
(88)
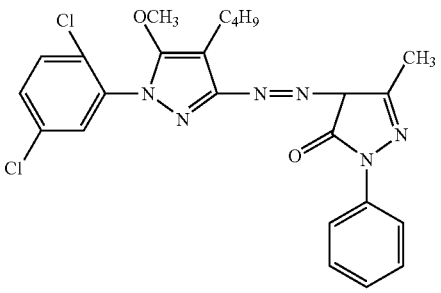

-continued
(89) 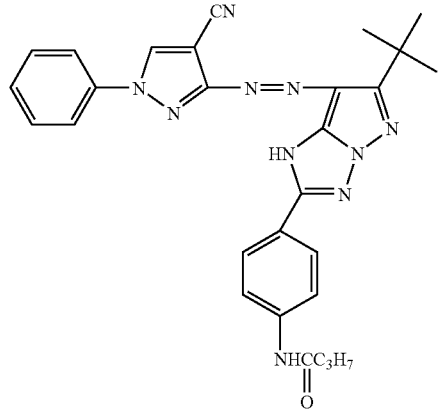
(90) 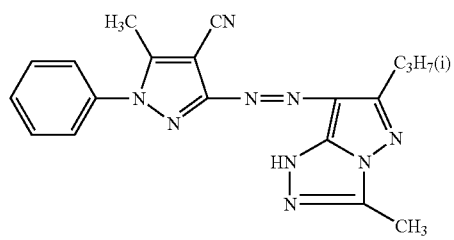
(91) 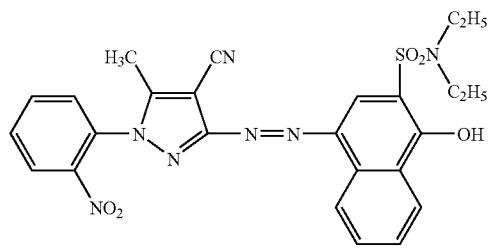
(92) 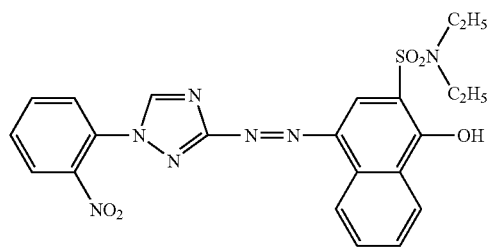
(93) 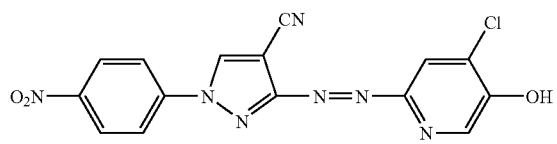
(94) 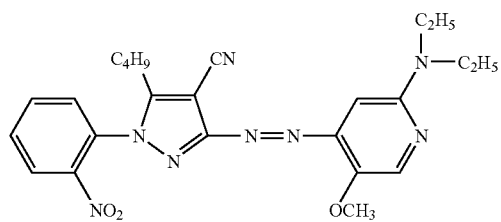

-continued
(95) 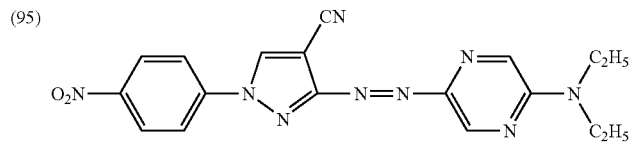
(96) 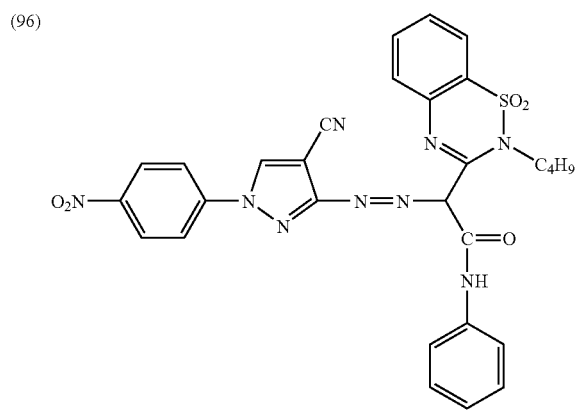
(97) 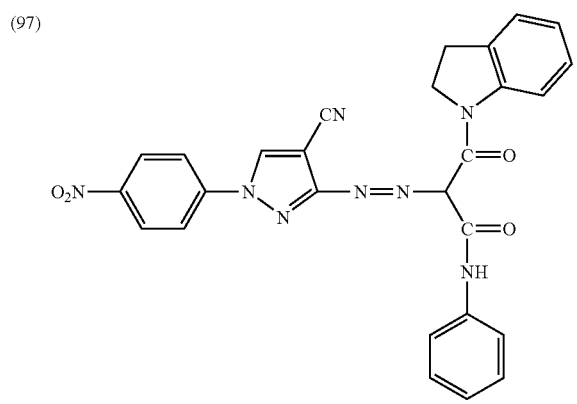
(98) 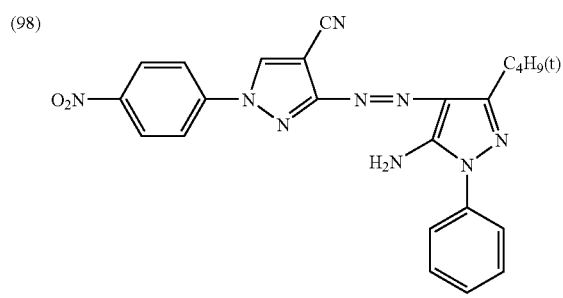
(99) 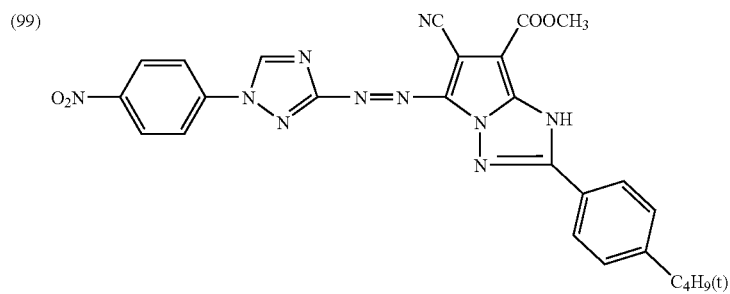

(100)
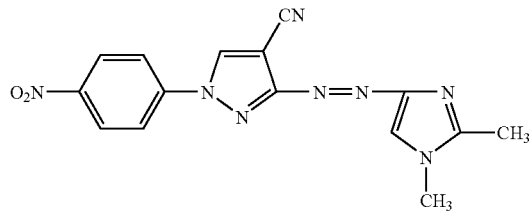
(101)
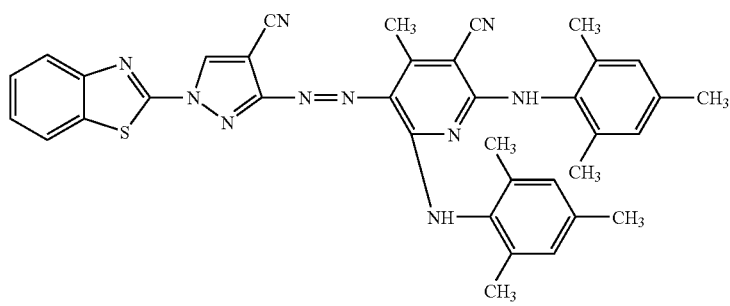
(102)
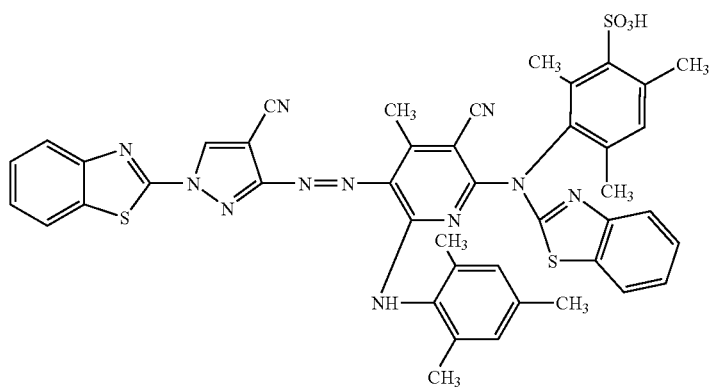
In the following, as a synthesis example of the dye (azo dye) represented by the formula (1), a synthesis of the example compound 1 will be explained with reference to a following scheme.
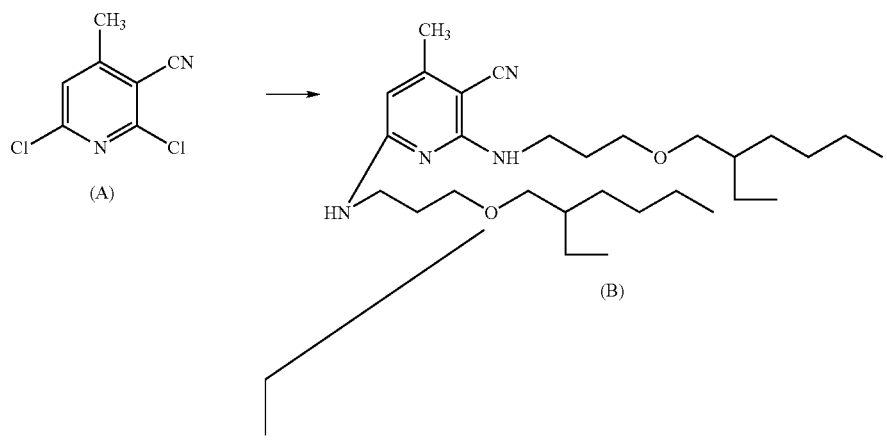

-continued

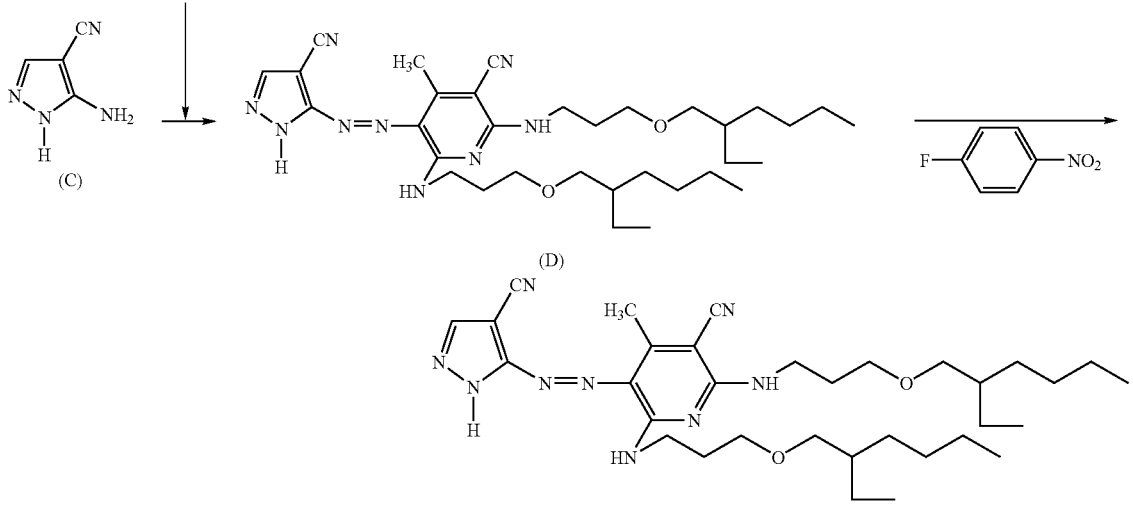

EXAMPLE COMPOUND 1

Synthesis of Example Compound 1

While 93.5 g (0.50 moles) of 3-(2-ethylhexyloxy)propylamine were agitated under cooling with water, 18.7 g (0.10 moles) of a compound (A) were added gradually. Thereafter, agitation was conducted for further 4 hours at 120° C. After the obtained reaction liquid was cooled to the room temperature, 300 ml of ethyl acetate and 300 ml of water were added, then the liquid layers were separated and an ethyl acetate layer was washed twice with 200 ml of a saturated aqueous solution of sodium chloride. Subsequently ethyl acetate was distilled off under a reduced pressure and an obtained viscous liquid was purified with silica gel column chromatography to obtain 45.5 g of a compound (B) as colorless viscous liquid (yield 93.2%).

Separately, in a solution, formed by dissolving 2.16 g (0.02 moles) of a compound (C) in 25 ml of phosphoric acid and agitated at 0° C., 1.5 g (0.022 moles) of sodium nitrite were added and the mixture was agitated further for 30 minutes. In this reaction liquid, 9.7 g (0.02 moles) of the aforementioned compound (B) were added and the mixture was agitated for 3 hours at 25° C. The obtained reaction liquid was further added with 300 ml of water and agitated for 1 hour, and precipitating crystals were separated by filtration and washed sufficiently with water. The obtained crystals were dried to obtain 11.0 g of a compound (D) (yield 90.1%).

Then, to 6.1 g (0.01 moles) of the compound (D), 30 ml of dimethyl acetamide, 3.0 g of potassium carbonate and 2.0 (0.014 moles) of p-fluoronitrobenzene were added and the mixture was agitated at 75° C. for 2 hours. This reaction liquid was poured into a mixture of 100 ml of water and 100 ml of ethyl acetate, then the mixture layers were separated and an ethyl acetate layer was washed twice with 100 ml of a saturated aqueous solution of sodium chloride. After ethyl acetate was distilled off under a reduced pressure, the residue was purified with silica gel column chromatography and crystallized from 40 ml of acetonitrile and the crystals were separated by filtration, washed with 20 ml of cold acetonitrile and dried to obtain 4.8 g of an azo compound [example compound 1 (dye represented by the formula (1)) as yellow crystals (yield 65.9%).

The obtained azo compound, in a melting point measurement and measurements of a maximum absorption wavelength ($\lambda_{max}$) and a molar absorption coefficient ($\epsilon$) in ethyl acetate by a spectrophotometer (trade name: UV-2400PC, manufactured by Shimadzu Mfg. Co), provided a melting point of 157-158° C., a maximum absorption wavelength $\lambda_{max}$ of 466.9 nm and $\epsilon$ of 49,300.

Example compounds other than the example compound 1 can also be synthesized by similar methods, for example by changing the aforementioned compounds (A) and (C) to desired compounds.

The colored curable composition of the invention may preferably includes, in addition to the dye represented by the formula (1), at least one dye represented by a formula (2) and/or dyes represented by a formula (3) to be explained later.

-Dye Represented by Formula (2)-

A dye represented by the following formula (2) (azo dye: dye of the invention) also has a satisfactory color hue, shows an excellent stability without precipitation in time in a state of a liquid preparation or a coated film, and shows resistances to heat and light.

In the following, the dye represented by the formula (2) will be explained in detail.

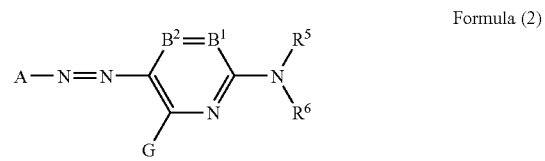

Formula (2)

In the formula (2), A represents a residue of A-NH$_2$ which is a 5-membered heterocyclic diazo component. A hetero atom in the 5-membered heterocycle constituting A of A-NH$_2$ can be N, O or S. The heterocycle is preferably a nitrogen-containing 5-membered heterocycle, and the heterocycle may be condensed with an aliphatic ring, an aromatic ring or another heterocycle.

Preferred examples of the heterocycle in A include a pyrazole ring, an imidazole ring, a thiazole ring, an isothiazole ring, a thiadiazole ring, a benzothiazole ring, a benzoxazole ring and a benzoisothiazole ring. Each heterocycle may further have a substituent. Among these, there are preferred a pyrazole ring, an imidazole ring, an isothiazole ring, a thiadiazole ring and a benzothiazole ring represented by following formulae (a) to (f).

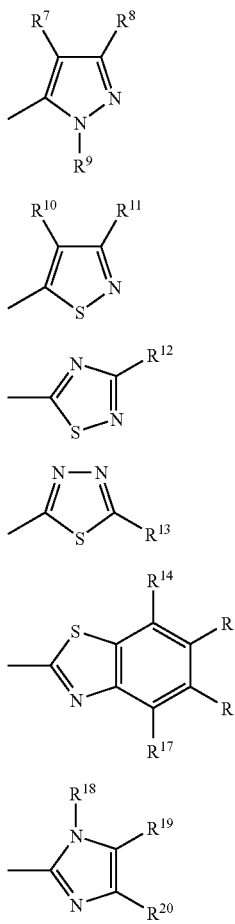

In the formulae (a) to (f), $R^7$ to $R^{20}$ have the same meanings and the same preferred ranges as G, $R^1$ and $R^2$ to be explained later. Among the formulae (a) to (f), there is preferred a pyrazole ring or an isothiazole ring represented by the formula (a) or (b), and most preferably a pyrazole ring represented by the formula (a).

$B^1$ represents —$CR^1$= or a nitrogen atom, and $B^2$ represents —$CR^2$= or a nitrogen atom; $B^1$ and $B^2$ do not represent nitrogen atoms at the same time. Thus $B^1$ and $B^2$ represent —$CR^1$= and —$CR^2$=, or either one of $B^1$ and $B^2$ represents a nitrogen atom while the other represents —$CR^1$= or —$CR^2$=. Among these, there is preferred a case where $B^1$ represents —$CR^1$= and $B^2$ represents —$CR^2$=.

$R^5$ and $R^6$ each independently represents a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group, or a sulfamoyl group, each may further have a substituent. $R^5$ and $R^6$ each preferably represents a hydrogen atom, an aliphatic group, an aromatic group, a heterocyclic group, an acyl group, an alkylsulfonyl group, or an arylsulfonyl group, more preferably a hydrogen atom, an aromatic group, a heterocyclic group, an acyl group, an alkylsulfonyl group, or an arylsulfonyl group, and most preferably a hydrogen atom, an aryl group or a heterocyclic group. There is also preferred a case where such preferred group further has a substituent. However, $R^5$ and $R^6$ are not hydrogen atoms at the same time.

G, $R^1$ and $R^2$ each independently represents a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxyl group, an alkoxy group, an aryloxy group, a silyloxy group, an acyloxy group, a carbamoyloxy group, a heterocyclicoxy group, an alkoxycarbonyloxy group, an aryloxycarbonyloxy group, "a substituted amino group substituted with an alkyl, an aryl or a heterocyclic group", an acylamino group, an ureido group, a sulfamoylamino group, an alkoxycarbonylamino group, an aryloxycarbonylamino group, an alkyl- or aryl-sulfonylamino group, a nitro group, an alkyl- or aryl-thio group, an alkyl- or aryl-sulfonyl group, an alkyl- or arylsulfinyl group, a sulfamoyl group, a sulfo group or a heterocyclic thio group, and each group may be further substituted.

The group represented by G is preferably a hydrogen atom, a halogen atom, an aliphatic group, an aromatic group, a hydroxyl group, an alkoxy group, an aryloxy group, an acyloxy group, a heterocyclic oxy group, "a substituted amino group substituted with an alkyl, an aryl or a heterocyclic group", an acylamino group, an ureido group, a sulfamoylamino group, an alkoxycarbonylamino group, an aryloxycarbonylamino group, an alkyl- or aryl-thio group, or a heterocyclic thio group, more preferably a hydrogen atom, a halogen atom, an alkyl group, a hydroxyl group, an alkoxy group, an aryloxy group, an acyloxy group, "a substituted amino group substituted with an alkyl, an aryl or a heterocyclic group", or an acylamino group, and most preferably a hydrogen atom, an arylamino group or an amide group. Each group may further have a substituent.

The group represented by $R^1$ or $R^2$ is preferably a hydrogen atom, an alkyl group, an alkoxycarbonyl group, a carboxyl group, a carbamoyl group or a cyano group. Each group may further have a substituent.

Also $R^1$ and $R^2$, and $R^5$ and $R^6$ may be mutually bonded to form a 5- or 6-membered ring.

In case each of A, $R^1$, $R^2$, $R^5$, $R^6$ and G further has a substituent, such substituent can be similar to those cited for G, $R^1$ and $R^2$.

In case the dye represented by the formula (2) is a water-soluble dye, it is preferably provided further with an ionic hydrophilic group as a substituent in any position on A, $R^1$, $R^2$, $R^5$, $R^6$ or G. The ionic hydrophilic group as a substituent includes a sulfo group, a carboxyl group, and a quaternary ammonium group. Such ionic hydrophilic group is preferably a carboxyl group or a sulfo group, particularly preferably a sulfo group. The carboxyl group or the sulfo group may be in a salt state, and a counter ion for forming a salt can be an alkali metal ion (such as sodium ion or potassium ion), or an organic cation (such as tetramethylguanidium ion).

In the following, each group relating to the formula (2) will be explained.

In the formula (2), the halogen atom can be a fluorine atom, a chlorine atom or a bromine atom.

In the formula (2), the aliphatic group means an alkyl group, a substituted alkyl group, an alkenyl group, a substituted alkenyl group, an alkinyl group, a substituted alkinyl group, an aralkyl group or a substituted aralkyl group. The aliphatic group may be branched, or may form a ring. The aliphatic group preferably has 1 to 20 carbon atoms, more preferably 1 to 16 carbon atoms. In the aralkyl group or the substituted aralkyl group, an aryl group is preferably phenyl or naphthyl, particularly preferably phenyl. Examples of the aliphatic group include methyl, ethyl, butyl, isopropyl, t-butyl, hydroxyethyl, methoxyethyl, cyanoethyl, trifluoromethyl, 3-sulfopropyl, 4-sulfobutyl, cyclohexyl, benzyl, 2-phenethyl, vinyl and allyl.

In the formula (2), the aromatic group means an aryl group or a substituted aryl group. The aryl group is preferably phenyl or naphthyl, particularly preferably phenyl. The aromatic group preferably has 6 to 20 carbon atoms, more preferably 6 to 16 carbon atoms. Examples of the aromatic group include phenyl, p-tolyl, p-methoxyphenyl, o-chlorophenyl and m-(3-sulfopropylamino)phenyl.

In the formula (2), the heterocyclic group includes a heterocyclic group having a substituent and a non-substituted heterocyclic group. The heterocycle may be condensed with an aliphatic group, an aromatic group or another heterocycle. The heterocyclic group is preferably a 5- or 6-membered heterocyclic group. Examples of the substituent include an aliphatic group, a halogen atom, an alkyl- or aryl-sulfonyl group, an acyl group, an acylamino group, a sulfamoyl group, a carbamoyl group, and an ionic hydrophilic group. Examples of the heterocyclic group include a 2-pyridyl group, a 2-thienyl group, a 2-thiazolyl group, a 2-benzothiazolyl group, a 2-benzooxazolyl group and a 2-furyl group.

In the formula (2), the carbamoyl group includes a carbamoyl group having a substituted and a non-substituted carbamoyl group. Examples of the substituent include an alkyl group. Examples of the carbamoyl group include a methylcarbamoyl group and a dimethylcarbamoyl group.

In the formula (2), the alkoxycarbonyl group includes an alkoxycarbonyl group having a substituent and a non-substituted alkoxycarbonyl group. The alkoxycarbonyl group preferably has 2 to 12 carbon atoms. Examples of the substituent include an ionic hydrophilic group. Examples of the alkoxycarbonyl group include a methoxycarbonyl group and an ethoxycarbonyl group.

In the formula (2), the aryloxycarbonyl group includes an aryloxycarbonyl group having a substituent and a non-substituted aryloxycarbonyl group. The aryloxycarbonyl group preferably has 7 to 12 carbon atoms. Examples of the substituent include an ionic hydrophilic group. Examples of the aryloxycarbonyl group include a phenoxycarbonyl group.

In the formula (2), the acyl group includes an acyl group having a substituent and a non-substituted acyl group. The acyl group preferably has 1 to 12 carbon atoms. Examples of the substituent include an ionic hydrophilic group. Examples of the acyl group include an acetyl group and a benzoyl group.

In the formula (2), the alkoxy group includes an alkoxy group having a substituent and a non-substituted alkoxy group. The alkoxy group preferably has 1 to 12 carbon atoms. Examples of the substituent include an alkoxy group, a hydroxyl group and an ionic hydrophilic group. Examples of the alkoxy group include a methoxy group, an ethoxy group, an isopropoxy group, a methoxyethoxy group, a hydroxyethoxy group and a 3-carboxypropoxy group.

In the formula (2), the aryloxy group includes an aryloxy group having a substituent and a non-substituted aryloxy group. The aryloxy group preferably has 6 to 12 carbon atoms. Examples of the substituent include an alkoxy group, and an ionic hydrophilic group. Examples of the aryloxy group include a phenoxy group, a p-methoxyphenoxy group and an o-methoxyphenoxy group.

In the formula (2), the acyloxy group includes an acyloxy group having a substituent and a non-substituted acyloxy group. The acyloxy group preferably has 1 to 12 carbon atoms. Examples of the substituent include an ionic hydrophilic group. Examples of the acyloxy group include an acetoxy group and a benzoyloxy group.

In the formula (2), the carbamoyloxy group includes a carbamoyloxy group having a substituent and a non-substituted carbamoyloxy group. Examples of the substituent include an alkyl group. Examples of the carbamoyloxy group include an N-methylcarbamoyloxy group.

In the formula (2), the "substituted amino group substituted with an alkyl, an aryl or a heterocyclic group" may be provided, in such substituent, further with a substituent. A non-substituted amino group is not included. An alkylamino group preferably has 1 to 6 carbon atoms. Examples of the substituent in case a further substituent is present include an ionic hydrophilic group. Examples of the alkylamino group include a methylamino group and a diethylamino group. An arylamino group includes an arylamino group having a substituent and a non-substituted arylamino group. The arylamino group preferably has 6 to 12 carbon atoms. Examples of the substituent in case a further substituent is present include a halogen atom and an ionic hydrophilic group. Examples of the arylamino group include an anilino group and a 2-chloroanilino group.

In the formula (2), the acylamino group includes an acylamino group having a substituent. The acylamino group preferably has 2 to 12 carbon atoms. Examples of the substituent include an ionic hydrophilic group. Examples of the acylamino group include an acetylamino group, a propionylamino group, a benzoylamino group, an N-phenylacetylamino group and a 3,5-disulfobenzoylamino group.

In the formula (2), the ureido group includes an ureido group having a substituent and a non-substituted ureido group. The ureido group preferably has 1 to 12 carbon atoms. Examples of the substituent include an alkyl group and an aryl group. Examples of the ureido group include a 3-methylureido group, a 3,3-dimethylureido group and a 3-phenylureido group.

In the formula (2), the sulfamoylamino group includes a sulfamoylamino group having a substituent and a non-substituted sulfamoylamino group. Examples of the substituent include an alkyl group. Examples of the sulfamoylamino group include an N,N-dipropylsulfamoylamino group.

In the formula (2), the alkoxycarbonylamino group includes an alkoxycarbonylamino group having a substituent and a non-substituted alkoxycarbonylamino group. The alkoxycarbonylamino group preferably has 2 to 12 carbon atoms. Examples of the substituent include an ionic hydrophilic group. Also examples of the alkoxycarbonylamino group include an ethoxycarbonylamino group.

In the formula (2), the aryloxycarbonylamino group includes an aryloxycarbonylamino group having a substituent and a non-substituted aryloxycarbonylamino group. The aryloxycarbonylamino group preferably has 7 to 12 carbon atoms. Examples of the substituent include an ionic hydrophilic group. Also examples of the aryloxycarbonylamino group include a phenoxycarbonylamino group.

In the formula (2), the alkylsulfonylamino and arylsulfonylamino group includes an alkyl- and aryl-sulfonylamino group having a substituent and a non-substituted alkyl- or aryl-sulfonylamino group. Such sulfonylamino group preferably has 1 to 12 carbon atoms. Examples of the substituent include an ionic hydrophilic group. Also examples of the sulfonylamino group include a methanesulfonylamino group, an N-phenylmethanesulfonylamino group, a benzenesulfonylamino group, and a 3-carboxybenzenesulfonylamino group.

In the formula (2), the alkylthio, arylthio and heterocyclic thio groups include alkylthio, arylthio and heterocyclic thio groups having a substituent and non-substituted alkylthio, arylthio and heterocyclic thio groups. The alkylthio, arylthio or heterocyclic thio group preferably has 1 to 12 carbon atoms. Examples of the substituent include an ionic hydrophilic group. Also examples of the alkylthio, arylthio and heterocyclic thio groups include a methylthio group, a phenylthio group and a 2-pyridylthio group.

In the formula (2), Examples of the alkylsulfonyl group and the arylsulfonyl group respectively include a methanesulfonyl group and a phenylsulfonyl group. Also examples of the alkylsulfinyl group and the arylsulfinyl groups respectively include a methanesulfinyl group and a phenylsulfinyl group.

In the formula (2), the sulfamoyl group includes a sulfamoyl group having a substituent and a non-substituted sulfamoyl group. Examples of the substituent include an alkyl group. Also examples of the sulfamoyl group include a dimethylsulfamoyl group and a di-(2-hydroxylethyl)sulfamoyl group.

In the following, specific examples of the dyes represented by the formula (2) (example compounds a-1 to a-36, b-1 to b-8, c-1 to c-5, d-1 to d-5, e-1 to e-5, f-1 to f-33 and g-(1) to g-(68)) are shown. However the invention is not limited to such examples.

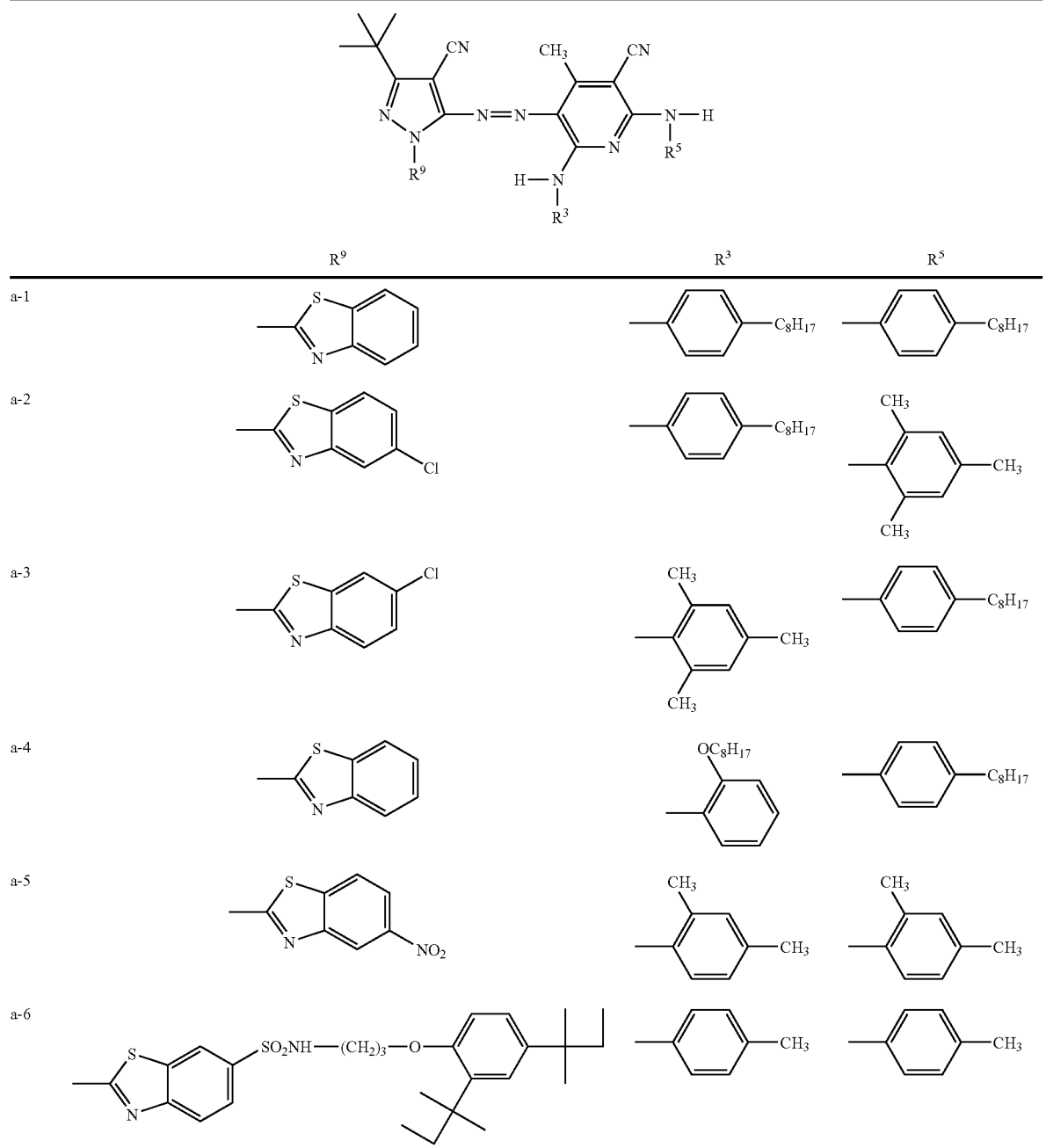

-continued
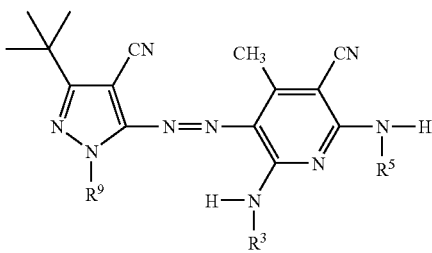
|     | R⁹ | R³ | R⁵ |
|-----|----|----|----|
| a-7 | 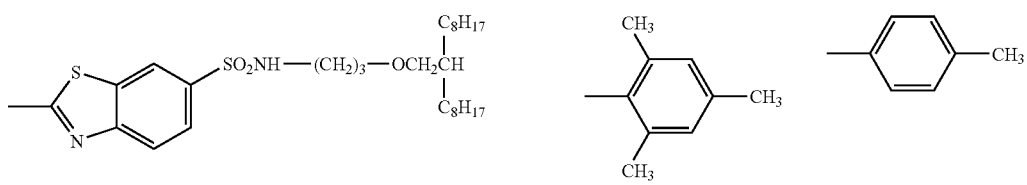 | | |
| a-8 | 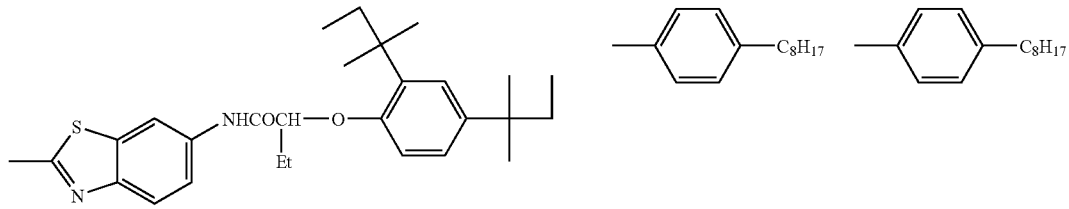 | | |
| a-9 | 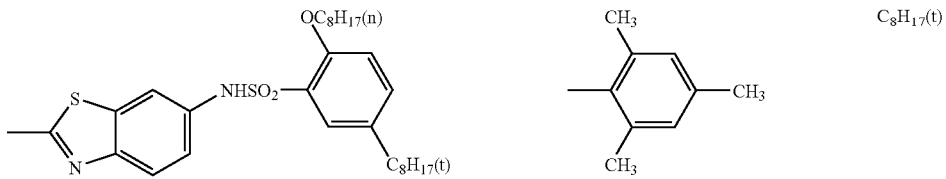 | | |
| a-10 |  | | |

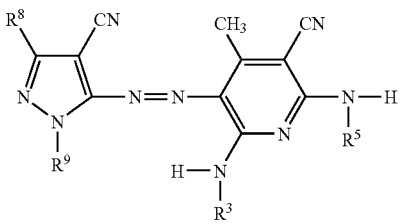
| | R⁸ | R⁹ | R³ | R⁵ |
|---|---|---|---|---|
| a-11 | *t*-Bu | 2-methylbenzothiazol-6-yl-SO₃Na | 4-CH₃-C₆H₄- | 4-SO₃Na-C₆H₄- |
| a-12 | *t*-Bu | 2-methylbenzothiazol-6-yl-SO₃K | 2-SO₃K-C₆H₄- | 2-SO₃K-C₆H₄- |
| a-13 | C₆H₅- | 2-methylbenzothiazol-6-yl-COOH | 4-SO₃K-C₆H₄- | 3-COOH-C₆H₄- |
| a-14 | 2-Cl-C₆H₄- | 2-methylbenzothiazol-(4,5-mix)-SO₂K | 4-SO₃K-C₆H₄- | 3-COOH-C₆H₄- |
| a-15 | 4-SO₃K-C₆H₄- | 2-(benzothiazol-2-yl) | 2-SO₃K-C₆H₄- | 3-COOH-C₆H₄- |

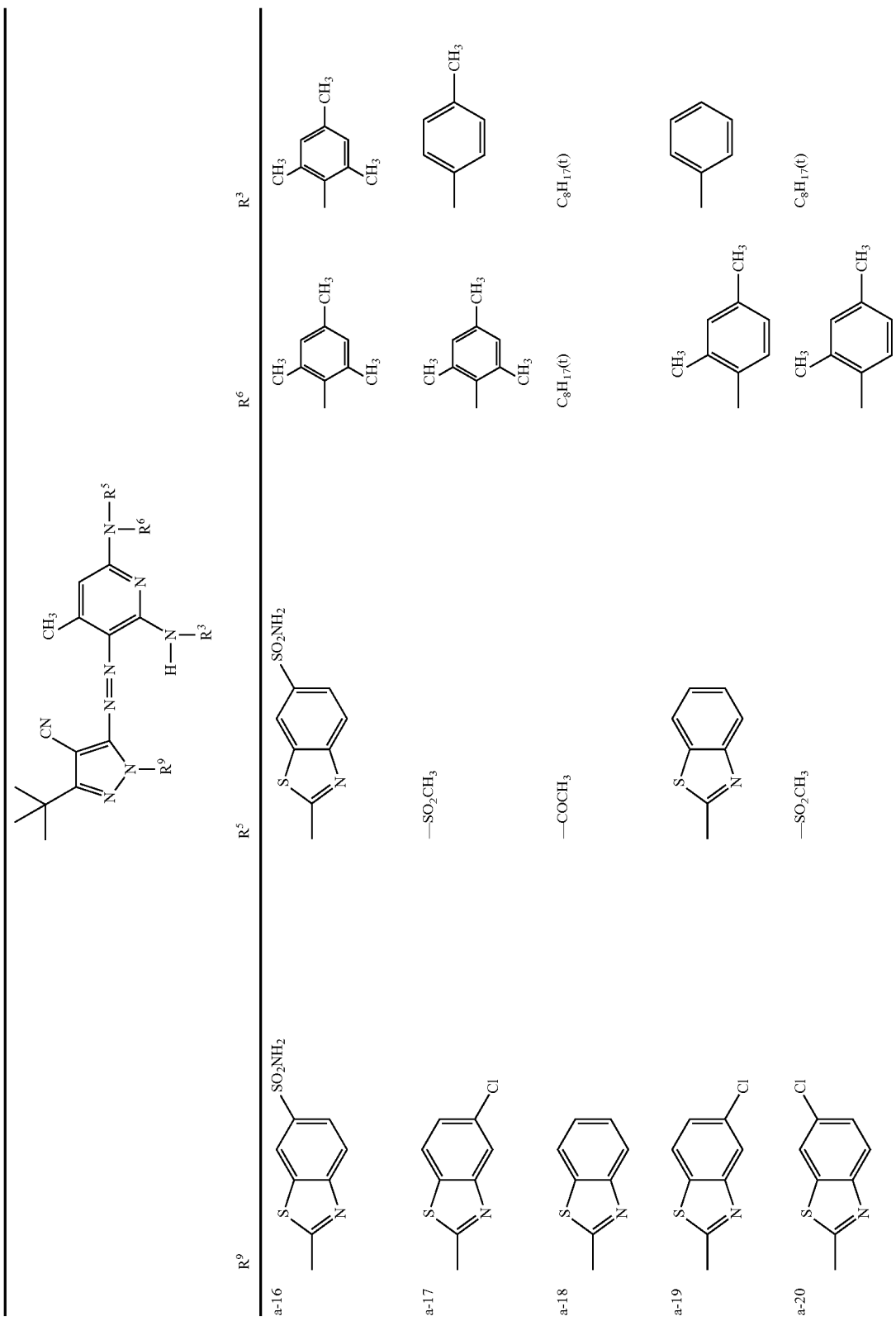

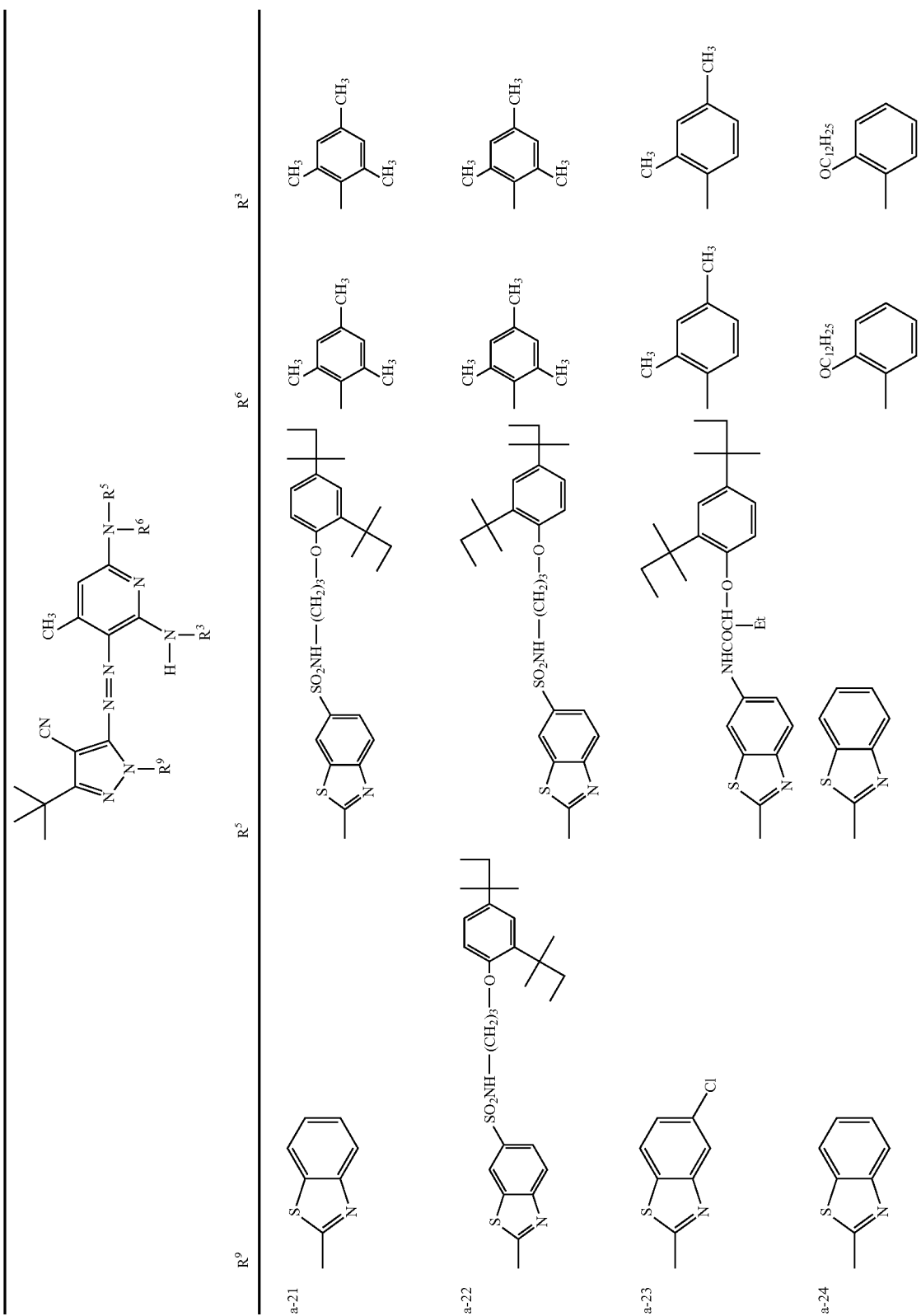

-continued

| | $R^5$ | $R^6$ | $R^3$ |
|---|---|---|---|
| a-25 | | | |
| a-26 | | | |
| a-27 | | | |

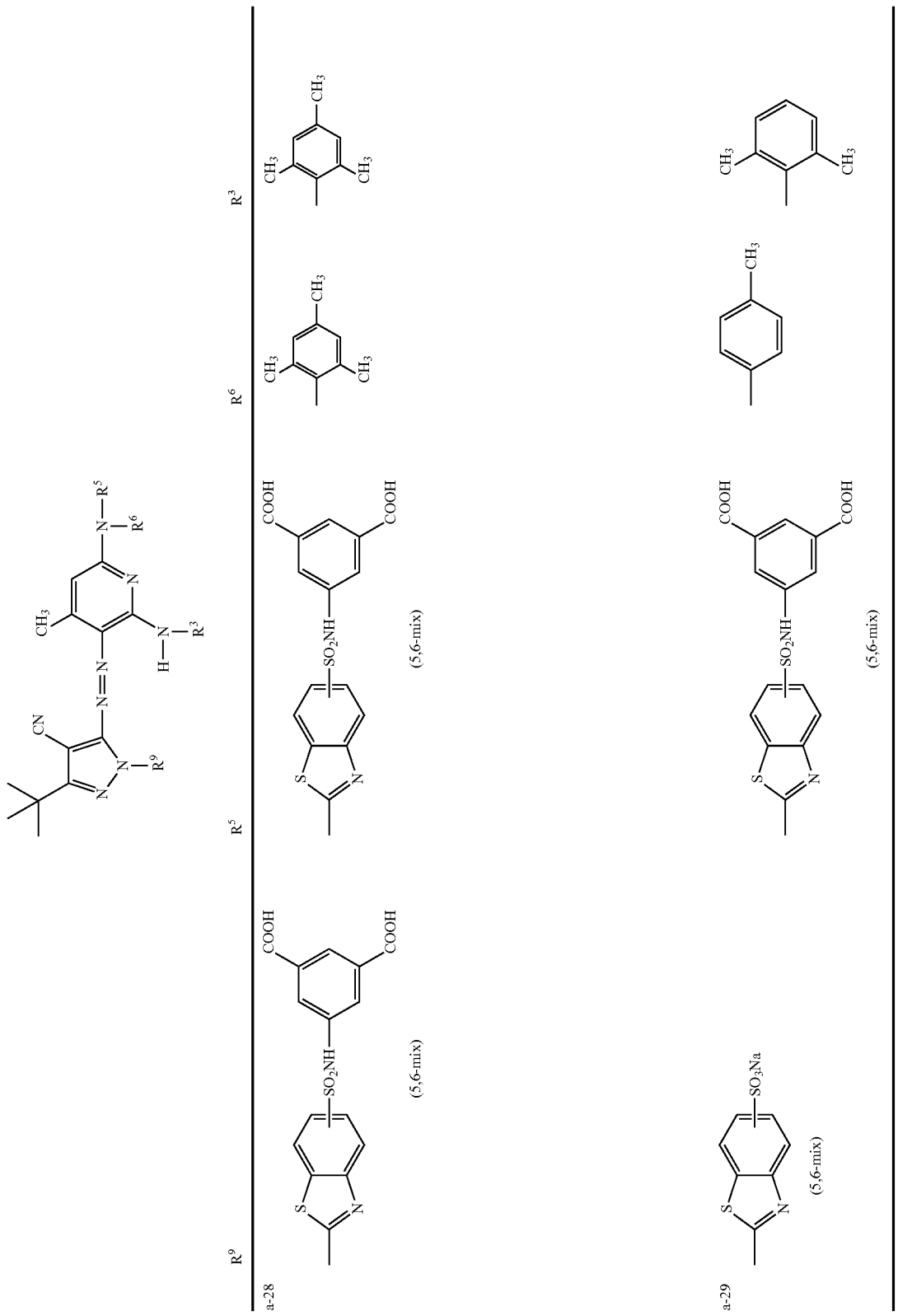

| | R8 | R7 | R9 | R2 | R1 | R5 | R4 | R6 | R3 |
|---|---|---|---|---|---|---|---|---|---|
| a-30 | 2-methylphenyl | CN | 2-methylpyridyl | H | $CONH_2$ | $-SO_2CH_3$ | 2-methylbenzothiazol-yl | 2-$OC_8H_{17}$-phenyl | 2-methylphenyl |
| a-31 | t-Bu | Br | 2-methylpyridyl | COOEt | H | H | 5-chloro-2-methylbenzothiazol-yl | $C_8H_{17}(t)$ | $-COCH_3$ |
| a-32 | 2-methylpyridyl | $-SO_2CH_3$ | 4-methyl-2,6-bis(NHCH_3)-1,3,5-triazinyl | $CONH_2$ | H | H | 5-chloro-2-methylbenzothiazol-yl | 4-methylphenyl-CH_2-CO- | -CO-C(CH_3)_3 |
| a-33 | t-Bu | CN | 2,4-dicyano-5-methylphenyl | H | H | H | 5-chloro-2-methylbenzothiazol-yl | 2-methylphenyl | $-SO_2CH_3$ |

-continued
| | R⁸ | R⁷ | R⁹ | R² | R¹ | R⁵ | R⁶ | R³ |
|---|---|---|---|---|---|---|---|---|
| a-34 |  | Br |  | H | CONH₂ | COCH₃ |  |  |
| a-35 |  | CN |  | CH₃ | H |  |  |  |
| a-36 |  | CN |  | CH₃ | CN | H |  |  |

| | $R^{11}$ | $R^2$ | $R^1$ | $R^5$ | $R^6$ | $R^3$ |
|---|---|---|---|---|---|---|
| b-1 | —CH₃ | —CH₃ | —CN | —H | —C₆H₄—C₈H₁₇ (p) | —C₆H₄—C₈H₁₇ (p) |
| b-2 | t-Bu | —CH₃ | —CN | —H | 2,4,6-trimethylphenyl | 2,4,6-trimethylphenyl |
| b-3 | —CH₃ | —CH₃ | —CONH₂ | —H | —C₆H₄—C₈H₁₇ (p) | —C₆H₄—C₈H₁₇ (p) |
| b-4 | —CH₃ | —CH₃ | —H | —H | 2,4,6-trimethylphenyl | 2,4,6-trimethylphenyl |
| b-5 | —CH₃ | —H | —CN | —H | —C₆H₄—SO₃Na (p) | —C₆H₄—SO₃Na (p) |
| b-6 | —CH₃ | —CH₃ | —H | 2-benzothiazolyl | 2,4,6-trimethylphenyl | 2,4,6-trimethylphenyl |
| b-7 | —CH₃ | —CH₃ | —H | 2-benzothiazolyl | 2,4,6-trimethylphenyl | —C₆H₄—C₈H₁₇ (p) |
| b-8 | —CH₃ | —H | —H | —SO₂CH₃ | 3-methyl-4-(SO₃Na)phenyl | 3-methyl-4-(SO₃Na)phenyl |

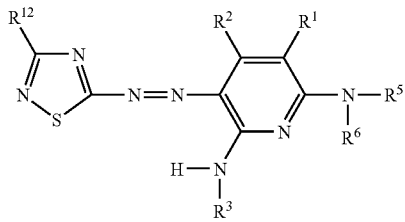

| | R12 | R2 | R1 | R5 | R6 | R3 |
|---|---|---|---|---|---|---|
| c-1 | —SCH3 | —CH3 | —CN | —H | —C8H17(t) | -C6H4-C8H17 |
| c-2 | -Ph | —H | —CONH2 | —H | -C6H4-SO3K | -C6H4-SO3K |
| c-3 | —SCH2CH2SO3K | —CH3 | —H | 2-methylbenzothiazol-6-yl-SO3K | -C6H4-SO3K | -C6H4-SO3K |
| c-4 | —CH3 | —CH3 | —H | 2-methylbenzothiazol-6-yl-SO2NH(CH2)3O-(2,4-di-tert-amylphenyl) | 2,4,6-trimethylphenyl | -C6H4-C8H17 |
| c-5 | -Ph | —H | —H | 2-methylbenzothiazol-6-yl-NHSO2-(2-OC8H17(n)-5-C8H17(t)-phenyl) | 2,4,6-trimethylphenyl | C8H17(t) |

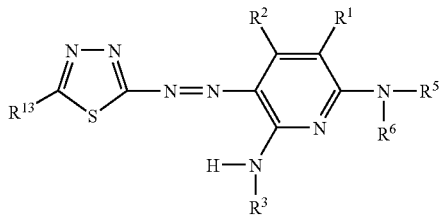

| | R13 | R2 | R1 | R5 | R6 | R3 |
|---|---|---|---|---|---|---|
| d-1 | -Me | —CH3 | —CN | —H | -C6H4-SO3K | -C6H4-SO3K |
| d-2 | -Me | —CH3 | —CN | —H | 2,6-diethyl-4-methylphenyl | 2,6-diethyl-4-methylphenyl |
| d-3 | -Me | —H | —H | 2-methylbenzothiazol-2-yl | 2,4,6-trimethylphenyl | 2,4,6-trimethylphenyl |

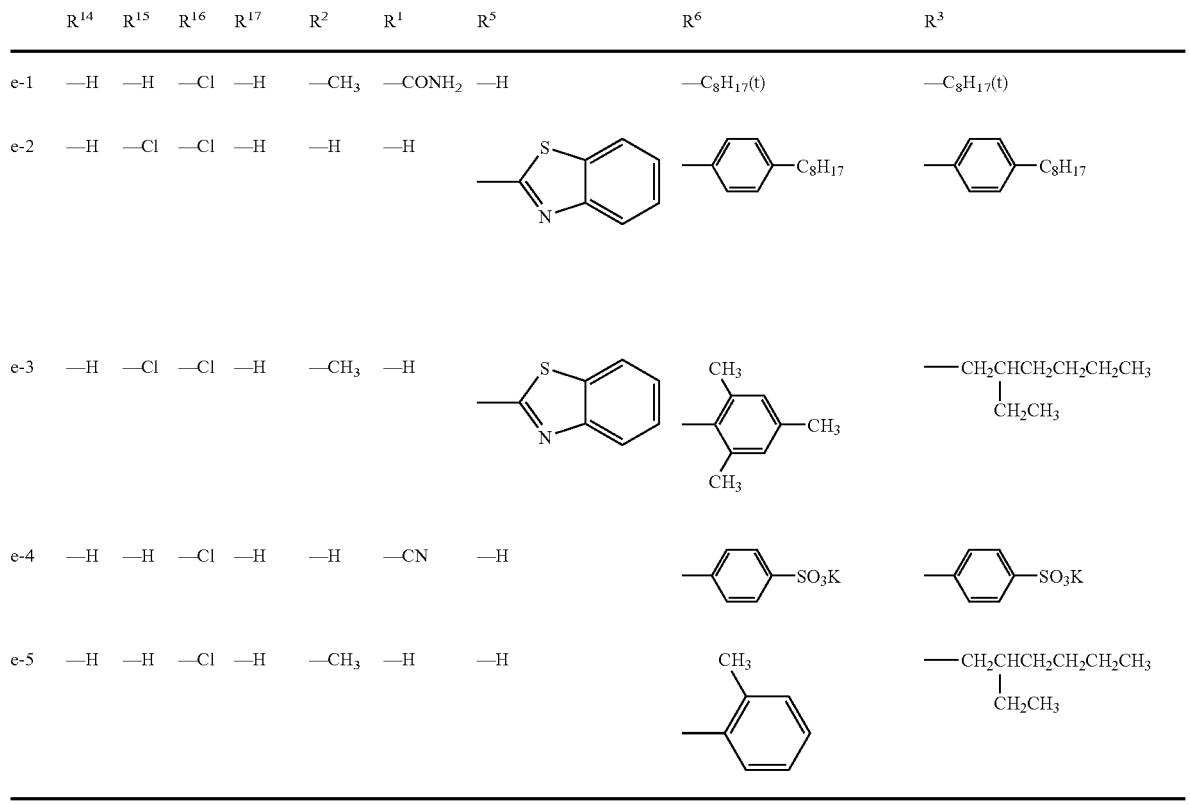

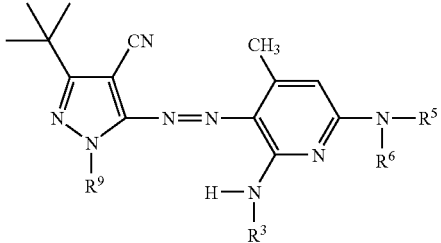

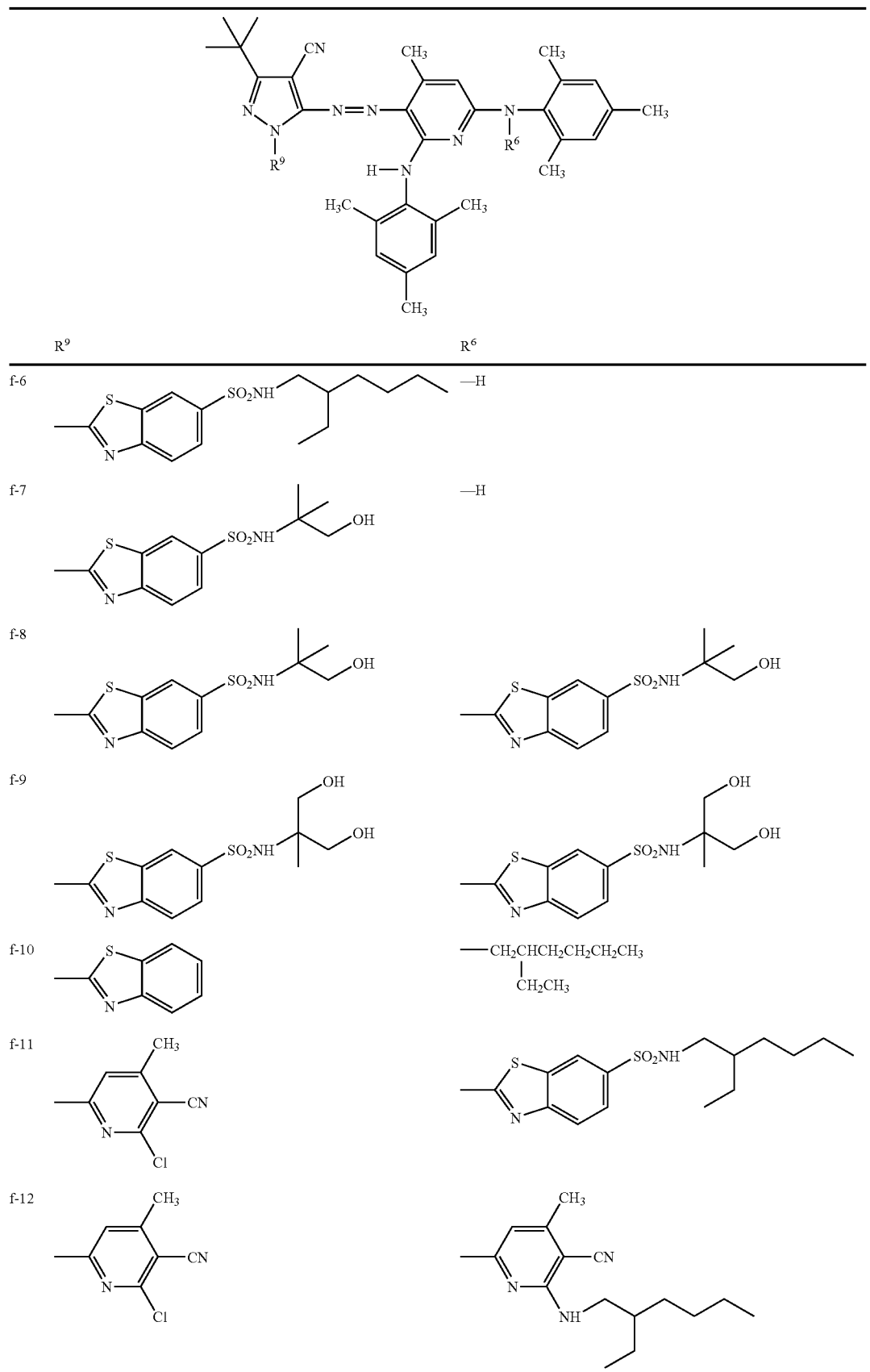

-continued
| f-13 | 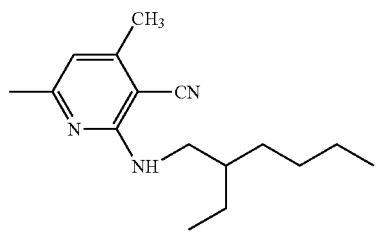 | 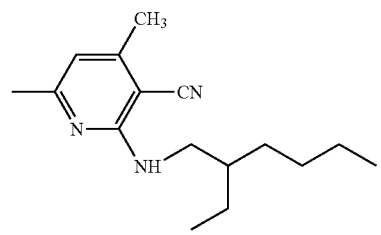 |
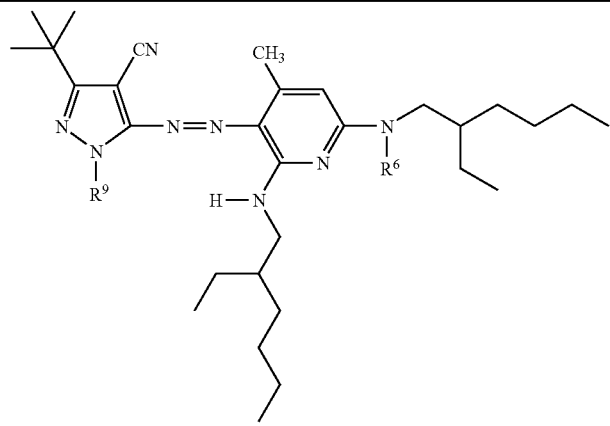
| | R⁹ | R⁶ |
|---|---|---|
| f-14 | 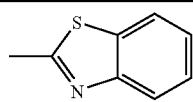 | —H |
| f-15 | 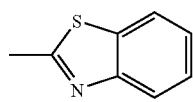 | —CH₂CH₂CH₃ |
| f-16 | 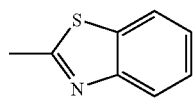 | —CH₂CHCH₂CH₂CH₃<br>     $\quad$ CH₂CH₃ |
| f-17 | 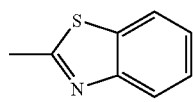 | 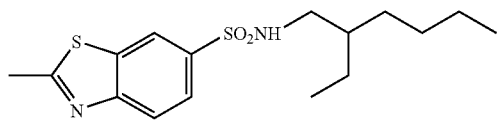 |
| f-18 | 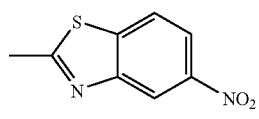 | 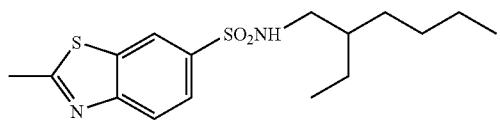 |
| f-19 | 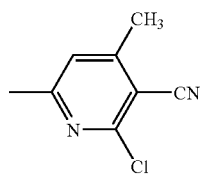 | 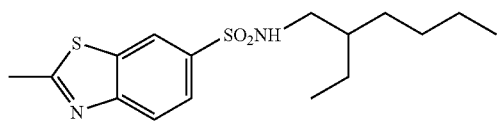 |

-continued
| | | |
|---|---|---|
| f-20 | 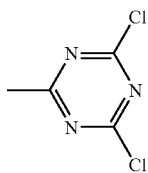 | 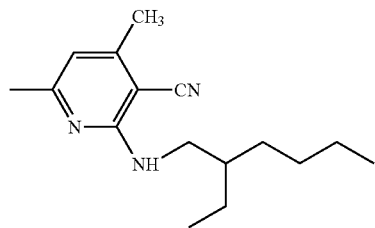 |
| f-21 | 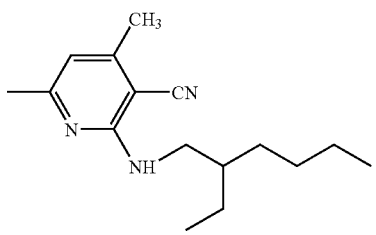 | 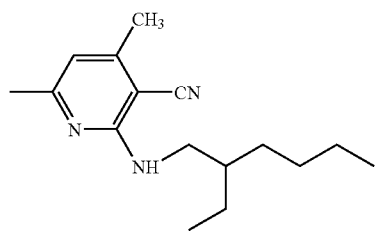 |
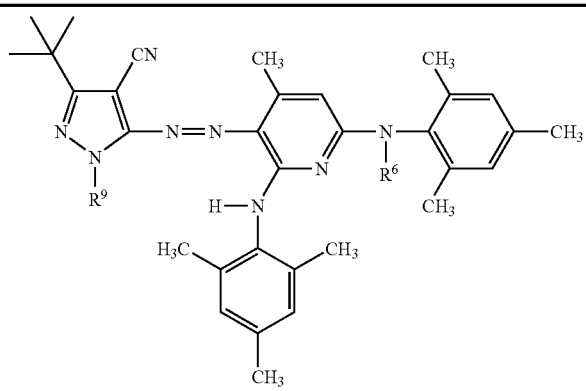
| | R⁹ | R⁶ |
|---|---|---|
| f-22 | 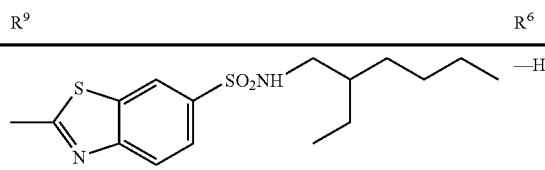 | —H |
| f-23 | 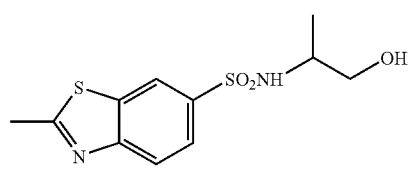 | 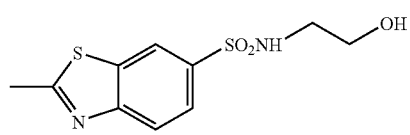 |
| f-24 | 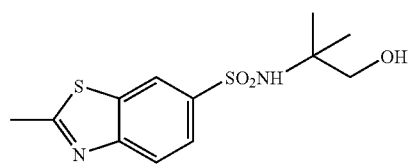 | 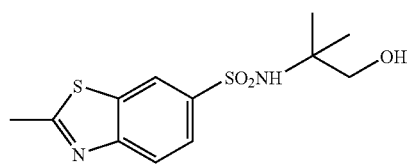 |
| f-25 | 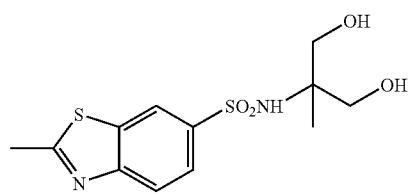 | 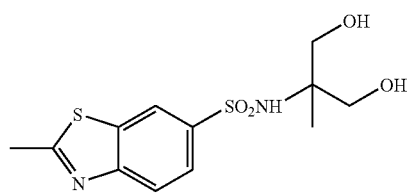 |

-continued
| | | |
|---|---|---|
| f-26 |  | |
| f-27 | | 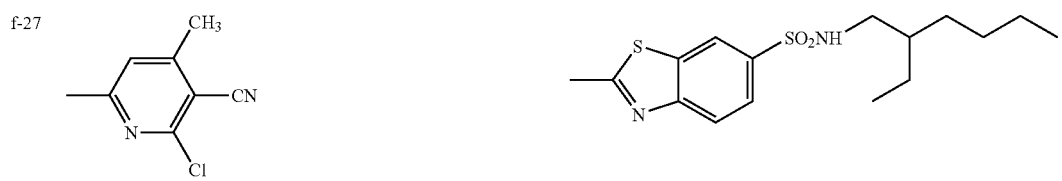 |
| f-28 | |  |
| f-29 | | 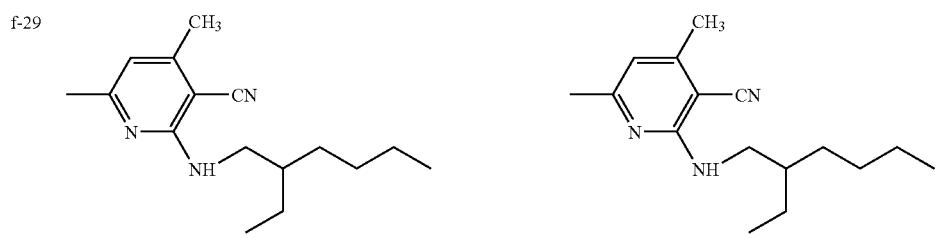 |
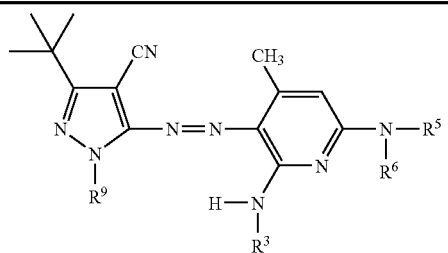
| | R⁹ | R⁵ | R⁶ | R³ |
|---|---|---|---|---|
| f-30 | | H | | |
| f-31 | | | | |
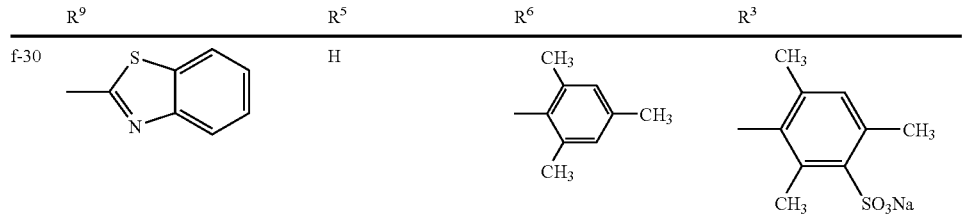
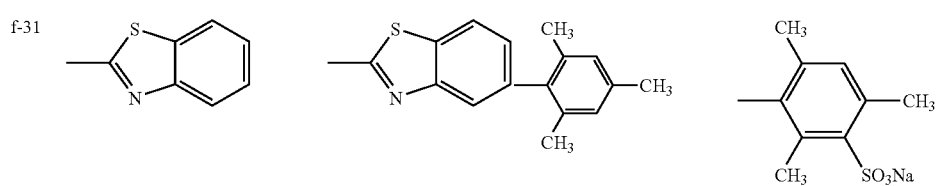

-continued

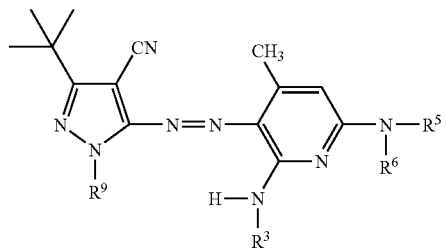

| | R⁹ | R⁵ | R⁶ | R³ |
|---|---|---|---|---|
| f-32 | 2-methylbenzothiazole | 2-methylbenzothiazole | 2,3,5-trimethyl-4-methyl-6-SO₃Na phenyl | 2,3,5-trimethylphenyl |
| f-33 | 2-methyl-6-SO₂Na-benzothiazole | 2-methylbenzothiazole | 2,3,5-trimethyl-4-methyl-6-SO₃Na phenyl | 2,3,5-trimethylphenyl |

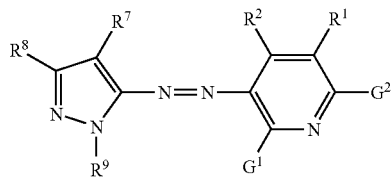

| No. | R⁹ | R⁸ | R⁷ | R² | R¹ | G¹ | G² |
|---|---|---|---|---|---|---|---|
| g-(1) | 4-NO₂-phenyl | $-C_4H_9(t)$ | $-CN$ | $-CH_3$ | $-CN$ | $-NH-CH_2CH(OH)CH_3$ | $-NH-CH_2CH(OH)CH_3$ |
| g-(2) | 2-NO₂-phenyl | $-C_4H_9(t)$ | $-CN$ | $-CH_3$ | $-CN$ | $-NH-CH_2CH(OH)CH_3$ | $-NH-CH_2CH(OH)CH_3$ |
| g-(3) | 4-NO₂-phenyl | $-C_4H_9(t)$ | $-CN$ | $-CH_3$ | $-CN$ | $-N(CH_3)CH_2CH_2OH$ | $-NHCH_2CH_2OH$ |
| g-(4) | 4-NO₂-phenyl | $-C_4H_9(t)$ | $-CN$ | $-CH_3$ | $-CN$ | $-NHCH_2CH_2OH$ | $-N(CH_3)CH_2CH_2OH$ |
| g-(5) | 4-NO₂-phenyl | $-C_4H_9(t)$ | $-CN$ | $-CH_3$ | $-CN$ | $-NHCH_2CH_2OCH_3$ | $-NHCH_2CH_2OCH_3$ |

-continued
| | | | | | | | |
|---|---|---|---|---|---|---|---|
| g-(6) | 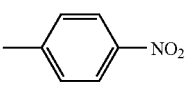 | —C₄H₉(t) | —CN | —CH₃ | —CN | 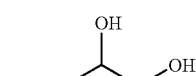 | 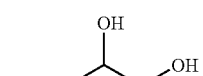 |
| g-(7) | 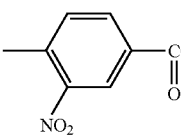 | —C₄H₉(t) | —CN | —CH₃ | —CN | 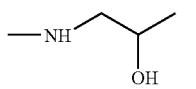 | 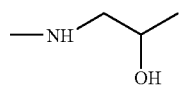 |
| g-(8) | 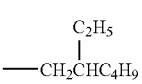 | —H | —CN | —CH₃ | —CN | 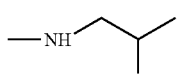 | 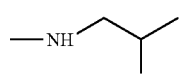 |
| g-(9) | 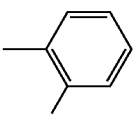 | —H | —CN | —CH₃ | —CN | 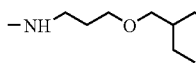 | 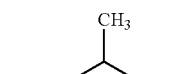 |
| g-(10) | 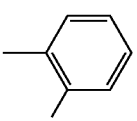 | —C₄H₉(t) | —CN | —CH₃ | —CN | 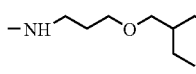 | 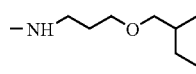 |
| g-(11) | 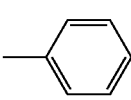 | —C₄H₉(t) | —CN | —CH₃ | —CN | 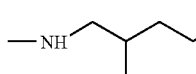 | —NHCH₃ |
| g-(12) | 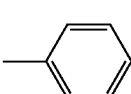 | —C₃H₇ | —COC₂H₅ | —CH₃ | —CN | 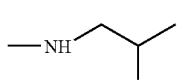 | 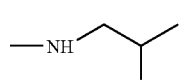 |
| g-(13) | 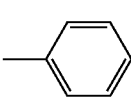 | —C₄H₉(t) | —CN | —CH₃ | —CN | 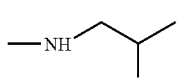 | 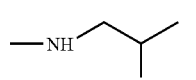 |
| g-(14) | 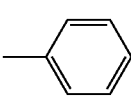 | —C₄H₉(t) | —CN | —CH₃ | —CN | 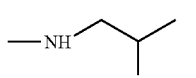 | 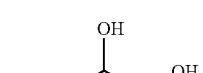 |
| g-(15) | 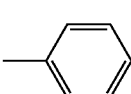 | —C₂H₅ | —CN | —CH₃ | —CN | 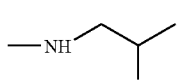 | 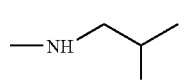 |
| g-(16) | 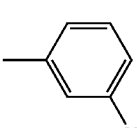 | —C₂H₅ | —CN | —CH₃ | —CN | 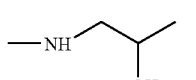 | 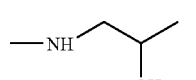 |
| g-(17) | 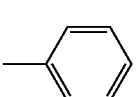 | —CH₃ | —CN | —CH₃ | —CN | 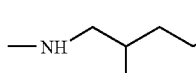 | 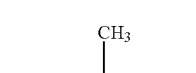 |
| g-(18) | 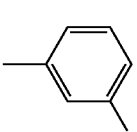 | —H | —CN | —CH₃ | —CN | 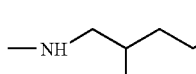 | —NHCH₃ |

| No. | | | | | | |
|---|---|---|---|---|---|---|
| g-(19) | 2-methyl-5-nitro-benzoic acid (COOH, NO2) | —C4H9(t) | —CN | —CH3 —CN | —NH-CH(CH3)CH2CH3 | —NH-CH(CH3)CH2CH3 |
| g-(20) | phenyl | —CH3 | —CN | —CH3 —CN | —NH-CH2CH(OH)CH3 | —NH-CH2CH2N(CH3)2 |
| g-(21) | phenyl | —H | —CN | —CH3 —CN | —NH-CH2CH(OH)CH3 | —NH-CH2CH(OH)CH3 |
| g-(22) | 4-NO2-phenyl | —H | —CN | —CH3 —CN | —NH-CH2CH(OH)CH3 | —NH-CH2CH(OH)CH3 |
| g-(23) | —H | —C4H9(t) | —CN | —CH3 —CN | —NH-CH2CH(OH)CH3 | —NH-CH2CH(OH)CH3 |
| g-(24) | phenyl | —H | —SO2CH3 | —CH3 —CN | —NH-CH(C2H5)C4H9 | —NH-CH(CH3)COOH |
| g-(25) | phenyl | —CH3 | —SO2CH3 | —CH3 —CN | —NH-CH2CH(OH)CH3 | —NH-phenyl |
| g-(26) | 4-NO2-phenyl | —phenyl | —CN | —CH3 —CN | —NH-CH2CH(OCH3)CH3 | —NH-CH2CH2OCH3 |
| g-(27) | 4-NO2-phenyl | —C4H9(t) | —SO2CH3 | —CH3 —CN | —NH-CH2CH(OH)CH3 | —NH-CH2CH(OH)CH3 |
| g-(28) | phenyl | —CH3 | —C(=O)N(CH3)2 | —CH3 —CN | —NH-CH2CH(OH)CH3 | —NH-CH2CH(OH)CH3 |

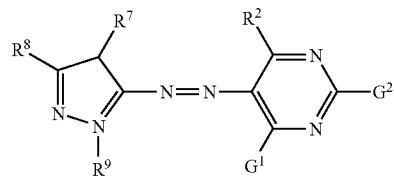

| No. | R9 | R8 | R7 | R2 | G1 | G2 |
|---|---|---|---|---|---|---|
| g-(29) | 4-NO2-phenyl | —C4H9(t) | —CN | —OCH3 | —NH-CH2CH(C2H5)C4H9 | —NHCH3 |
| g-(30) | 4-NO2-phenyl | —C4H9(t) | —CN | —CH3 | —NH-CH2CH(OH)CH3 | —NH-CH2CH(OH)CH3 |

-continued

| | | | | | | | |
|---|---|---|---|---|---|---|---|
| g-(31) | 4-nitrophenyl | —C$_4$H$_9$(t) | —CN | —NH-CH$_2$-CH(OH)-CH$_3$ | —NH-CH$_2$-CH(OH)-CH$_3$ | —NH-CH$_2$-CH(OH)-CH$_3$ | |
| g-(32) | phenyl | —H | —CN | —NH-CH$_2$-CH(OH)-CH$_3$ | —NH-CH$_2$-CH(OH)-CH$_3$ | —NH-CH$_2$-CH(C$_2$H$_5$)-C$_4$H$_9$ | |

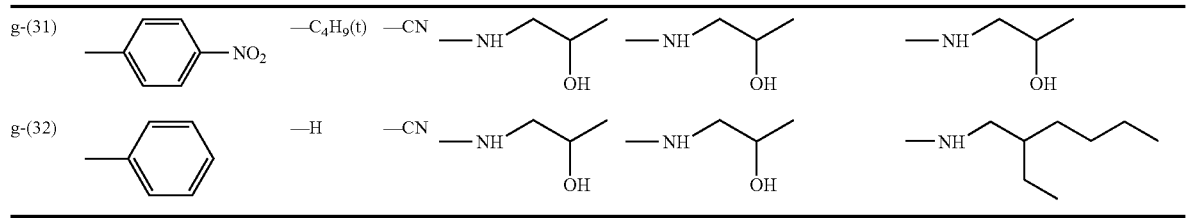

| No. | R$^{18}$ | R$^{19}$ | R$^{20}$ | R$^{2}$ | R$^{1}$ | G$^{1}$ | G$^{2}$ |
|---|---|---|---|---|---|---|---|
| g-(33) | —C$_8$H$_{17}$ | —CN | —CN | —CH$_3$ | —CN | —NH-CH$_2$-CH(OH)-CH$_3$ | —NH-CH$_2$-CH(OH)-CH$_3$ |
| g-(34) | 4-nitrophenyl | —H | —H | —CH$_3$ | —CN | —NH-CH$_2$CH$_2$-O-CH(C$_2$H$_5$)-C$_4$H$_9$ | —NH-CH$_2$CH$_2$-O-CH(C$_2$H$_5$)-C$_4$H$_9$ |
| g-(35) | —CH$_3$ | —CN | —CN | —CH$_3$ | —H | —NH-CH$_2$-CH(OH)-CH$_3$ | —NH-CH(CH$_3$)-C$_2$H$_5$ |
| g-(36) | 4-COOH-3-NO$_2$-phenyl | —CN | —CN | —CH$_3$ | —H | —NH-CH$_2$CH$_2$-OCH$_3$ | —NH-CH$_2$CH$_2$-OCH$_3$ |

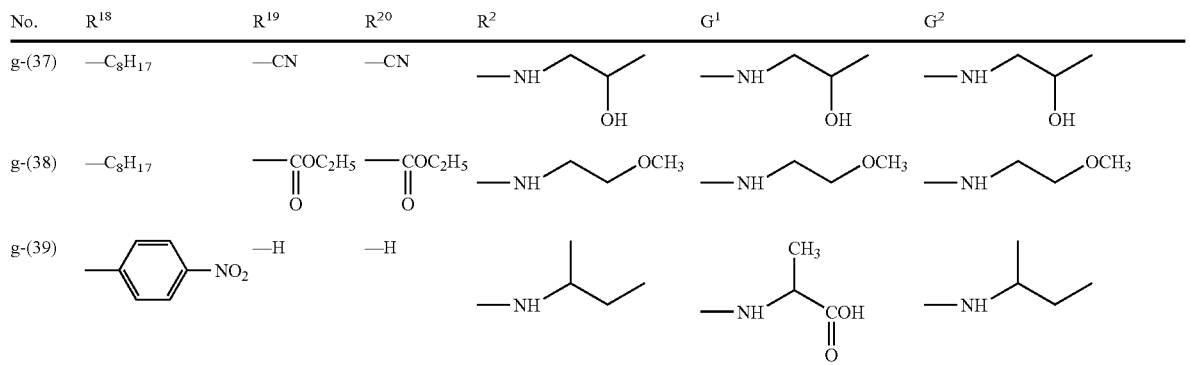

| No. | R$^{18}$ | R$^{19}$ | R$^{20}$ | R$^{2}$ | G$^{1}$ | G$^{2}$ |
|---|---|---|---|---|---|---|
| g-(37) | —C$_8$H$_{17}$ | —CN | —CN | —NH-CH$_2$-CH(OH)-CH$_3$ | —NH-CH$_2$-CH(OH)-CH$_3$ | —NH-CH$_2$-CH(OH)-CH$_3$ |
| g-(38) | —C$_8$H$_{17}$ | —COC$_2$H$_5$ | —COC$_2$H$_5$ | —NH-CH$_2$CH$_2$-OCH$_3$ | —NH-CH$_2$CH$_2$-OCH$_3$ | —NH-CH$_2$CH$_2$-OCH$_3$ |
| g-(39) | 4-nitrophenyl | —H | —H | —NH-CH(CH$_3$)-C$_2$H$_5$ | —NH-CH(CH$_3$)-COOH | —NH-CH(CH$_3$)-C$_2$H$_5$ |

-continued

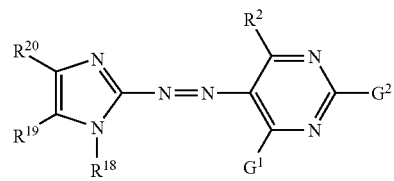

| No. | R¹⁸ | R¹⁹ | R²⁰ | R² | G¹ | G² |
|---|---|---|---|---|---|---|
| g-(40) | —CH₂COOH | —CN | —CN | —NH-CH₂CH₂-OCH₃ | —NH-CH₂CH₂-OCH₃ | —NH-CH₂-CH(C₂H₅)-C₄H₉ |

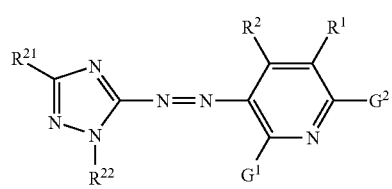

| No. | R²² | R²¹ | R² | R¹ | G¹ | G² |
|---|---|---|---|---|---|---|
| g-(41) | 4-NO₂-C₆H₄— | —H | —CH₃ | —CN | —NH-CH₂-CH(C₂H₅)-C₄H₉ | —NH-CH₂-CH(C₂H₅)-C₄H₉ |
| g-(42) | 2-NO₂-C₆H₄— | —H | —CH₃ | —CN | —NH-CH₂CH₂-O-CH₂-CH(C₂H₅)-C₄H₉ | —NH-CH₂CH₂-O-CH₂-CH(C₂H₅)-C₄H₉ |
| g-(43) | 4-NO₂-C₆H₄— | —H | —CH₃ | —CN | —NH-CH₂CH₂-O-CH₂-CH(C₂H₅)-C₄H₉ | —NH-CH₂CH₂-O-CH₂-CH(C₂H₅)-C₄H₉ |
| g-(44) | 4-NO₂-C₆H₄— | —CH₃ | —CH₃ | —CN | —NH-CH₂-CH(OH)-CH₃ | —NH-CH(CH₃)-CH₂-OH |
| g-(45) | 4-NO₂-C₆H₄— | —C₆H₅ | —CH₃ | —H | —NH-CH(CH₃)-COOH | —NH-CH(CH₃)-C₂H₅ |
| g-(46) | 4-NO₂-C₆H₄— | —H | —CH₃ | —CN | —NH-CH(CH₃)-CH₂OH | —NH-CH₂CH₂-N(CH₃)₂ |

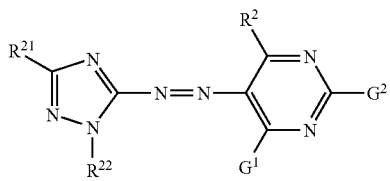

| No. | R²² | R²¹ | R² | G¹ | G² |
|---|---|---|---|---|---|
| g-(47) | phenyl | —H | —NH-CH₂-CH(OH)-CH₃ | —NH-CH₂-CH(OH)-CH₃ | —NH-CH₂-CH(OH)-CH₃ |
| g-(48) | 4-NO₂-phenyl | —H | —NH-CH₂-CH(OH)-CH₃ | —NH-CH₂-CH(OH)-CH₃ | —NH-CH(CH₃)-CH₂-CH₃ |
| g-(49) | 4-NO₂-phenyl | —CH₃ | —NH-CH₂-CH(OCH₃)-CH₃ | —NH-CH₂-CH(OCH₃)-CH₃ | —NH-CH₂-CH(OCH₃)-CH₃ |
| g-(50) | 2-Cl-4-NO₂-phenyl | —H | —NH-CH₂-CH(OCH₃)-CH₃ | —NH-CH₂-CH(OCH₃)-CH₃ | —NH-CH(CH₃)-COOH |

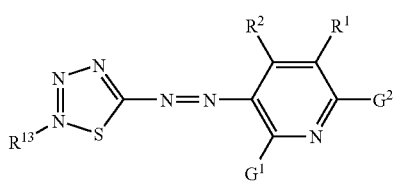

| No. | R¹³ | R² | R¹ | G¹ | G² |
|---|---|---|---|---|---|
| g-(51) | —H | —CH₃ | —CN | —NH-CH₂-CH(C₂H₅)-C₄H₉ | —NH-CH₂-CH(C₂H₅)-C₄H₉ |
| g-(52) | —CH₃ | —CH₃ | —CN | —NH-CH₂-CH(C₂H₅)-C₄H₉ | —NH-CH₂-CH(OH)-CH₃ |
| g-(53) | —H | —CH₃ | —CN | —NH-CH₂-CH(C₂H₅)-C₄H₉ | —NH-CH(CH₃)-COOH |
| g-(54) | —CH₃ | —CH₃ | —CN | —NH-CH₂-CH₂-CH₂-O-CH₂-CH(C₂H₅)-C₄H₉ | —NH-CH₂-CH₂-CH₂-O-CH₂-CH(C₂H₅)-C₄H₉ |

-continued
g-(55) 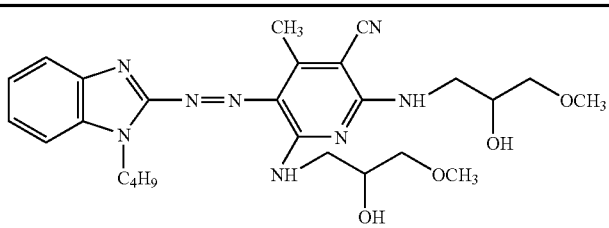
g-(56) 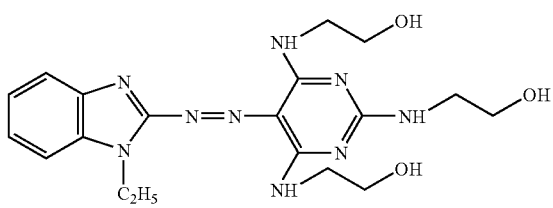
g-(57) 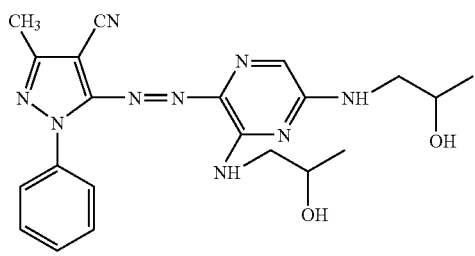
g-(58) 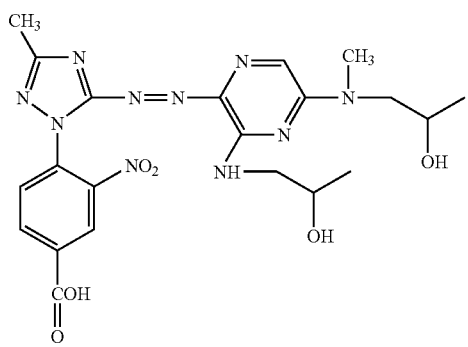
g-(59) 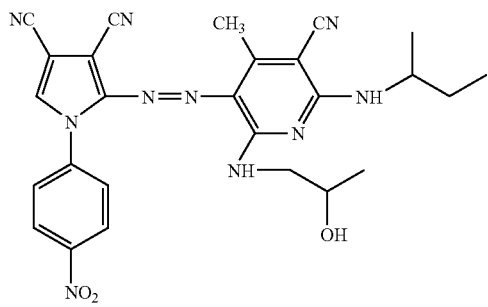
g-(60) 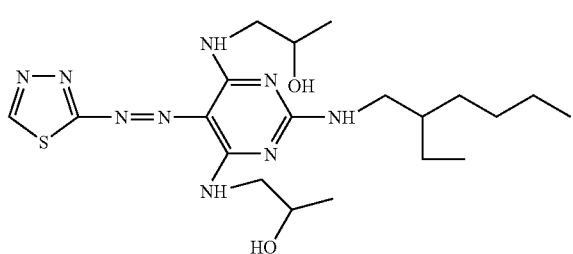

-continued
g-(61) 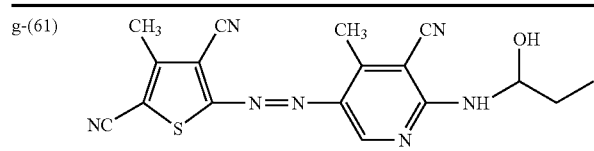
g-(62) 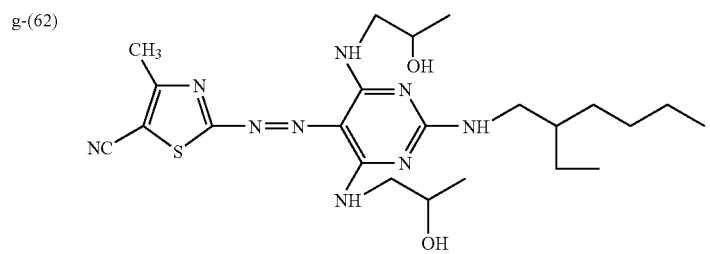
g-(63) 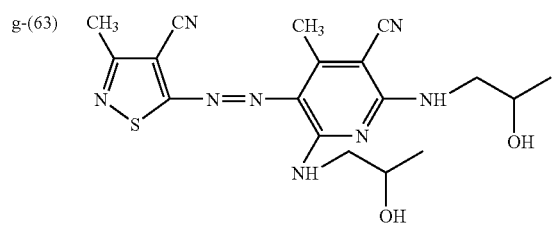
g-(64) 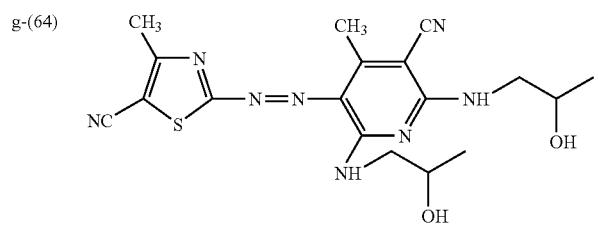
g-(65) 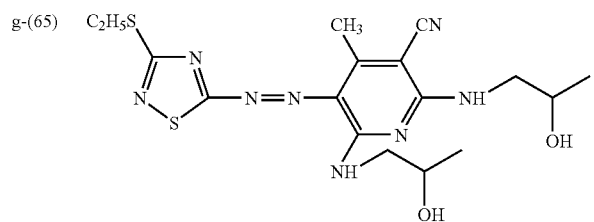
g-(66) 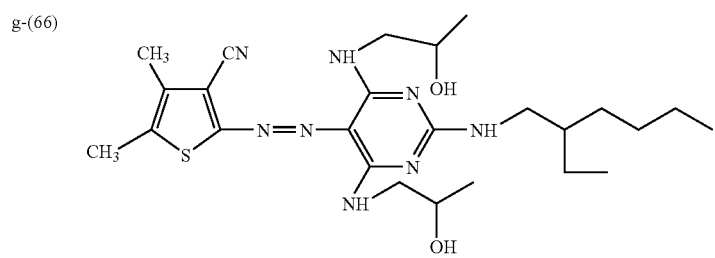
g-(67) 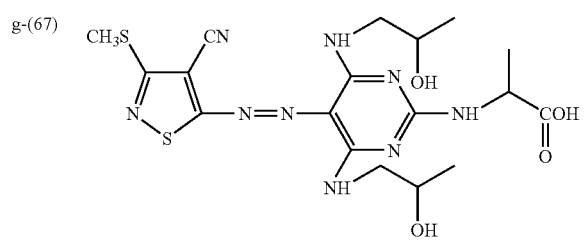

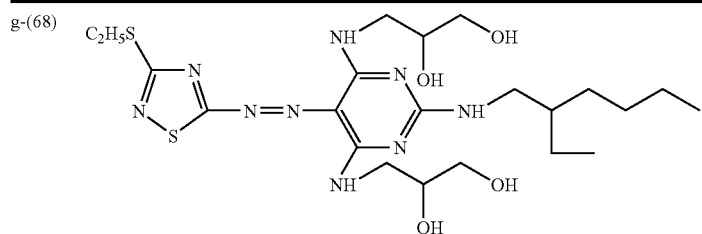
In the following, synthesis examples of the dyes represented by the formula (2) will be explained in detail.
Synthesis of Example Compound a-1
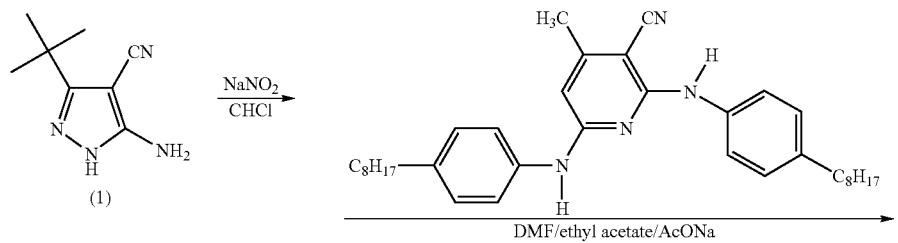
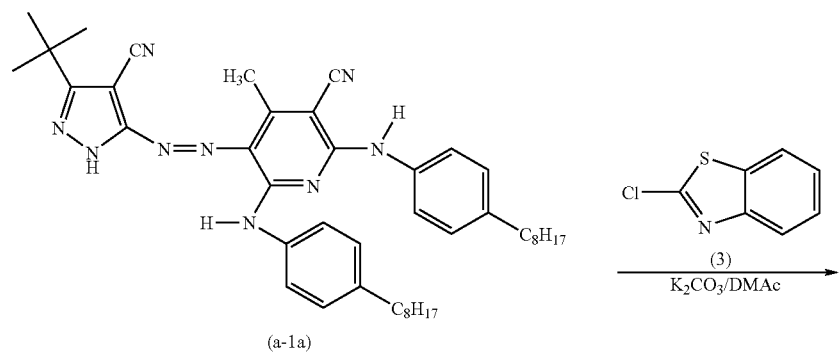
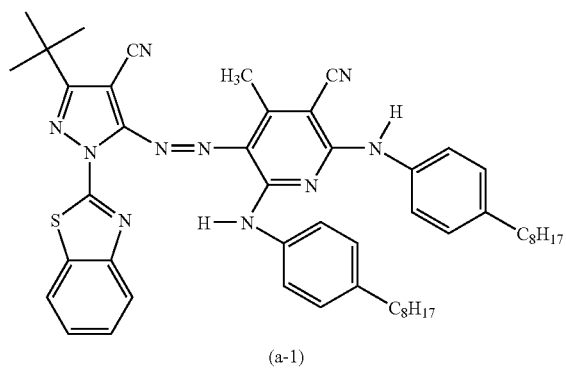

Synthesis of Intermediate (a-1a)

8 g (48.7 mmol) of 5-amino-3-tert-butyl-4-cyanopyrazole (1), 15 ml of concentrated hydrochloric acid and 50 ml of water were agitated at an internal temperature of 5° C., and 3.36 g (48.7 mmol) of sodium nitrite were added in divided portions for 10 minutes. After an agitation for 10 minutes, 21.3 g (40.6 mmol) of a coupling component (2), 50 g of sodium acetate (AcONa), 50 ml of dimethylformamide (DMF) and 50 ml of ethyl acetate were added and agitated. Thereafter, a diazonium salt, cooled to an internal temperature of 5° C. in a three-necked flask was added over 10 minutes. After the addition of the diazonium salt, the reaction liquid was agitated for 30 minutes. 300 ml of a saturated aqueous solution of sodium chloride were added, and prepitated crystals [intermediate (a-1a)] were separated by filtration, with an amount of 24.2 g and an yield of 85%.

Synthesis of Example Compound a-1

To 14.0 g (20 mmol) of the obtained intermediate (a-1a), there were added 4.4 g (26 mmol) of a heterylation agent (3), 2.8 g of potassium carbonate and 50 ml of dimethylacetamide (DMAc) were added, and the mixture was heated under agitation at 100° C. for 1 hour. After the reaction, the mixture was cooled to the room temperature and 200 ml of a saturated aqueous solution of sodium chloride were added. Precipitated crude crystals [example compound a-1] were separated by filtration and recrystallized from acetonitrile to obtain an amount of 16.7 g and an yield of 80%. The synthesized crude crystals (example compound a-1) had a maximum absorption wavelength λmax of 545 nm (in DMF) and m/z (positive)= 834.

Synthesis of Example Compound b-1

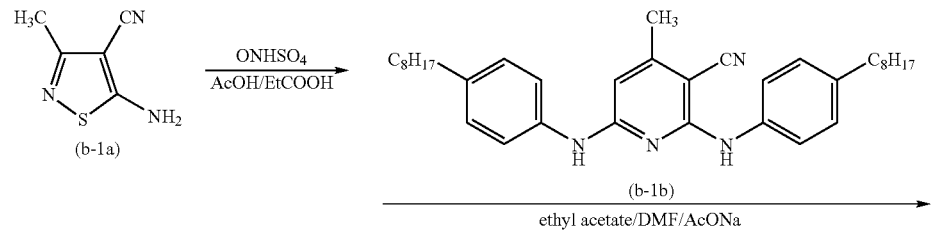

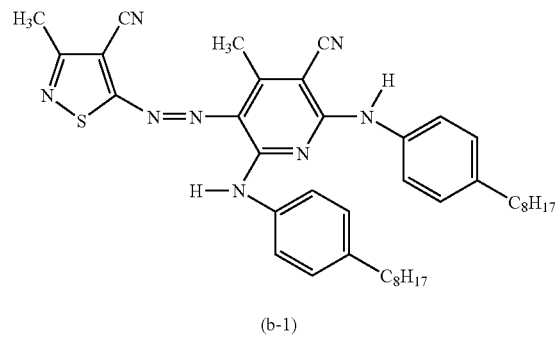

(b-1)

1 g of a compound (b-1a) was dispersed in 3.8 ml of a mixed solvent of acetic acid/propionic acid=2/3 (v/v), then, after cooling to 0° C., 2.21 g of nitrosylsulfuric acid (41% solution) were gradually added and the mixture was agitated for 1 hour to obtain a diazo solution. Separately, 1.05 g of a compound (b-1b) were dissolved in a mixture of 14 ml of dimethylformamide and 6 ml of ethyl acetate, then 2.5 g of sodium acetate were added and the mixture was cooled to 0° C. to obtain a suspension. The aforementioned diazo solution was dropwise added to thus obtained suspension and a reaction was conducted for 2 hours after the dropwise addition was terminated. After the reaction, water was added to precipitate crystals, which were separated by filtration and purified by silica gel column chromatography to obtain 750 mg of crystals [example compound b-1] with a yield of 57.7%, showing a maximum absorption wavelength λmax of 545 nm.

Synthesis of Example Compound b-6

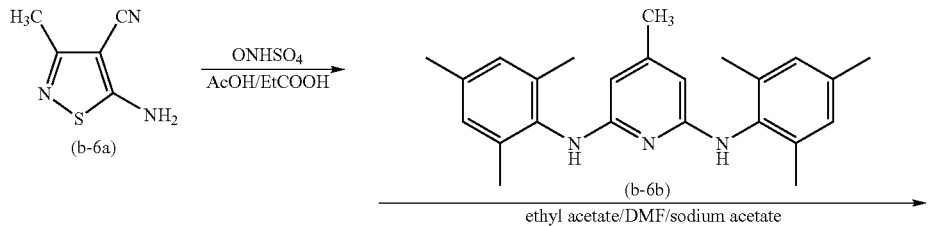

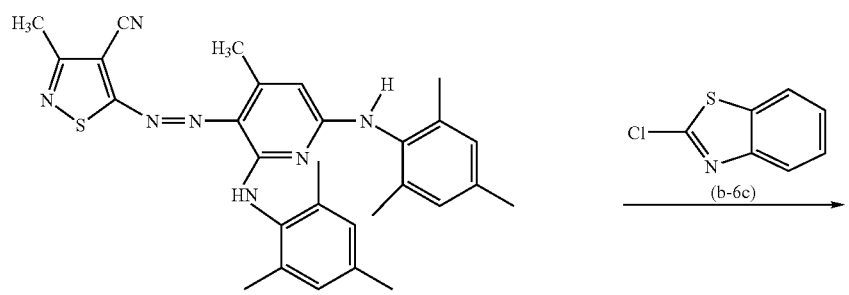

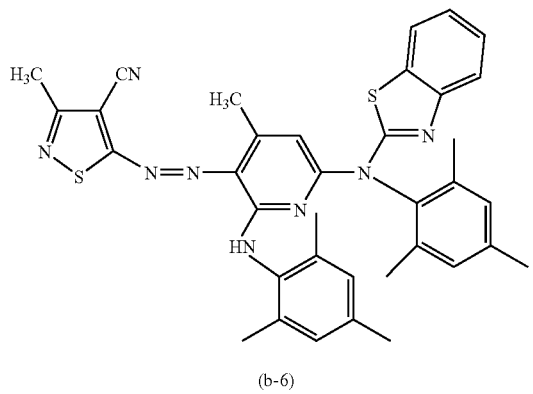

1 g of a compound (b-6a) was dispersed in 3.8 ml of a mixed solvent of acetic acid/propionic acid=2/3 (v/v), then, after cooling to 0° C., 2.21 g of nitrosylsulfuric acid (41% solution) were gradually added and the mixture was agitated for 1 hour to obtain a diazo solution. Separately, 1 g of a compound (b-6b) was dissolved in a mixture of 15 ml of dimethylformamide and 5 ml of ethyl acetate, then 2.5 g of sodium acetate were added and the mixture was cooled to 0° C. to obtain a suspension. The aforementioned diazo solution was gradually added dropwise to thus obtained suspension and a reaction was conducted for 2 hours after the dropwise addition was terminated. After the reaction, water was added to precipitate crystals, which were separated by filtration to obtain crude crystals. The crude crystals were dissolved in 10 ml of dimethylformamide, then added with 560 mg of potassium carbonate and 1.3 g of 2-chlorobenzothiazole (b-6c) and the mixture was reacted at 110° C. for 1 hour. After the reaction, water was added, and precipitated crude crystals were separated by filtration and purified by silica gel column chromatography to obtain 700 mg of crystals [example compound b-6] with a yield of 58.6%, showing a maximum absorption wavelength λmax of 550 nm.

-Dye Represented by Formula (3)-

A dye represented by the following formula (3) (dye of the invention) also has a satisfactory color hue, shows an excellent stability without precipitation in time in a state of a liquid preparation or a coated film, and shows resistances to heat and light. In the following, the dye represented by the formula (3) will be explained in detail.

In the formula (3), the aliphatic group may be non-substituted or may have a substituent, also may be saturated or non-saturated, and preferably has 1 to 20 carbon atoms. Examples include a methyl group, an ethyl group, a vinyl group, an allyl group, an ethinyl group, an isopropenyl group and a 2-ethylhexyl group.

In the formula (3), a sulfamoyl group may be non-substituted or may have a substituent, and preferably has 0 to 20 carbon atoms in total. Examples include an N-methylsulfamoyl group, an N,N-diethylsulfamoyl group, an N-allylsulfamoyl group and an N-arylsulfamoyl group.

In the formula (3), the substituent is preferably a group cited before as the substituent for the formula (1), and is preferably an aliphatic group, an acylamino group, a carboxyl group, an aliphatic oxy group, an aliphatic oxycarbonyl group, a carbamoyl group, a sulfo group, or a sulfamoyl group.

The dye represented by the formula (3) may be a salt, in case a carboxyl group or a sulfo group is present, for example an alkali metal salt such as a sodium salt or a potassium salt, or an organic salt such as of triethylamine.

In the following, there will be shown specific examples (example compounds H-1 to H-5) of the dye represented by the formula (3) (dye of the invention). However, the invention is not limited to such examples.

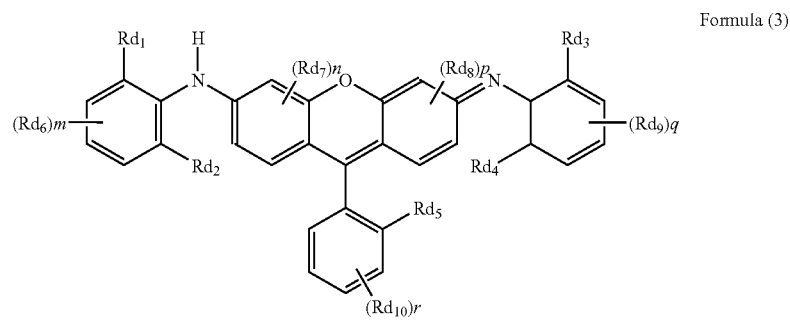

Formula (3)

In the formula (3), $Rd_1$, $Rd_2$, $Rd_3$ and $Rd_4$ each independently represents a hydrogen atom or an aliphatic group; $Rd_5$ independently represents a sulfo group or a sulfamoyl group; $Rd_6$, $Rd_7$, $Rd_8$, $Rd_9$ and $Rd_{10}$ each independently represents a substituent; m, n, p and q each represents an integer of 0 to 3; and r represents an integer of 0 to 4.

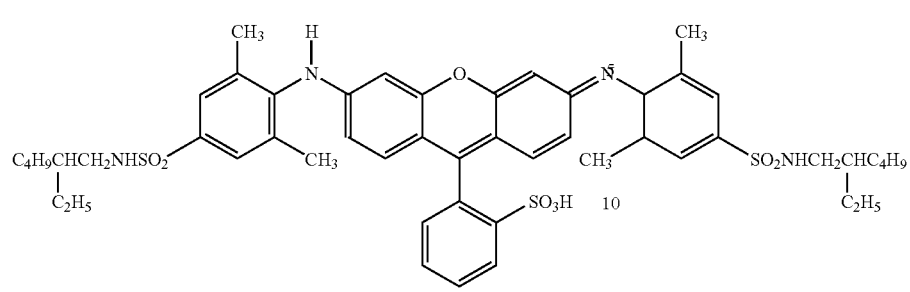
(H-1)
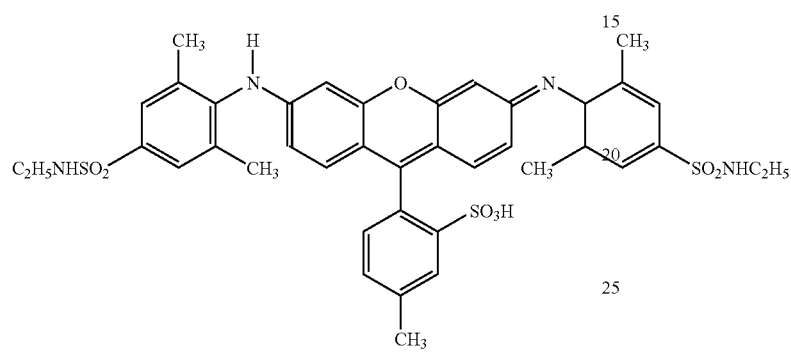
(H-2)
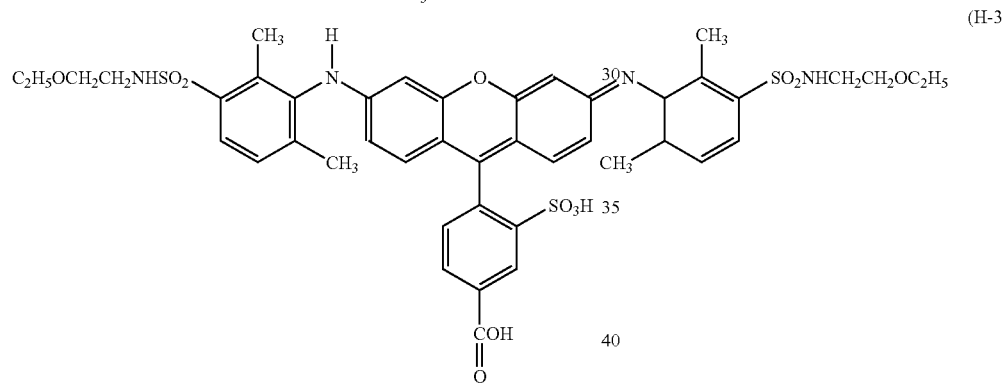
(H-3)
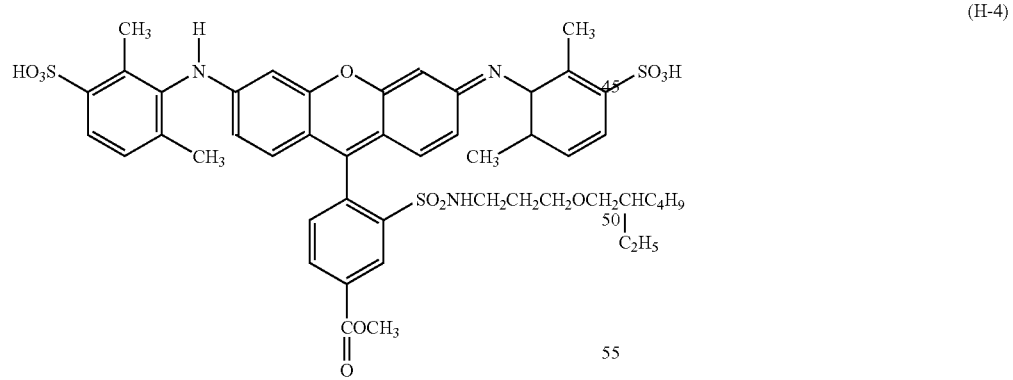
(H-4)
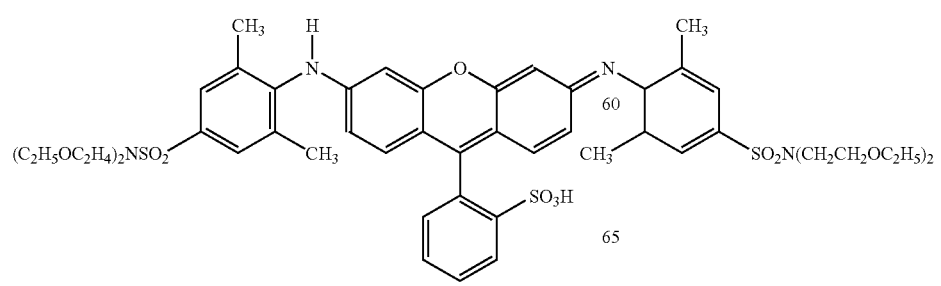
(H-5)

Among the foregoing, for effectively exhibiting the effects of the invention, there is more preferred an embodiment constituted of a combination of at least one of the dyes represented by the formula (1) and at least one of the dyes represented by the formula (2). Also the aforementioned dye of the invention may be used in combination with another acidic dye, a salt of another acidic dye and a metal or a nitrogen-containing compound, or a derivative of another acidic dye.

A concentration of the dye of the invention in the colored curable composition is variable depending on a molecular weight and a molar absorption coefficient, however is preferably 0.5 to 80% by mass with respect to the total solid in the composition, more preferably 0.5 to 60% by mass and particularly preferably 0.5 to 50% by mass.

-Binder-

The colored curable composition of the invention may contain at least one kind of binder. The binder according to the invention is not particularly limited as long as it is alkali-soluble, and is preferably selected in consideration of heat resistance, developing property, and availability.

The alkali soluble resin is preferably a linear organic polymer that is soluble in an organic solvent and developable with a weak alkali aqueous solution. Examples of the linear organic polymer include a polymer having a carboxylic acid on a side chain, such as a methacrylic acid copolymer, an acrylic acid copolymer, an itaconic acid copolymer, a crotonic acid copolymer, a maleic acid copolymer and a partially esterified maleic acid copolymer, described, for example, in JP-A No. 59-44615, JP-B Nos. 54-34327, 58-12577 and 54-25957, and JP-A Nos. 59-53836 and 59-71048, and also, an acidic cellulose derivative having a carboxylic acid on a side chain is useful.

In addition to the foregoing, a polymer obtained by adding an acid anhydride to a polymer having a hydroxyl group, a polyhydroxystyrene resin, a polysiloxane resin, poly(2-hydroxyethyl(meth)acrylate), polyvinylpyrrolidone, polyethyleneoxide and polyvinyl alcohol are also useful.

A monomer having a hydrophilic group may be copolymerized, and examples thereof include alkoxyalkyl(meth)acrylate, hydroxyalkyl(meth)acrylate, glycerol (meth)acrylate, (meth)acrylamide, N-methylolacrylamide, secondary or tertiary alkylacrylamide, dialkylaminoalkyl(meth)acrylate, morpholine(meth)acrylate, N-vinylpyrrolidone, N-vinylcaprolactam, vinylimidazole, vinyltriazole, methyl (meth)acrylate, ethyl(meth)acrylate, branched or linear propyl(meth)acrylate, branched or linear butyl(meth)acrylate and phenoxyhydroxypropyl(meth)acrylate.

Furthermore, a monomer having a tetrahydrofurfuryl group, phosphoric acid, a phosphate ester, a quaternary ammonium salt, an ethyleneoxy chain, a propyleneoxy chain, sulfonic acid or a salt thereof, or a morpholinoethyl group is also useful as the monomer having a hydrophilic group.

A polymerizable group may be present on the side chain thereof for improving the crosslinking efficiency, and a polymer having an allyl group, a (meth)acryl group or an allyloxyalkyl group is also useful. In order to improve the strength of the cured film, alcohol soluble nylon and a polyether of 2,2-bis(4-hydroxyphenyl)propane and epichlorohydrin are useful.

Among these various kinds of binders, a polyhydroxystyrene resin, a polysiloxane resin, an acrylic resin, an acrylamide resin and an acrylic-acrylamide copolymer resin are preferred from the standpoint of heat resistance, and an acrylic resin, an acrylamide resin and an acrylic/acrylamide copolymer resin are preferred from the standpoint of controllability of developing property.

Examples of the acrylic resin include a copolymer of a monomer selected from benzyl(meth)acrylate, (meth)acrylic acid, hydroxyethyl(meth)acrylate, (meth)acrylamide and ally (meth)acrylate, and KS resist 106 (manufactured by Osaka Organic Chemical Industry Co., Ltd.); Cyclomer P (manufactured by Daicel Chem. Ind., Ltd.)

An alkali soluble phenol resin is also useful. Examples of an alkali soluble resin having a phenolic hydroxyl group include a polyhydroxystyrene resin. Specific examples thereof include a p-hydroxystyrene resin, a m-hydroxystyrene resin, an o-hydroxystyrene resin, a copolymer thereof, a copolymer of hydroxystyrene and styrene, a copolymer of hydroxystyrene and acetoxystyrene, and a copolymer of hydroxystyrene and the aforementioned (meth)acrylic monomer.

A novolak resin and a vinyl polymer are also exemplified.

Examples of the novolak resin include those obtained by condensing a phenol compound and an aldehyde compound in the presence of an acid catalyst. Examples of the phenol compound include phenol, cresol, ethylphenol, propylphenol, butylphenol, xylenol, phenylphenol, catechol, resorcinol, pyrogallol, naphthol and bisphenol A. These phenol compounds may be used solely or in combination of two or more kinds of them. Examples of the aldehyde compound include formaldehyde, paraformaldehyde, acetaldehyde, propionaldehyde and benzaldehyde.

Specific examples of the novolak resin include a condensed product of m-cresol, p-cresol or a mixture thereof with formalin.

The novolac resin may be regulated in the molecular distribution for example by a classification. Also a low-molecular component having a phenolic hydroxyl group such as bisphenol-C or bisphenol-A may be mixed with the novolac resin.

The binder is preferably a polymer having a number average molecular weight Mn (polystyrene conversion value measured with GPC) of 1,000 to $2 \times 10^5$, more preferably a polymer having Mn of 2,000 to $1 \times 10^5$, and particularly preferably a polymer having Mn of 4,000 to $5 \times 10^4$.

The content of the binder in the colored curable composition is preferably from 10 to 90% by mass, more preferably from 20 to 80% by mass, and particularly preferably from 30 to 70% by mass, based on the total solid content (by mass) of the composition.

Crosslinking Agent

The invention employs the aforementioned dye of the invention to achieve a more advanced film curing reaction than in the prior art, thereby obtaining a film of a satisfactory curability, but it is also possible to employ an auxiliary crosslinking agent to obtain a further highly cured film.

Therefore, the crosslinking agent used in the invention is not particularly limited as far as it is capable of exerting film curing through crosslinking and polymerization, and examples thereof include (a) an epoxy resin, (b) a melamine compound, a guanamine compound, a glycoluril compound or an urea compound having been substituted with at least one substituent selected from a methylol group, an alkoxymethyl group and an acyloxymethyl group, (c) a phenol compound, a naphthol compound or a hydroxyanthracene compound having been substituted with at least one substituent selected from a methylol group, an alkoxymethyl group and an acyloxymethyl group. The crosslinking agent is preferably a multifunctional epoxy resin.

The epoxy resin (a) may be any compound that has an epoxy group and crosslinking property, and examples thereof include a divalent glycidyl group-containing low molecular weight compound, such as bisphenol A glycidyl ether, ethylene glycol diglycidyl ether, butanediol diglycidyl ether, hexanediol diglycidyl ether, dihydroxybiphenyl diglycidyl ether, diglycidyl phthalate and N,N-diglycidylaniline, a trivalent glycidyl group-containing low molecular weight compound, such as trimethylolpropane triglycidyl ether, trimethylolphenol triglycidyl ether and Tris P-PA (trisphenol P-PA) triglycidyl ether, a tetravalent glycidyl group-containing low molecular weight compound, such as pentaerythritol tetraglycidyl ether and tetramethylolbisphenol A tetraglycidyl ether, a polyvalent glycidyl group-containing low molecular weight compound, such as dipentaerythritol pentaglycidyl ether and dipentaerythritol hexaglycidyl ether, and a glycidyl group-containing polymer compound, such as polyglycidyl (meth)acrylate and a 1,2-epoxy-4-(2-oxiranyl)cyclohexane adduct of 2,2-bis(hydroxymethyl)-1-butanol.

The number of a methylol group, an alkoxymethyl group and an acyloxymethyl group contained in and substituted on the crosslinking agent (b) is generally from 2 to 6 in the case of the melamine compound and from 2 to 4 in the case of the glycoluril compound, the guanamine compound and the urea compound, and is preferably from 5 to 6 in the case of the melamine compound and from 3 to 4 in the case of the glycoluril compound, the guanamine compound and the urea compound.

The melamine compound, the guanamine compound, the glycoluril compound and the urea compound are referred to as a compound (a methylol group-containing compound, an alkoxymethyl group-containing compound or an acyloxymethyl group-containing compound) of the category (b).

The methylol group-containing compound of the category (b) can be obtained by heating an alkoxymethyl group-containing compound in an alcohol in the presence of an acid catalyst, such as hydrochloric acid, sulfuric acid, nitric acid and methanesulfonic acid. The acyloxymethyl group-containing compound of the category (b) can be obtained by mixing and stirring a methylol group-containing compound with an acyl chloride in the presence of a basic catalyst.

Specific examples of the compounds of the category (b) having the aforementioned substituent are shown below.

Examples of the melamine compound include hexamethylolmelamine, hexamethoxymethylmelamine, a compound obtained by methoxymethylating from 1 to 5 methylol groups of hexamethylolmelamine or a mixture thereof, hexamethoxyethylmelamine, hexaacyloxymethylmelamine, and a compound obtained by acyloxymethlating from 1 to 5 methylol groups of hexamethylolmelamine or a mixture thereof.

Examples of the guanamine compound include tetramethylolguanamine, tetramethoxymethylguanamine, a compound obtained by methoxymethylating from 1 to 3 methylol groups of tetramethylolguanamine or a mixture thereof, tetramethoxyethylguanamine, tetraacyloxymethylguanamine, and a compound obtained by acyloxymethylating from 1 to 3 methylol groups of tetramethylolguanamine or a mixture thereof.

Examples of the glycoluril compound include tetramethylolglycoluril, tetramethoxymethylglycoluril, a compound obtained by methoxymethylating from 1 to 3 methylol groups of tetramethylolglycoluril or a mixture thereof, and a compound obtained by acyloxymethylating from 1 to 3 methylol groups of tetramethylolglycoluril or a mixture thereof.

Examples of the urea compound include tetramethylolurea, tetramethoxymethylurea, a compound obtained by methoxymethylating from 1 to 3 methylol groups of tetramethylolurea or a mixture thereof, and tetramethoxyethylurea.

The compounds of the category (b) may be used solely or in combination thereof.

The crosslinking agent (c), i.e., a phenol compound, a naphthol compound or a hydroxyanthracene compound having been substituted with at least one substituent selected from a methylol group, an alkoxymethyl group and an acyloxymethyl group, exerts thermal crosslinking as similar to the crosslinking agent (b), so as to suppress intermixing with a photoresist as an upper layer and to improve the film strength. These compounds are sometimes referred to as a compound of the category (c) (a methylol group-containing compound, an alkoxymethyl group-containing compound or an acyloxymethyl group-containing compound).

The number of a methylol group, an alkoxymethyl group and an acyloxymethyl group contained in the crosslinking agent (c) is necessarily at least 2 per one molecule, and a compound having a phenol compound skeleton, all the 2-position and the 4-position of which have been substituted, is preferred from the standpoint of thermal crosslinking property and storage stability. Furthermore, a compound having a naphthol compound skeleton or a hydroxyanthracene compound skeleton, all the oppositions and the p-positions of which with respect to the hydroxyl group have been substituted, is also preferred. The 3-position or the 5-position of the phenol compound may either be unsubstituted or have a substituent, and in the naphthol compound, other positions than the oppositions with respect to the hydroxyl group may either be unsubstituted or have a substituent.

The methylol group-containing compound of the category (c) can be obtained by using a phenolic hydroxyl group-containing compound whose 2- or 4-position of the phenolic hydroxyl group is a hydrogen atom as a raw material and reacting it with formalin in the presence of a basic catalyst, such as sodium hydroxide, potassium hydroxide, ammonia and tetraalkylammonium hydroxide. The alkoxymethyl group-containing compound of the category (c) can be obtained by heating the methylol group-containing compound of the category (c) in an alcohol in the presence of an acid catalyst, such as hydrochloric acid, sulfuric acid, nitric acid and methanesulfonic acid. The acyloxymethyl group-containing compound of the category (c) can be obtained by reacting the methylol group-containing compound of the category (c) with an acyl chloride in the presence of a basic catalyst.

Examples of the skeleton compound of the crosslinking agent (c) include a phenol compound, a naphthol compound and a hydroxyanthracene compound, in which the oppositions and the p-positions of the phenolic hydroxyl group are unsubstituted, and examples thereof include phenol, isomers of cresol, 2,3-xylenol, 2,5-xylenol, 3,4-xylenol, 3,5-xylenol, a bisphenol compound, such as bisphenol A, 4,4'-bishydroxybiphenyl, Tris P-PA (produced by Honshu Chemical Industry Co., Ltd.), naphthol, dihydroxynaphthalene and 2,7-dihydroxyanthracene.

As specific examples of the crosslinking agent (c), examples of the phenol compound include trimethylolphenol, tri(methoxymethyl)phenol, a compound obtained by methoxymethylating from 1 to 2 methylol groups of trimethylolphenol, trimethylol-3-cresol, tri(methoxymethyl)-3-cresol, a compound obtained by methoxymethylating from 1 to 2 methylol groups of trimethylol-3-cresol, a dimethylol-cresol, such as 2,6-dimethylol-4-cresol, tetramethylolbisophenol A, tetramethoxymethylbisphenol A, a compound obtained by methoxymethlating from 1 to 3 methylol groups of tetramethylolbisphenol A, tetramethylol-4,4'-bishydroxybiphenyl, tetramethoxymethyl-4,4'-bishydroxybiphenyl, a hexamethylol compound of Tris P-PA, a hexamethoxymethyl compound of Tris P-PA, a compound obtained by methoxymethylating from 1 to 5 methylol groups of a hexamethylol compound of Tris P-PA, and bishydroxymethylnaphthalenediol.

Examples of the hydroxyanthracene compound include 1,6-dihydroxymethyl-2,7-dihydroxyanthracene, and examples of the acyloxymethyl group-containing compound include compounds obtained by acyloxymethylating a part or all of the methylol groups of the methylol group-containing compounds.

Preferred examples among these compounds include trimethylolphenol, bishydroxymethyl-p-cresol, tetramethylolbisphenol A, a hexamethylol compound of Tris P-PA (produced by Honshu Chemical Industry Co., Ltd.), and phenol compounds obtained by substituting the methylol groups of these compounds with an alkoxymethyl group and both a methylol group and an alkoxymethyl group.

The compound of the category (c) may be used solely or in combination thereof.

The total content of the crosslinking agents (a) to (c) in the colored curable composition is, while it varies depending on the material thereof, preferably from 1 to 70% by mass, more preferably from 5 to 50% by mass, and particularly preferably from 7 to 30% by mass, based on the solid content of the composition.

Polymerizable Monomer

The colored curable composition of the invention can be constituted advantageously by including at least a polymerizable monomer. The polymerizable monomer is included principally in case of forming a colored curable composition of negative-type. It can also be included together with a photopolymerization initiator to be explained later, in case of a positive-type system containing a naphthoquinone diazide compound to be explained later, and, in such case, can further advance the curing degree of a formed pattern. In the following, the polymerizable monomer will be explained.

The polymerizable monomer is preferably a compound having at least one addition polymerizable ethylene group and having a boiling point of 100° C. or more at atmospheric pressure. Examples of the monomer include monofunctional acrylate and methacrylate such as polyethyleneglycol mono (meth)acrylate, polypropyleneglycol mono(meth)acrylate, phenoxyethyl(meth)acrylate; (meth)acrylate compounds prepared after an addition reaction of ethylene oxide or propylene oxide to polyfunctional alcohols such as polyethyleneglycol di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanulate, glycerine and trimethylolethane; urethane acrylates described in JP-B Nos. 48-41708 and 506034, and JP-A No. 51-37193; polyester acrylates described in JP-A No. 4864183 and JP-B No. 49-43191 and 52-30490; polyfunctional acrylate and methacrylate of epoxyacrylate as a reaction product of an epoxy resin and (meth)acrylic acid; and mixtures thereof. The compounds described in Nihon Secchaku Kyokai-shi Vol. 20, No. 7, pp. 300-308 as a photocurable monomer and an oligomer are also included in the compounds of the invention.

The content of the monomer in the colored curable composition is preferably 0.1 to 90% by mass, more preferably 1.0 to 80% by mass, and particularly 2.0 to 70% by mass relative to the solid content of the composition. When the content of the monomer is 0.1 to 90% by mass, curability and development performance of the composition of the invention is improved.

Photopolymerization Initiator

Radiation-Sensitive Compound

The colored curable composition of the invention can be constituted advantageously by containing at least a radiation-sensitive compound. The radiation-sensitive compound of the invention can cause a chemical reaction such as a radical generation, an acid generation or a base generation in response to a radiation such as an UV light, a deep UV light, a visible light, an infrared light or an electron beam, and is used for the purpose of insolubilizing the binder by a reaction such as a crosslinking, a polymerization and a decomposition of an acidic group and causing a polymerization of a polymerizable monomer or an oligomer present in a coated film or a crosslinking of a crosslinking agent, thereby insolubilizing the coated film in an alkaline developing solution.

The colored curable composition, in case constituted as a negative-type, preferably includes a photopolymerization initiator, and, in case constituted as a positive-type, preferably includes a naphthoquinone diazide compound.

Photopolymerization Initiator and Others

At first there will be explained a photopolymerization initiator suitable for constituting a negative-type system. The photopolymerization initiator is not particularly restricted as long as it can cause a polymerization of the polymerizable monomer (monomer having a polymerizable group), and is preferably selected in consideration of characteristics, an initiation efficiency, an absorption wavelength, an availability, a cost and the like. It may be further added to a positive-type system containing the naphthoquinone diazide compound, and, in such case, can further advance the curing degree of the formed pattern.

Examples of the photopolymerization initiator include at least an active halogenated compound selected from halomethyloxadiazole compounds and halomethyl-s-triazine compounds, a 3-aryl-substituted coumarin compound, a lophine dimmer, a benzophenone compound, an acetophenone compound and a derivative thereof, a cyclopentadiene-benzene-iron complex and a salt thereof, and an oxime compound.

Examples of the active halogen compound as the halomethyloxadiazole compound include 2-halomethyl-5-vinyl-1,3,4-oxadiazole compound described in JP-B No. 57-6096, 2-trichloromethyl-5-styryl-1,3,4-oxadiazole, 2-trichloromethyl-5-(p-cyanostyryl)-1,3,4-oxadiazole and 2-trichloromethyl-5-(p-methoxystyryl)-1,3,4-oxadiazole.

Examples of the active halogen compound as the halomethyl-s-triazine compound include a vinylhalomethyl-s-triazine compound described in JP-B No. 59-1281, and a 2-(naphtho-1-yl)-4,6-bishalomethyl-s-triazine compound and a 4-(p-aminophenyl)-2,6-dihalomethyl-s-triazine compound described in JP-A No. 53-133428.

Specific examples thereof include 2,4-bis(trichloromethyl)-6-p-methoxystyryl-s-triazine, 2,6-bis(trichloromethyl)-43,4-methylenedioxyphenyl)-1,3,5-triazine, 2,6-bis(trichloromethyl)-4-(4-methoxyphenyl)-1,3,5-triazine, 2,4-bis(trichloromethyl)-1-p-dimethylaminophenyl-1,3-butadienyl)-s-triazine, 2-trichloromethyl-4-amino-6-p-methoxystyryl-s-triazine, 2-(naphtho-1-yl)-4,6-bistrichloromethyl-s-triazine, 24-methoxynapho-1-yl)-4,6-bistrichloromethyl-s-triazine, 2-(4-ethoxynaphto-1-yl)-4,6-bistrichloromethyl-s-triazine, 2-(4-butoxynaphto-1-yl)-4,6-bistrichloromethyl-s-triazine, 2-(4-(2-methoxyethyl)-naphtho-1-yl)-4,6-bistrichloromethyl-s-triazine, 242-ethoxyethyl)-naphtho-1-yl)-4,6-bistrichloromethyl-s-triazine, 2-(4-(2-butoxyethyl)-naphtho-1-yl)-4,6-bistrichloromethyl-s-triazine, 22-methoxynaphtho-2-yl)-4,6-bistrichloromethyl-s-triazine, 2-(6-methoxy-5-methylnaphto-2-yl)-4,6-bistrichloromethyl-s-triazine, 2-(6-methoxynaphtho-2-yl)-4,6-bistrichloromethyl-s-triazine, 2-(5-methoxynaphtho-1-yl)-4,6-bistrichloromethyl-s-triazine, 2-(4,7-dimethoxynaphtho-1-yl)-4,6-bistrichloromethyl-s-triazine, 2-(6-ethoxynaphtho-2-yl)-4,6-bistrichloromethyl-s-triazine, 2-(4,5-dimethoxynaphtho-1-yl)-4,6-bistrichloromethyl-s-triazine, 4-(p-N,N-di(ethoxycarbonylmethyl)aminophenyl)-2,6-di(trichloromethyl)-s-triazine, 4-(o-methyl-p-N,N-di(ethoxycarbonylmethyl)aminophenyl)-2,6-di(trichloromethyl)-s-triazine, 4-(p-N,N-di(chloroethyl)aminophenyl)-2,6-di(trichloromethyl)-s-triazine, 4-(o-methyl-p-N,N-di(chloroethyl)aminophenyl)-2,6-di(trichloromethyl)-s-triazine, 4-(p-N-chloroethylaminophenyl)-2,6-di(trichloromethyl)-s-triazine, 4-(p-N-ethoxycabonylmethylaminophenyl)-2,6-di(trichloromethyl)-s-triazine, 4-(p-N,N-di(phenyl)aminophenyl)-2,6-di(trichloroemthyl)-s-triazine, 4-(p-N-chloroethylcarbonylaminophenyl)-2,6-di(trichloromethyl)-s-triazine, 4-(p-N-(p-methoxyphenyl)carbonylaminophenyl)-2,6-di(trichloromethyl)-s-triazine, 4-(m-N,N-di(ethoxycarbonylmethyl)aminophenyl)-2,6 di(trichloromethyl)-s-triazine, 4-(m-bromo-p-N,N-di(ethoxycarbonylmethyl)aminophenyl)-2,6-di(trichloromethyl)-s-triazine, 4-(m-chloro-p-N,N-di(ethoxycarbonylmethyl)aminophenyl)-2,6-di(trichloromethyl)-s-triazine, 4-(m-fluoro-p-N,N-di(ethoxycarbonylmethyl)aminophenyl)-2,6-di(trichloromethyl)-s-triazine, 4-(o-bromo-p-N,N-di(ethoxycarbonylmethyl)aminophenyl)-2,6-di(trichloromethyl)-s-triazine, 4-(o-chloro-p-N,N-di(ethoxycarbonylmethyl)aminophenyl)-2,6-di(trichloromethyl)-s-triazine, 4-(o-fluoro-p-N,N-di(ethoxycarbonylmethyl)aminophenyl-2,6-di(trichloromethyl)-s-triazine, 4-(o-bromo-p-N,N-di(chloroethyl)aminophenyl-2,6-di(trichloromethyl)-s-triazine, 4-(o-chloro-p-N,N-di(chloroethyl)aminophenyl)-2,6-di(trichloromethyl)-s-triazine, 4-(o-fluoro-p-N,N-di(chloroethyl)aminophenyl)-2,6-di(trichloromethyl)-s-triazine, 4-(m-bromo-p-N,N-di(chloroethyl)aminophenyl)-2,6-di(trichloromethyl)-s-triazine, 4-(m-chloro-p-N,N-di(chloroethyl)aminophenyl)-2,6-di(trichloromethyl)-s-triazine, 4-(m-fluoro-p-N,N-di(chloroethyl)aminophenyl)-2,6 di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine and 4-(o-fluoro-p-N-chloroethylaminophenyl)-2,6-di(trichloromethyl)-s-triazine.

Also usefully used include TAZ series (such as TAZ-104, TAZ-107, TAZ-109, TAZ-110, TAZ-113, TAZ-123, TAZ-140 and TAZ-204), produced by Midori Kagaku Co., Ltd., T series (such as T-OMS, T-BMP, T-R and T-B), produced by PANCHIM, Inc., IRGACURE series (such as IRGACURE 149, IRGACURE 184, IRGACURE 261, IRGACURE 500, IRGACURE 651, IRGACURE 819 and IRGACURE 1000) and DAROCURE series (such as DAROCURE 1173), produced by Ciba-Geigy Ltd., 4,4'-bis(diethylamino)benzophenone, 2-(O-benzoyloxime)-1-(4-phenylthio)phenyl)-1,2-octadione, 2-benzyl-2-dimethylaminoe 4-morpholinobutylophenone, 2,2-dimethoxy-2-phenylacetophenone, a 2-(o-chlorophenyl)-4,5-diphenylimidazolyl dimer, a 2-(o-fluorophenylimidazolyl dimer, a 2-(o-methoxyphenyl)-4,5-diphenylimidazolyl dimer, a 2-(p-methoxyphenyl)-4,5-diphenylimidazolyl dimer, a 2-(p-dimethoxyphenyl)-4,5-diphenylimidazolyl dimer, a 2-(2,4-dimethoxyphenyl)-4,5-diphenylimidazolyl dimer, a 2-(p-methylmercaptophenyl)-4,5-diphenylimidazolyl dimer and benzoin isopropyl ether.

In the colored curable composition of the invention, another known initiator may be contained in addition to the aforementioned photopolymerization initiator. Specific examples thereof include a vicinal polyketaldonyl compound described in U.S. Pat. No. 2,367,660, α-carbonyl compounds described in U.S. Pat. Nos. 2,367,661 and 2,367,670, an acyloin ether described in U.S. Pat. No. 2,448,828, an aromatic acyloin compound substituted with an α-hydrocarbon described in U.S. Pat. No. 2,722,512, a multinuclear quinone compound described in U.S. Pat. Nos. 2,951,758, a combination of a triallylimidazole dimer and p-aminophenyl ketone described in U.S. Pat. No. 3,549,367, and a benzothiazole compound and a trihalomethyl-s-triazine compound described in JP-B No. 51-48516.

The total content of the photopolymerization initiator (and the known initiator) is preferably from 0.01 to 50% by mass, more preferably from 1 to 30% by mass, and particularly preferably from 1 to 20% by mass, based on the solid content (by mass) of the polymerizable monomer components (for example, a polymerizable monomer compound indicated as a crosslinking agent described later). If the total content thereof is less than 0.01% by mass, the polymerization may be difficult to proceed, and if it exceeds 50% by mass, the molecular weight may become small to reduce the film strength although the polymerization rate is large.

The photopolymerization initiator may be used in combination with a sensitizer and a photostabilizer.

Examples thereof include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzylacetone, p-(dimethylamino)phenyl styryl ketone, p-(dimethylamino)phenyl-p-methyl styryl ketone, benzophenone, p-(dimethylamino) benzophenone (or Michler's ketone), p-(diethylamino) benzophenone, benzoanthrone, a benzothiazole compound described in JP-B No. 51-48516, and TINUVIN 1130 and TINUVIN 400.

Furthermore, the colored curable composition of the invention may contain a thermal polymerization inhibitor. The thermal polymerization inhibitor is preferably contained in the colored curable composition of the invention in addition to the aforementioned components. Examples thereof include hydroquinone, p-methoxypehnol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobeozimidazole.

Naphthoquinone Diazide Compound

In the following, there will be explained a naphthoquinone diazide compound suitable in case of forming a positive-type system. The naphthoquinone diazide compound is a compound including at least an o-quinonediazide group. Examples of the naphthoquinonediazide compound include o-naphthoquinonediazide-5-sulfonic acid ester, o-naphthoquinonediazide-5-sulfonic acid amide, o-naphthoquinonediazide-4-sulfonic acid ester and o-naphthoquinonediazide-4-sulfonic acid amide. These esters and amides can be produced, for example, by using a phenol compound described as the general formula (I) in JP-A Nos. 2-84650 and 3-49437.

Also in case of forming a colored curable composition of positive-type, the binder and the crosslinking agent are preferably dissolved in proportions respectively of about 2 to 50% by mass and about 2 to 30% by mass with respect to all the solids added in the organic solvent. Also the naphthoquinone diazide compound and the dye are preferably contained in proportions respectively of about 2 to 30% by mass and about 2 to 50% by mass with respect to a solution containing the binder and the crosslinking agent.

Solvent

Upon preparation of the colored curable composition of the invention, a solvent is generally used. The solvent is not particularly limited as far as it satisfies solubility to the respective components and coating property of the colored curable composition, and it is preferably selected under particular consideration of the solubility of the alkali soluble resin, the coating property and the safety.

Preferred examples of the solvent include an ester compound, such as an alkyl ester, e.g., ethyl acetate, n-butyl acetate, isobutyl acetate, amyl formate, isoamyl acetate, isobutyl acetate, butyl propionate, isopropyl butyrate, ethyl butyrate, butyl butyrate, an alkyl ester compound, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate and ethyl ethoxyacetate; 3-oxypropionic acid alkyl ester, such as methyl 3-oxypropionate and ethyl 3-oxypropionate, for example, methyl 3-methoxypropionate, ethyl 3-methoxypropionate, methyl 3-ethoxypropionate and ethyl 3-ethoxypropionate, a 2-oxypropionic acid alkyl ester, such as methyl 2-oxypropionate, ethyl 2-oxypropionate and propyl 2-oxypropionate, for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate and ethyl 2-ethoxy-2-methylpropionate, methylpyruvate, ethyl pyruvate, propyl pyruvate, methyl acetoacetate, ethyl acetoacetate, methyl 2-oxobutanoate and ethyl 2-oxobutanoate;

an ether compound, such as diethylene glycol dimethyl ether, tetrahydrofuran, ethylene glycol monomethyl ether, ethylene glycol monoethyl ether, methylcellosolve acetate, ethylcellosolve acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, propylene glycol propyl ether acetate, ethylcarbitol acetate and butylcarbitol acetate; a ketone compound, such as methyl ethyl ketone, cyclohexanone, 2-heptanone and 3-heptanone, and an aromatic hydrocarbon compound, such as toluene and xylene.

Among these, methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether and propylene glycol methyl ether acetate are more preferred.

Various Kinds of Additives

Various kinds of additives may be added to the colored curable composition of the invention depending on necessity, such as a filler, a polymer compound other than those described in the foregoing, a surfactant, an adhesion accelerating agent, an antioxidant, an ultraviolet ray absorbing agent and an aggregation preventing agent. Furthermore, a discoloration preventing agent for the dye may also be added depending on necessity.

Examples of the additives include a filler, such as glass and alumina; a polymer compound other than the binder resin, such as polyvinyl alcohol, polyacrylic acid, polyethylene glycol monoalkyl ether and polyfluoroalkyl acrylate; a surfactant, such as a nonionic surfactant, a cationic surfactant and an anionic surfactant; an adhesion accelerating agent, such as vinyltrimethoxysilane, vinyltriethoxysilane, vinyltris(2-methoxyethoxy)silane, N-(2-amonoethyl)-3-aminopropyldimethylmethoxysilane, N2-aminoethyl)-3-aminopropyltrimethyoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane; an antioxidant, such as 2,2-thiobis(4-methyl-6-t-butylphenol) and 2,6-di-t-butylphenol; an ultraviolet ray absorbing agent, such as 23-t-butyl-5-methyl-2-hydroxyphenyl)-5-chlorobenzotriazole and alkoxybenzophenone; and an aggregation preventing agent, such as sodium polyacrylate.

In order to accelerate the dissolution of the non-image area to an alkali solution to attain further improvement of the developing property of the colored curable composition of the invention, an organic carboxylic acid, preferably a low molecular weight organic carboxylic acid having a molecular weight of 1,000 or less, may be added to the composition.

Specific examples thereof include an aliphatic monocarboxylic acid, such as formic acid, acetic acid, propionic acid, butyric acid, valeric acid, pivalic acid, caproic acid, diethylacetic acid, enanthic acid and caprylic acid; an aliphatic dicarboxylic acid, such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; an aliphatic tricarboxylic acid, such as tricarballylic acid, aconitic acid and camphoronic acid; an aromatic monocarboxylic acid, such as benzoic acid, toluic acid, cuminic acid, hemellitic acid and mesitylenic acid; an aromatic polycarboxylic acid, such as phthalic acid, isophthalic acid, terephthalic acid, trimellitic acid, trimesic acid, mellophanic acid and pyromellitic acid; and other carboxylic acids, such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

The colored curable composition of the invention can be preferably used for forming colored pixels of a color filter used for a liquid crystal display device and a solid state image sensing device (such as CCD and CMOS), and for producing a printing ink, an ink for inkjet printing and a paint.

Color Filter and Producing Method Therefor

In the following, the color filter of the invention will be explained in detail, through a description of a producing method thereof.

In the producing method of the color filter of the invention, a colored curable composition of the invention explained in the foregoing is utilized. The color filter of the invention can be most advantageously constituted by employing the colored curable composition of the invention, coating the colored curable composition on a substrate for example by a coating method such as a spin coating, a cast coating or a roll coating thereby forming a radiation-sensitive composition layer, exposing such layer through a predetermined mask pattern, and developing the layer with a developing solution to obtain a negative- or positive-type colored pattern (imgage formation). In this process, a curing step of curing the formed colored pattern by a heating and/or an exposure may be provided if necessary. A light or a radiation used in such step is preferably an ultraviolet light such as g-line, h-line or i-line. Also in case the colored curable composition is of a positive-type, there may also be provided a step of postbaking the colored pattern after the image forming step.

In such preparation of the color filter, a color filter with a desired number of color hues can be obtained, in case of negative-type, by repeating the image forming step (and curing step if necessary) by a number of the desired color hues, and, in case of positive-type, by repeating the image forming step and the postbake by a number of the desired color hues.

Examples of the support include soda glass, PYREX™ (R) glass and quartz glass, which are used in a liquid crystal display device or the like, those having a transparent electro-conductive film adhered, and a photoelectric conversion element substrate, such as a silicon substrate, and a complementary metallic oxide semiconductor (CMOS), which are used in a solid state image sensing device or the like. There are some cases where black stripes for separating pixels are formed on the support.

An undercoating layer may be provided, depending on necessity, on the support for improvement of adhesion to the upper layer, prevention of diffusion of substances, and planarization of the surface of the substrate.

The developer according to the invention may be any one that has such a formulation that dissolves an uncured part of the colored curable composition of the invention but does not dissolve a cured part thereof. Specific examples thereof include a combination of various kinds of organic solvents and an alkali aqueous solution. Examples of the organic solvent include those having been described for preparation of the colored curable composition of the invention.

and an electroluminescence device of high resolution exceeding 1,000,000 pixels. The color filter according to the invention can be used, for example, as such a color filter that is disposed between light accepting parts of pixels and microlenses for light condensation, which constitute CCD.

EXAMPLES

In the following, the invention will be explained further by examples, but the invention is not limited to such examples unless the principle of the invention is exceeded. In the following description, "part" is based on mass, unless specified otherwise.

Synthesis Example 1

Synthesis of Example Compound (1)
An example compound (1) was synthesized according to a following scheme 1.

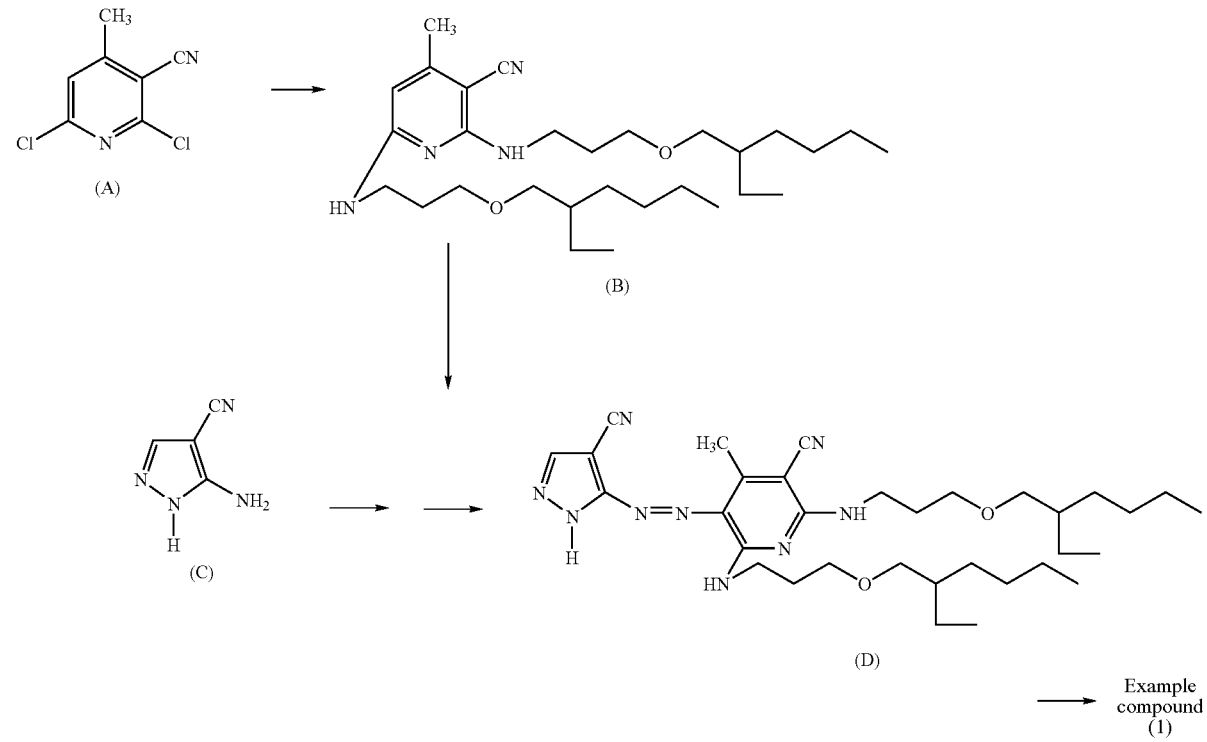

Preferred examples of the alkali aqueous solution include alkali aqueous solutions obtained by dissolving such an alkali compound to a concentration of 0.001 to 10% by mass, and preferably from 0.01 to 1% by mass, as sodium hydroxide, potassium hydroxide, sodium carbonate, sodium silicate, sodium metasilicate, aqueous ammonia, ethylamine, diethylamine, dimethylmethanolamine, tetramethylammonium hydroxide, tetraethylammonium hydroxide, choline, pyrrole, piperidine and 1,8-diazabicyclo-5.4.0)-7-undecene. In the case where a developer containing the alkali aqueous solution is used, the layer thus developed is generally washed with water.

The color filter according to the invention is suitable for a liquid crystal display device and a solid state image sensing device, and particularly suitable for CCD, a CMOS device In the scheme 1, while 93.5 g (0.50 moles) of 32-ethylhexyloxy)propylamine were agitated under cooling with water, 18.7 g (0.10 moles) of a compound (A) were added gradually. Thereafter, agitation was conducted for further 4 hours at 120° C. After the obtained reaction liquid was cooled to the room temperature, 300 ml of ethyl acetate and 300 ml of water were added, then the liquid layers were separated and an ethyl acetate layer was washed twice with 200 ml of a saturated aqueous solution of sodium chloride. Subsequently ethyl acetate was distilled off under a reduced pressure and an obtained viscous liquid was purified with silica gel column chromatography to obtain 45.5 g of a compound (B) as colorless viscous liquid with an yield of 93.2%.

Then, in a solution, formed by dissolving 2.16 g (0.02 moles) of a compound (C) in 25 ml of phosphoric acid and agitated at 0° C., 1.5 g (0.022 moles) of sodium nitrite were added and the mixture was agitated further for 30 minutes. After the agitation, 9.7 g (0.02 moles) of the aforementioned compound (B) were added and the mixture was agitated for 3 hours at 25° C. The obtained reaction liquid was further added with 300 ml of water and agitated for 1 hour, and precipitated crystals were separated by filtration and washed sufficiently with water. The obtained crystals were dried to obtain 11.0 g of a compound (D) with an yield of 90.1%.

Then, to 6.1 g (0.01 moles) of the obtained compound (D), 30 ml of dimethyl acetamide, 3.0 g of potassium carbonate and 2.0 g (0.014 moles) of p-fluoronitrobenzene were added and the mixture was agitated at 75° C. for 2 hours. The obtained reaction liquid was poured into a mixture of 100 ml of water and 100 ml of ethyl acetate, then the mixture layers were separated and an ethyl acetate layer was saturated and washed twice with 100 ml of an aqueous solution of sodium chloride. After the washing, ethyl acetate was distilled off under a reduced pressure, and the residue was purified with silica gel column chromatography and crystallized from 40 ml of acetonitrile and the crystals were separated by filtration, washed with 20 ml of cold acetonitrile and dried to obtain 4.8 g of example compound (1) as yellow crystals. The obtained example compound (1) showed an yield of 65.9%, a melting point of 157-158° C., an absorption λmax of 466.9 nm in ethyl acetate and $\epsilon$=49,300.

In the following, there are shown NMR data of the obtained example compound (1):

$^1$H-NMR DMSO-$d_6$ δppm: 0.70-1.95 (m, 34H), 2.55 (s, 3H), 3.18-3.38 (m, 4H), 3.38-3.60 (m, 6H), 3.65 (m, 2H), 8.32-7.78 (t, 1H), 8.12 (d, 2H), 8.32 (d, 2H), 9.50 (s, 1H), 10.72 (t, 1H).

Synthesis Example 2

Synthesis of Example Compound (2)

An example compound (2) was synthesized in the same manner as the synthesis example 1 except that 2.0 g (0.014 moles) of p-fluoronitrobenzene were replaced by 2.0 g (0.014 moles) of o-fluoronitrobenzene and 3.0 g of potassium carbonate were replaced by 5.0 g of sodium bicarbonate. The obtained example compound (2) showed an amount of 4.6 g, an yield of 63.1%, a melting point of 132-135° C., an absorption λmax of 457.3 nm in ethyl acetate and $\epsilon$=39,800.

In the following, there are shown NMR data of the obtained example compound (2):

$^1$H-NMR DMSO-$d_6$ δPPM: 0.65-1.93 (m, 34H), 2.65 (s, 3H), 3.23 (t, 4H), 3.42 (t, 4H), 3.47-3.75 (m, 4H), 7.75-8.05 (m, 4H), 8.20 (d, 1H), 9.20 (s, 1H), 10.67 (t, 1H).

Synthesis Example 3

Synthesis of Example Compound (5)

An example compound (5) was synthesized according to a following scheme 2.

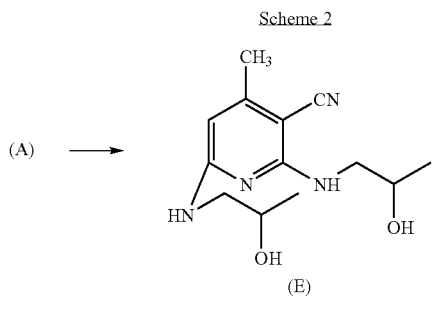

Scheme 2

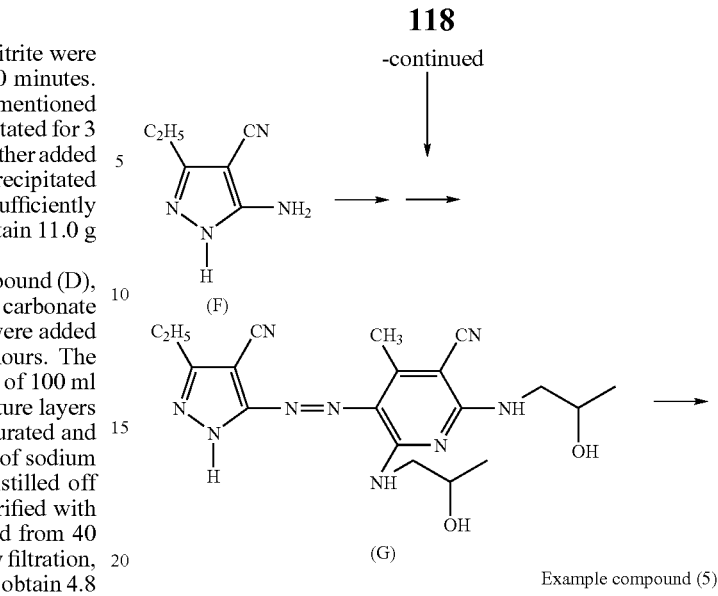

Example compound (5)

In the scheme 2, while 45.0 g (0.60 moles) of 1-amino-2-propanol were agitated under cooling with water, 18.7 g (0.10 moles) of the compound (A) in the scheme 1 were added gradually and agitated for 3 hours at 130° C. Then the reaction liquid was cooled to the room temperature, and 500 ml of ethyl acetate and 300 ml of water were added. Then the liquid layers were separated and an ethyl acetate layer was washed twice with 200 ml of a saturated aqueous solution of sodium chloride. Subsequently ethyl acetate was distilled off under a reduced pressure to obtain a solid. The solid was dissolved under heating by adding 100 ml of acetonitrile, and was then cooled with water. The precipitated crystals were separated by filtration, washed with 50 ml of cold acetonitrile and dried to obtain 19.7 g of a compound (E) with an yield of 74.5%.

Separately, in a solution, formed by dissolving 1.4 g (0.01 moles) of a compound (F) in 20 ml of phosphoric acid and agitated at 0° C., 0.73 g (0.011 moles) of sodium nitrite were added and the mixture was agitated for 30 minutes. Then 2.6 g of the aforementioned compound (E) were added and the mixture was agitated for 3 hours at 25° C. After the agitation, the obtained reaction liquid was added with 150 ml of water and agitated for 1 hour, and precipitated crystals were separated by filtration. The obtained crystals were washed sufficiently with water, and dried to obtain 3.5 g of a compound (G) with an yield of 85.0%.

Then, to 3.4 g (0.08 moles) of the obtained compound (G), 30 ml of dimethyl acetamide, 3.0 g of potassium carbonate and 1.5 g (0.011 moles) of p-fluoronitrobenzene were added and the mixture was agitated at 75° C. for 2 hours. After the agitation, the reaction liquid was poured into 100 ml of water, and the precipitated crystals were separated by filtration and washed sufficiently with water. The crystals after drying were recrystallized from 15 ml of ethyl acetate and 5 ml of methanol, and precipitated crystals were separated by filtration and washed with 10 ml of cold ethyl acetate. After washing, the crystals were dried to obtain 3.2 g of an example compound (5) of the invention, as yellow crystals. The obtained example compound (5) showed an yield of 60.5%, a melting point higher than 250° C., an absorption λmax of 456.6 nm in ethyl acetate and $\epsilon$=40,900.

In the following, there are shown NMR data of the obtained example compound (5):

$^1$H-NMR DMSO-$d_6$ δppm: 1.00-1.15 (m, 6H), 1.20 (t, 3H), 2.67 (s, 3H), 2.94 (q, 2H), 3.20-3.55 (m, 4H), 3.75-4.00 (m, 2H), 4.82 (d, 1H), 4.90 (d, 1H), 7.65 (t, 1H), 7.97 (d, 2H), 8.47 (d, 2H), 10.73 (t, 1H).

Synthesis example 4

Synthesis of Example Compound (6)

A reaction was conducted in the same manner as the synthesis example 3 except that 1.5 g (0.011 moles) of p-fluoronitrobenzene were replaced by 1.5 g (0.011 moles) of o-fluoronitrobenzene and 3.0 g of potassium carbonate were replaced by 5.0 g of sodium bicarbonate, thereby obtaining yellow crystals. The obtained yellow crystals were purified by silica gel column chromatography and crystallized from 15 ml of methanol, and the precipitated crystals were separated by filtration and washed with 10 ml of cold methanol. After washing, the crystals were dried to obtain 2.6 g of an example compound (6) of the invention as yellow crystals. The example compound (6) showed an yield of 48.8%, a melting point of 242-245° C., an absorption λmax of 452.9 nm in ethyl acetate and $\epsilon$=36,600.

In the following, there are shown NMR data of the obtained example compound (6):

$^1$H-NMR DMSO-$d_6$ δppm: 1.00-1.22 (m, 9H), 2.67 (s, 3H), 2.78 (q, 2H), 3.20-3.55 (m, 4H), 3.75-4.00 (m, 2H), 4.83 (d, 2H), 7.66 (t, 1H), 7.82-8.12 (m, 3H), 8.30 (d, 1H), 10.63 (t, 1H).

Synthesis Example 5

Synthesis of Example Compound (8)

An example compound (8) was synthesized according to a following scheme 3.

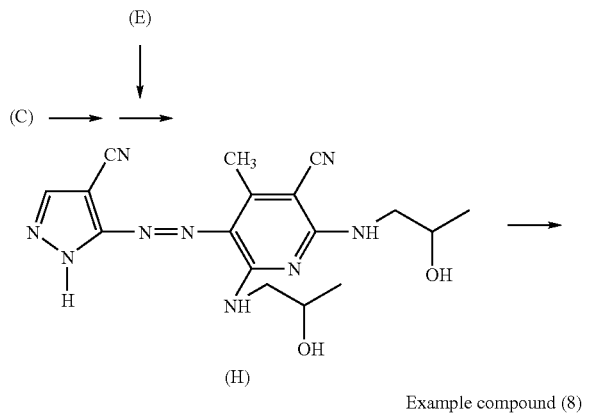

In the scheme 3, in a solution, formed by dissolving 2.16 g (0.02 moles) of the compound (C) in the scheme 1 in 25 ml of phosphoric acid and agitated at 0° C., 1.5 g (0.022 moles) of sodium nitrite were added and the mixture was agitated for 30 minutes. After the agitation, 5.2 g (0.02 moles) of the aforementioned compound (E) in the scheme 2 were added and the mixture was agitated for 3 hours at 25° C. Then the obtained reaction liquid was added with 200 ml of water and agitated for 1 hour, and precipitated crystals were separated by filtration and washed sufficiently with water. After washing, the obtained crystals were dried to obtain 6.9 g of a compound (H) with an yield of 90.0%.

Then, to 3.8 g (0.01 moles) of the compound (H), 30 ml of dimethyl acetamide, 3.0 g of potassium carbonate and 2.2 g (0.011 moles) of 2-ethylhexyl bromide were added and the mixture was agitated at 75° C. for 2 hours. Then the reaction liquid was poured into 100 ml of water and 100 ml of ethyl acetate, then the liquid layers were separated and an ethyl acetate layer was washed twice with 100 ml of a saturation aqueous solution of sodium chloride. After washing, ethyl acetate was distilled off under a reduced pressure, and crystals were precipitated from 50 ml of methanol and 50 ml of chloroform, and separated by filtration. After the filtration, the crystals were washed with 50 ml of cold methanol, and dried to obtain 2.9 g of an example compound (8) of the invention, as yellow crystals. The obtained example compound (8) showed an yield of 58.5%, a melting point of 223-224° C., an absorption λmax of 450.7 nm in ethyl acetate and $\epsilon$=31,100.

In the following, there are shown NMR data of the obtained example compound (8):

$^1$H-NMR DMSO-$d_6$ δppm: 0.88 (t, 6H), 1.00-1.35 (m, 14H), 1.92 (m, 1H), 2.64 (s, 3H), 3.25-3.50 (m, 4H), 3.75-3.90 (m, 2H), 4.10 (d, 2H), 4.78-4.90 (m, 2H), 7.67 (t, 1H), 8.65 (t, 1H), 10.60 (t, 1H).

Synthesis example 6

An example compound (40) was synthesized according to a following scheme 4.

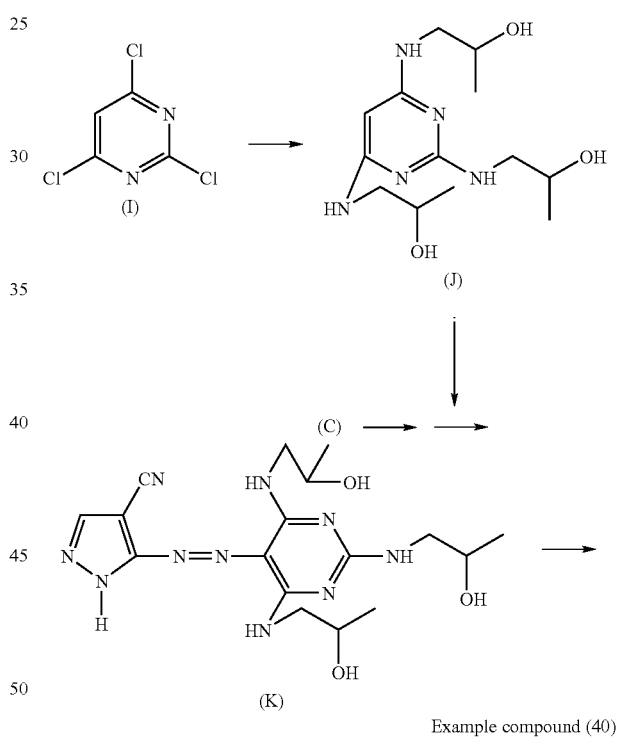

In the scheme 4, while 23 g (0.31 moles) of 1-amino-2-propanol were agitated under cooling with water, 9.2 g (0.05 moles) of the compound (I) were added gradually and agitated for 1 hour at 50° C. After the agitation, the reaction liquid was cooled to the room temperature, then 300 ml of water were added and the mixture was agitated for 1 hour under cooling with ice. After the agitation, precipitated crystals were separated by filtration, washed with cold water and dried to obtain 7.5 g of white crystals (J) with an yield of 50.0%.

Then, in a solution, formed by dissolving 2.16 g (0.02 moles) of the compound (C) in the scheme 1 in 25 ml of phosphoric acid and agitated at 0° C., 1.5 g (0.022 moles) of sodium nitrite were added and the mixture was agitated for 30 minutes. After the agitation, 6.0 g (0.02 moles) of the compound (J) were added to the reaction liquid and the mixture was agitated for 3 hours at 25° C. Then the reaction liquid was added with 200 ml of a saturated aqueous solution of sodium chloride and agitated for 1 hour, and precipitated crystals were separated by filtration and washed with 50 ml of a saturated aqueous solution of sodium chloride. The obtained crystals were dried to obtain crude crystals of a compound (K).

Then, to the entire amount of the obtained compound (K), 30 ml of dimethyl acetamide, 3.0 g of potassium carbonate and 4.0 g (0.028 moles) of o-fluoronitrobenzene were added and the mixture was agitated at 75° C. for 2 hours. After the agitation, the reaction liquid was poured into 150 ml of water and 150 ml of ethyl acetate, then the liquid layers were separated and an ethyl acetate layer was washed twice with 150 ml of a saturated aqueous solution of sodium chloride. Ethyl acetate was distilled off under a reduced pressure, and, after a purification by silica gel column chromatography, crystals were precipitated from 100 ml of acetonitrile and separated by filtration. Then the obtained crystals were washed with 50 ml of cold acetonitrile and dried to obtain 2.8 g of an example compound (40) of the invention as yellow crystals. The example compound (40) showed an yield of 51.9%, a melting point of 190-192° C., an absorption λmax of 429.1 nm in ethyl acetate and ε=34,400.

In the following, there are shown NMR data of the obtained example compound (40):

$^1$H-NMR DMSO-d$_6$ δppm: 1.06-1.15 (m, 9H), 3.15-3.50 (m, 6H), 3.70-3.90 (m, 2H), 4.70-4.86 (m, 3H), 6.97 (m, 1H), 7.50 (m, 1H), 7.75-8.00 (m, 3H), 8.20 (d, 1H), 9.12 (s, 1H), 10.33 (m, 1H).

Synthesis Example 7

An example compound (44) was synthesized according to a following scheme 5.

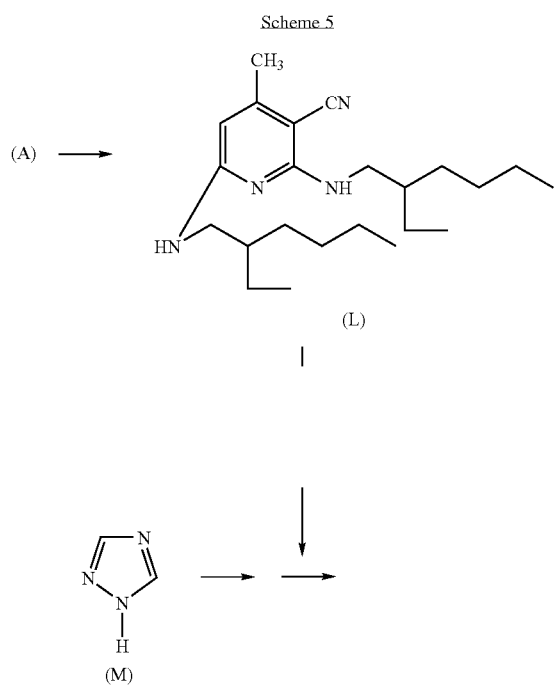

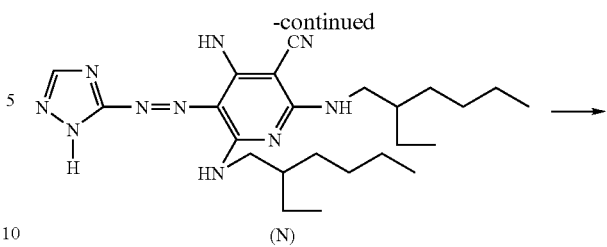

Example compound (44)

In the scheme 5, while 87.0 g (0.67 moles) of 2-ethylhexylamine were agitated under cooling with water, 30.0 g (0.16 moles) of the compound (A) in the scheme 1 were added gradually. After the reaction liquid was agitated for 4 hours at 130° C., it was cooled to the room temperature, then 300 ml of ethyl acetate and 300 ml of water were added, the liquid layers were separated and an ethyl acetate layer was washed twice with 300 ml of a saturated aqueous solution of sodium chloride. After washing, ethyl acetate was distilled off under a reduced pressure and an obtained viscous liquid was purified with silica gel column chromatography to obtain 45.0 g of a colorless viscous liquid compound (L), which showed an yield of 75.6%.

Then, in a solution, formed by dissolving 0.90 g (0.01 moles) of a compound (M) in 25 ml of phosphoric acid and agitated at 0° C., 0.73 g (0.011 moles) of sodium nitrite were added and the mixture was agitated further for 30 minutes. After the agitation, 3.7 g (0.01 moles) of the compound (L) were added to the reaction liquid and the mixture was agitated for 3 hours at 25° C. The reaction liquid was further added with 200 ml of water and agitated for 1 hour, and precipitated crystals were separated by filtration and washed sufficiently with water. After washing, the obtained crystals were dried to obtain 4.4 g of a compound (N) with an yield of 94.2%.

Then, to 4.4 g (0.0094 moles) of the obtained compound (N), 30 ml of dimethyl acetamide, 3.0 g of potassium carbonate and 2.0 g (0.014 moles) of p-fluoronitrobenzene were added and the mixture was agitated at 75° C. for 2 hours. After the agitation, the reaction liquid was poured into a mixture of 100 ml of water and 100 ml of ethyl acetate, then the mixture layers were separated and an ethyl acetate layer was washed twice with 100 ml of a saturated aqueous solution of sodium chloride. After the washing, ethyl acetate was distilled off under a reduced pressure, and the residue was purified with silica gel column chromatography. Obtained crystals were crystallized from 40 ml of acetonitrile and the crystals were separated by filtration, washed with 20 ml of cold acetonitrile and dried to obtain 2.3 g of an example compound (44) of the invention as yellow crystals. The example compound (44) showed an yield of 41.8%, a melting point of 172-173° C., an absorption λmax of 452.3 nm in ethyl acetate and ε=41,400.

In the following, there are shown NMR data of the obtained example compound (44):

$^1$H-NMR DMSO-d$_6$ δppm: 0.80-1.00 (m, 12H), 1.25-1.50 (m, 16H), 1.55-1.70 (m, 1H), 1.70-1.85 (m, 1H), 2.64 (s, 3H), 3.25-3.50 (m, 2H), 3.50-3.75 (m, 2H), 7.80 (m, 1H), 8.22 (d, 2H), 8.45 (d, 2H), 9.92 (s, 1H), 11.07 (t, 1H).

Example 1

1) Preparation of Resist Solution

The following composition was mixed and dissolved to prepare a resist solution.

| [Composition] | |
|---|---|
| Propylene glycol monomethylether acetate(PGMEA) | 5.20 parts |
| Ethyl lactate(EL) | 52.6 parts |
| Binder | 30.5 parts |
| (benzyl methacrylic acid/methacrylic acid/2-hydroxyethyl methacrylate copolymer (=60:20:20 in molar ratio)) in 41% propyleneglycol monomethylether acetate/ethyl lactate (1/1 in mass ratio) solution) | |
| Dipentaerythritol hexaacrylate | 10.2 parts |
| Polymerization inhibitor (p-methoxyphenol) | 0.006 parts |
| Fluorinated surfactant | 0.80 parts |
| Photopolymerization initiator (trade name: TAZ-107, manufactured by Midori Chemical Co.) | 0.58 parts |

2) Preparation of Glass Substrate with an Undercoat Layer

A glass substrate (Corning 1737, manufactured by Corning Incorporated)) was washed with aqueous 0.5% NaOH by irradiating ultrasonic wave, followed by washing with water, dehydration and baking (200° C./20 minutes). Then, the resist solution obtained in 1) was applied on the glass substrate after washing with a thickness of 2 μm using a spin coater, and a cured film (undercoat layer) was formed by drying for 1 hour by heating at 220° C.

3) Preparation of Dye Resist Solution (Colored Curable Composition [Negative-Type])

9.4 g of a resist solution obtained in 1) and 0.75 g of the aforementioned example compound 1 (dye represented by the formula (1)) which is an azo dye of the invention were mixed and dissolved to obtain a dye resist solution (solution of colored curable composition [negative-type]).

4) Exposure and Development of the Dye Resist Solution (Image-Forming Step)

The dye resist solution obtained in 3) was applied on the undercoat layer of the glass substrate with the underlayer using a spin coater so that the thickness of the layer is 1.0 μm, and the coating layer was pre-baked at 110° C. for 120 seconds.

Subsequently, the coated layer was irradiated with a light at a wavelength of 365 nm using an exposure device with a luminous energy of 500 mJ/cm$^2$ through a mask with a thickness of 20 μm. After irradiation, the substrate was developed at 25° C. for 40 seconds using a developer (trade name: CD-2000, manufactured by Fuji Film Arch Co.). The substrate was rinsed in running water, and a cyan color pattern image was obtained after spray-drying.

In this manner, there was obtained a yellow pattern suitable as a yellow pixel for constituting a color filter.

5) Evaluation

The dye resist solution prepared as described above was subjected to evaluations of a storage stability in time and of heat resistance and light resistance of a coated film formed by coating the dye resist solution on a glass substrate, in the following manner. Results of evaluations are shown in Table 1.

Storage Stability in Time

After the dye resist solution was stored for 1 month at the room temperature, a level of precipitation of abnormal substances in the solution was visually evaluated according to following criteria:

[Judging Criteria]
A: no precipitation observed
B: slight precipitation observed
C: precipitation observed Heat Resistance The glass substrate coated with the dye resist was placed on a hot plate so that the substrate surface contact the hot plate, and was heated at 200° C. for 1 hour. The changes of chromaticity before and after placing on the hot plate, or color difference ΔEab, were measured using a chromaticity meter (trade name: MCPD-1000, manufactured by Otsuka Electronic Co.). ΔEab obtained was used as an index indicating the extent of heat resistance, and was evaluated by the following criteria. The smaller ΔEab value shows better heat resistance.

[Criteria]
A: ΔEab<5
B: 5≦ΔEab≦10
C: ΔEab>10

Light Resistance

The glass substrate coated with the dye resist was irradiated with a xenon lamp at an illuminance of 50,000 lux for 20 hours (corresponds to 1,000,000 lux-h), and the changes of chromaticity before and after irradiation, or ΔEab, were measured. The ΔEab value obtained was used as an index indicating the extent of light resistance, and was evaluated according to the following criteria. The smaller ΔEab value shows the better light resistance.

[Criteria]
A: ΔEab<3
B: 3≦ΔEab≦10
C: ΔEab>10

Examples 2-10

Yellow patterns were prepared in the same manner as in Example 1 except that the azo dye of the invention, in the "3) preparation of dye resist solution" in Example 1, was changed as shown in Table 1 (however in equimolar amounts), and were evaluated in a similar manner. Results of evaluation are shown in Table 1.

Comparative Examples 1-2

Comparative yellow patterns were prepared in the same manner as in Example 1 except that the azo dye of the invention, in the "3) preparation of dye resist solution", in Example 1 was changed as shown in Table 1 (however in equimolar amounts), and were evaluated in a similar manner. Results of evaluation are shown in Table 1.

TABLE 1

| | dye (*1) | storage stability | heat resistance | light resistance |
|---|---|---|---|---|
| Example 1 | Example compound 1 | A | A | A |
| Example 2 | Example compound 6 | B | A | A |
| Example 3 | Example compound 13 | A | A | A |
| Example 4 | Example compound 23 | B | A | A |
| Example 5 | Example compound 33 | B | A | A |
| Example 6 | Example compound 40 | A | A | B |
| Example 7 | Example compound 44 | A | B | B |
| Example 8 | Example compound 47 | A | B | A |
| Example 9 | Example compound 53 | B | A | B |
| Example 10 | Example compound 77 | B | A | B |
| Comparative | C.I. Solvent Yellow 162 | C | C | C |

TABLE 1-continued

| dye (*1) | | storage stability | heat resistance | light resistance |
|---|---|---|---|---|
| Examples 1 Comparative Examples 2 | C.I. Solvent Yellow 82 | C | C | C |

(*1) Example compound in the dye column for Examples is a dye represented by the formula (1).

As shown in Table 1, in the Examples employing the azo dye of the invention, the colored curable composition prepared as a solution showed a superior storage stability, in comparison with the Comparative Examples employing other dyes. Also yellow patterns formed with such colored curable compositions were satisfactory in the heat resistance and the light resistance.

Example 11

1) Preparation of Colored Curable Composition (Positive-Type)

A colored curable composition (positive-type) was obtained by mixing and dissolving the composition below.

| [Composition] | |
|---|---|
| Ethyl lactate (EL) | 30 parts |
| Resin P-1 below | 3.0 parts |
| Naphthoquinone diazide compound N-1 below | 1.8 parts |
| Hexamethoxymethylol modified melamine (cross-linking agent) | 0.6 parts |
| TAZ-107 (photooxidation agent manufactured by Midori Chemical Co.) | 1.2 parts |
| Fluorinated surfactant (trade name: F-475, manufactured by Dai-Nippon Ink Chemical Industry Co.) | 0.0005 parts |
| Example compound 3 (Dye represented by the formula (1)) | 1.5 parts |

Synthesis of Resin P-1

Benzyl methacrylate (70.0 g), methacrylic acid (13.0 g), 2-hydroxyethyl methacrylate (17.0 g), ethyl lactate (300 g) and propyleneglycol monomethylether acetate (300 g) were placed in a three-neck flask equipped with a stirrer, reflux condenser and thermometer, and the mixture was stirred for 10 hours at 65° C. in a nitrogen stream after adding a catalytic quantity of a polymerization initiator (trade name: V-65, manufactured by Wako Pure Chemical Industries, Inc.). The resin solution obtained was dripped into 20 L of ion-exchange water with vigorous stirring to obtain a white powder. The white powder obtained was dried at 40° C. for 20 hours in vacuum to obtain 140 g of resin P-1. This resin P-1 had a weight average molecular weight of 28,000 and number average molecular weight of 11,000 as measured by GPC.

Synthesis of Naphthoquinone Diazide Compound N-1

Trisp-PA (42.45 g: manufactured by Honshu Chemical Co.), o-naphthoquinone diazide-5-sulfonylchloride (61.80 g) and acetone (300 ml) were placed in a three-neck flask, and triethylamine (24.44 g) was added dropwise at room temperature in 1 hour. After stirring for 2 hours after completing dropwise addition, the reaction solution was poured into a large volume of water with stirring. Precipitated Naphthoquinone diazide sulfonic acid was collected by suction filtration, and the product was dried in vacuum for 24 hours at 40° C. to obtain naphthoquinone diazide compound N-1.

2) Exposure and Development of Colored Curable Composition (Image Formation)

A glass substrate with an undercoat layer was prepared as in Example 1, and the colored curable composition prepared as described above was coated on the glass substrate with an undercoat layer, pre-baked, exposed, developed, rinsed and spray dried to obtain a yellow pattern, which was then heated for 5 minutes at 180° C. (post-bake), as in Example 1. The formed yellow pattern showed a satisfactory rectangular profile.

Subsequently, a storage stability in time of the dye resist solution prepared as described above, and heat resistance and light resistance of a coated film formed by coating the dye resist solution on a glass substrate, were evaluated in the same manner as in Example 1. As in the negative-type described above, satisfactory results were obtained in the storage stability, the light resistance and the heat resistance.

Examples 12-21

Coated films were formed on silicon wafer substrates by operations same as those in Examples 1-10 except that the glass substrates therein were replaced by silicon wafer substrates. Then a square pattern of 2 μm was exposed with an exposure amount of 500 mJ/cm$^2$ with an i-line reduction projection exposure apparatus, and was developed with a developing solution formed by diluting CD-2000 (manufactured by Fujifilm Arch Co.) to 60%, for 60 seconds at 23° C. It was then rinsed for 30 seconds with running water, and spray dried. As a result, there were obtained square patterns having a satisfactory profile with a substantially rectangular cross section and suitable as a color filter for a CCD.

Examples 22-24

Positive-type compositions were prepared in the same manner as described in Example 1 in JP-A No. 2002-14223 except that C.I. Solvent Yellow 162 described therein was replaced by azo dyes of the invention (example compounds 2, 7 and 11; dyes represented by the formula (1)) in equimolar amounts. Yellow filter layers were formed with the obtained compositions in the same manner as described in Example 1 of the aforementioned patent reference and evaluated for the heat resistance and the light resistance in the same manner as in Example 1 described in the foregoing. As a result, there were observed similar tendencies as shown in Table 1.

Example 25

The following composition was mixed and dissolved to prepare a resist solution.

| [Composition] | |
|---|---|
| Propylene glycol monomethylether acetate(PGMEA) | 5.20 parts |
| Ethyl lactate(EL) | 52.6 parts |
| Binder (benzyl methacrylic acid/methacrylic acid/2-hydroxyethyl methacrylate copolymer (=60:20:20 in molar ratio)) in 41% propyleneglycol monomethylether acetate/ethyl lactate (1/1 in mass ratio) solution) | 30.5 parts |
| Dipentaerythritol hexaacrylate | 10.2 parts |
| Polymerization inhibitor (p-methoxyphenol) | 0.006 parts |
| Fluorinated surfactant | 0.80 parts |
| Photopolymerization initiator (trade name: TAZ-107, manufactured by Midori Chemical Co.) | 0.58 parts |

2) Preparation of Glass Substrate with an Undercoat Layer

A glass substrate (Corning 1737, manufactured by Corning Incorporated)) was washed with aqueous 0.5% NaOH by irradiating ultrasonic wave, followed by washing with water, dehydration and baking (200° C./20 minutes). Then, the resist solution obtained in 1) was applied on the glass substrate after washing with a thickness of 2 µm using a spin coater, and a cured film (undercoat layer) was formed by drying for 1 hour by heating at 220° C.

3) Preparation of Dye Resist Solution (Colored Curable Composition [Negative-Type])

9.4 g of a resist solution obtained in 1), 0.40 g of the aforementioned example compound 1 (dye represented by the formula (1)) which is a dye of the invention and 0.35 g of the aforementioned example compound a-1 (dye represented by the formula (2)) were mixed and dissolved to obtain a dye resist solution (solution of colored curable composition [negative-type]).

4) Exposure and Development of the Dye Resist Solution (Imgage Formation)

The dye resist solution obtained in 3) was applied on the undercoat layer of the glass substrate with the underlayer obtained in 2) using a spin coater so that the thickness of the layer is 1.0 µm, and the coating layer was pre-baked at 110° C. for 120 seconds.

Subsequently, the coated layer was irradiated with a light at a wavelength of 365 nm using an exposure device with a luminous energy of 500 mJ/cm$^2$ through a mask with a thickness of 20 µm. After irradiation, the substrate was developed at 25° C. for 40 seconds using a developer (trade name: CD-2000, manufactured by Fuji Film Arch Co.). The substrate was rinsed in running water, and a cyan color pattern image was obtained after spray-drying.

In this manner, there was obtained a red pattern suitable as a red pixel for constituting a color filter.

5) Evaluation

The dye resist solution prepared as described above was subjected to evaluations of a storage stability in time and of heat resistance and light resistance of a coated film formed by coating the dye resist solution on a glass substrate, in the following manner. Results of evaluations are shown in Table 2.

Storage Stability in Time

After the dye resist solution was stored for 1 month at the room temperature, a level of precipitation of abnormal substances in the solution was visually evaluated according to following criteria:

[Judging Criteria]
 A: no precipitation observed
 B: slight precipitation observed
 C: precipitation observed Heat Resistance The glass substrate coated with the dye resist was placed on a hot plate so that the substrate surface contact the hot plate, and was heated at 200° C. for 1 hour. The changes of chromaticity before and after placing on the hot plate, or color difference ΔEab, were measured using a chromaticity meter (trade name: MCPD-1000, manufactured by Otsuka Electronic Co.). ΔEab obtained was used as an index indicating the extent of heat resistance, and was evaluated by the following criteria. The smaller ΔEab value shows better heat resistance.

[Criteria]
 A: ΔEab<5
 B: 5≦ΔEab≦10
 C: ΔEab>10

Light Resistance

The glass substrate coated with the dye resist was irradiated wit a xenon lamp at an illuminance of 50,000 lux for 20 hours (corresponds to 1,000,000 lux-h), and the changes of chromaticity before and after irradiation, or ΔEab, were measured. The ΔEab value obtained was used as an index indicating the extent of light resistance, and was evaluated according to the following criteria. The smaller ΔEab value shows the better light resistance.

[Criteria]
 A: ΔEab<3
 B: 3≦ΔEab≦10
 C: ΔEab>10

Examples 26-30

Red patterns were prepared in the same manner as in Example 25 except that the dye according to the invention, in the "3) preparation of dye resist solution" in Example 25, was changed as shown in Table 2 (however in equimolar amounts), and were evaluated in a similar manner. Results of evaluation are shown in Table 2.

Example 31

Red patterns were formed and evaluated in the same manner as in Example 25 except that "3) Preparation of dye resist solution" was modified in the following manner. Results of evaluation are shown in Table 2.

Preparation of Dye Resist Solution (Colored Curable Composition [Negative-Type])

9.4 g of a resist solution obtained in 1), 0.30 g of the aforementioned example compound 1 (dye represented by the formula (1)) which is a dye of the invention, 0.35 g of the aforementioned example compound f-25 (dye represented by the formula (2)) and 0.10 g of the aforementioned example compound g-(1) (dye represented by the formula (2)) were mixed and dissolved to obtain a dye resist solution (solution of colored curable composition [negative-type]).

Examples 32-34

Red patterns were formed and evaluated in the same manner as in Example 31 except that the dye of the invention in "3) Preparation of dye resist solution" therein was modified (in equimolar amount) as shown in Table 2. Results of evaluation are shown in Table 2.

Comparative Examples 3-4

Comparative Red patterns were formed and evaluated in the same manner as in Example 25 except that the dye of the invention in "3) Preparation of dye resist solution" therein was modified (in equimolar amount) as shown in Table 2. Results of evaluation are shown in Table 2, together with the results of Examples.

TABLE 2

|  | Dye | | | Storage stability | Heat resistance | Light resistance |
|---|---|---|---|---|---|---|
|  | (1) | (2) | (3) | | | |
| Example 25 | Example compound 1 | Example compound a-1 | — | A | A | A |
| Example 26 | Example compound 6 | Example compound f-31 | — | B | A | A |
| Example 27 | Example compound 9 | Example compound f-33 | — | A | A | A |
| Example 28 | Example compound 13 | Example compound f-7 | — | A | A | A |
| Example 29 | Example compound 46 | Example compound f-25 | — | A | A | A |
| Example 30 | Example compound 33 | Example compound H-1 | — | A | B | B |
| Example 31 | Example compound 1 | Example compound f-25 | Example compound g-(1) | A | A | A |
| Example 32 | Example compound 6 | Example compound f-33 | Example compound g-(1) | A | A | A |
| Example 33 | Example compound 9 | Example compound f-7 | Example compound g-(21) | A | A | A |
| Example 34 | Example compound 13 | Example compound f-31 | Example compound g-(2) | A | A | A |
| Comparative Examples 3 | C.I.Solvent Yellow 162 | D-1 (see below) | — | C | C | C |
| Comparative Examples 4 | C.I.Solvent Yellow 82 | D-1 (see below) | — | C | C | C |

*) In the table, example compounds in the examples are dyes represented by the formulae (1)-(3).

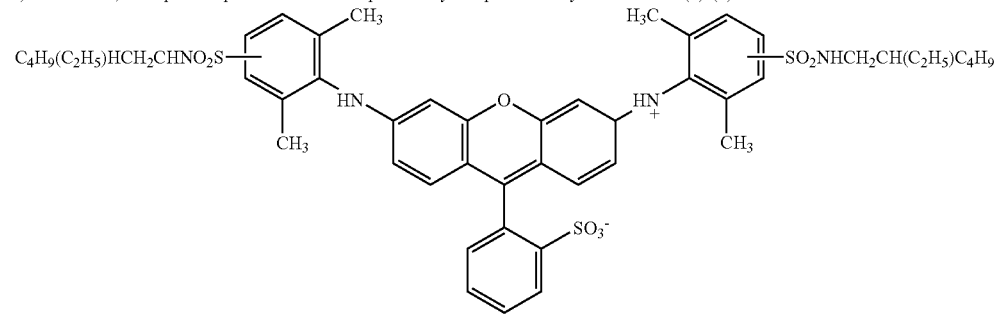

D-1

As shown in Table 2, Examples employing the dye represented by the formula (1) and the dye represented by the formula (2) and/or the dye represented by the formula (3) showed superior storage stability in the colored curable compositions in solution, in comparison with Comparative Examples utilizing other dyes. Also red patterns formed with such colored curable compositions were satisfactory in the heat resistance and the light resistance.

Example 35

1) Preparation of Colored Curable Composition (Positive-Type)

A photoresist solution (the colored curable composition (positive-type) of the invention) was obtained by mixing and dissolving the composition below.

| [Composition] | |
|---|---|
| Ethyl lactate (EL) | 30 parts |
| Resin P-1 below | 3.0 parts |
| Naphthoquinone diazide compound N-1 below | 1.8 parts |

| -continued | |
|---|---|
| [Composition] | |
| Hexamethoxymethylol modified melamine (cross-linking agent) | 0.6 parts |
| TAZ-107 (photooxidation agent manufactured by Midori Chemical Co.) | 1.2 parts |
| Fluorinated surfactant (trade name: F-475, manufactured by Dai-Nippon Ink Chemical Industry Co.) | 0.0005 parts |
| Example compound 3 (Dye represented by the formula (1)) | 0.5 parts |
| Example compound g-(1) (Dye represented by the formula (2)) | 1.0 parts |

Synthesis of Resin P-1

Benzyl methacrylate (70.0 g), methacrylic acid (13.0 g), 2-hydroxyethyl methacrylate (17.0 g), ethyl lactate (300 g) and propyleneglycol monomethylether acetate (300 g) were placed in a three-neck flask equipped with a stirrer, reflux condenser and thermometer, and the mixture was stirred for 10 hours at 65° C. in a nitrogen stream after adding a catalytic quantity of a polymerization initiator (trade name: V-65, manufactured by Wako Pure Chemical Industries, Inc.). The resin solution obtained was dripped into 20 L of ion-exchange water with vigorous stirring to obtain a white powder. The white powder obtained was dried at 40° C. for 20 hours in vacuum to obtain 140 g of resin P-1. This resin P-1 had a weight average molecular weight of 28,000 and number average molecular weight of 11,000 as measured by GPC.

Synthesis of Naphthoquinone Diazide Compound N-1

Trisp-PA (42.45 g: manufactured by Honshu Chemical Co.), o-naphthoquinone diazide-5-sulfonylchloride (61.80 g) and acetone (300 ml) were placed in a three-neck flask, and triethylamine (24.44 g) was added dropwise at room temperature in 1 hour. After stirring for 2 hours after completing dropwise addition, the reaction solution was poured into a large volume of water with stirring. Precipitated Naphthoquinone diazide sulfonic acid was collected by suction filtration, and the product was dried in vacuum for 24 hours at 40° C. to obtain naphthoquinone diazide compound N-1.

2) Exposure and Development of Colored Curable Composition (Image Formation)

A glass substrate with an undercoat layer was prepared as in Example 25, and the colored curable composition prepared as described above was coated on the glass substrate with an undercoat layer, prebaked, exposed, developed, rinsed and spray dried to obtain a orange pattern, which was then heated for 5 minutes at 180° C. (post-bake), as in Example 25. The formed orange pattern showed a satisfactory rectangular profile.

Subsequently, a storage stability in time of the dye resist solution prepared as described above, and heat resistance and light resistance of coated films formed by coating the dye resist solutions on glass substrates, were evaluated in the same manner as in Example 25. As in the negative-type described above, satisfactory results were obtained in the storage stability, the light resistance and the heat resistance.

Examples 36-45

Coated films were formed on silicon wafer substrates by operations same as those in Examples 25-34 except that the glass substrates therein were replaced by silicon wafer substrates. Then a square pattern of 2 μm was exposed with an exposure amount of 500 mJ/cm² with an i-line reduction projection exposure apparatus, and was developed with a developing solution formed by diluting CD-2000 (manufactured by Fujifilm Arch Co.) to 60%, for 60 seconds at 23° C. It was then rinsed for 30 seconds with running water, and spray dried. As a result, there were obtained square patterns having a satisfactory profile with a substantially rectangular cross section and suitable as a color filter for a CCD.

The invention can provide a novel azo dye which has an excellent color hue, sufficient resistances to light, heat, humidity and environmental active gas, and a high spectral absorption coefficient; a colored curable composition which has a high sensitivity, a high resolution, high transmission characteristics, a satisfactory color hue, and is excellent in a heat resistance, a light resistance and a storage stability; a color filter which has a high resolution and high transmission characteristics, and is excellent in a color hue, a heat resistance, and a light resistance; and a color filter producing method capable of preparation of such color filter with a high productivity.

What is claimed is:
1. An azo dye represented by the following formula (1-A)

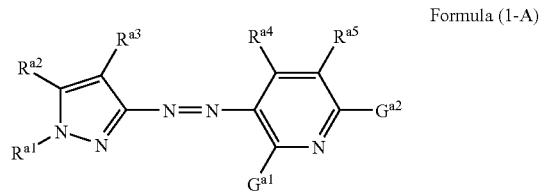

Formula (1-A)

wherein, in the formula (1-A), $R^{a1}$ represents an aryl group; $R^{a2}$ represents a hydrogen atom or an aliphatic group; $R^{a3}$ represents a cyano group; $R^{a4}$ represents an aliphatic group; $R^{a5}$ represents a cyano group; and $G^{a1}$ and $G^{a2}$ each independently represents an aliphatic amino group.

2. A colored curable composition comprising at least one dye represented by the following formula (1-A):

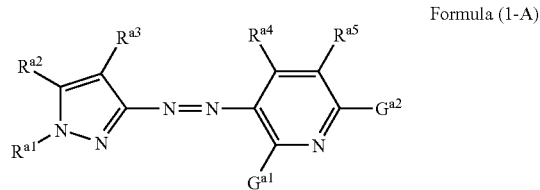

Formula (1-A)

wherein, in the formula (1-A), $R^{a1}$ represents an aryl group; $R^{a2}$ represents a hydrogen atom or an aliphatic group; $R^{a3}$ represents a cyano group; $R^{a4}$ represents an aliphatic group; $R^{a5}$ represents a cyano group; and $G^{a1}$ and $G^{a2}$ each independently represents an aliphatic amino group.

3. A colored curable composition according to claim 2, comprising at least one dye represented by the formula (1-A) and at least one selected from dyes represented by the following formula (2) and dyes represented by the following formula (3):

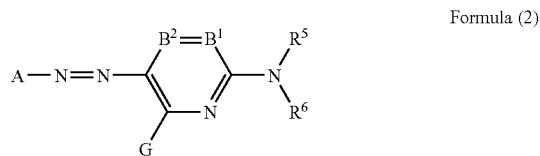

Formula (2)

wherein, in the formula (2), A represents a residue of a 5-membered heterocyclic diazo component A-NH₂; $B^1$ represents —$CR^1$= or a nitrogen atom; $B^2$ represents —$CR^2$= or a nitrogen atom; $B^1$ and $B^2$ are not nitrogen atoms at the same time; $R^5$ and $R^6$ each independently represents a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group, or a sulfamoyl group, however, $R^5$ and $R^6$ do not represent hydrogen atoms at the same time; G, $R^1$ and $R^2$ each independently represents a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxyl group, an alkoxy group, an aryloxy group, a silyloxy group, an acyloxy group, a carbamoyloxy group, a heterocyclic oxy group, an alkoxycarbonyloxy group, an aryloxycarbonyloxy group, a substituted amino group substituted with an alkyl, an aryl or a heterocyclic group, an acylamino group, a ureido group, a sulfamoylamino group, an alkoxycarbonylamino group, an aryloxycarbonylamino group, an alkylsulfonylamino group, an arylsulfonylamino group, an aryloxycarbonylamino group, a nitro group, an alkylthio group, an arylthio group, an alkylsulfonyl group, an arylsulfonyl group, an alkylsulfinyl group, an arylsulfinyl group, a sulfamoyl group, a sulfo group or a heterocyclic thio group; or $R^1$ and $R^5$, or $R^5$ and $R^6$ may be mutually bonded to form a 5- or 6-membered ring:

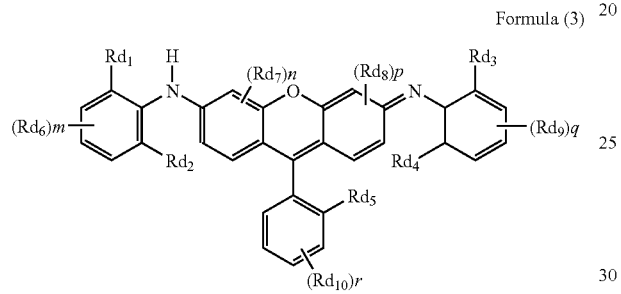

Formula (3)

wherein, in the formula (3), $Rd_1$, $Rd_2$, $Rd_3$ and $Rd_4$ each independently represents a hydrogen atom or an aliphatic group; $Rd_5$ represents a sulfo group or a sulfamoyl group; $Rd_6$, $Rd_7$, $Rd_8$, $Rd_9$ and $Rd_{10}$ each independently represents an aliphatic group, an acylamino group, a carboxyl group, an aliphatic oxy group, an aliphatic oxycarbonyl group, a carbamoyl group, a sulfa group, or a sulfamoyl group; m, n, p and q each independently represents an integer from 0 to 3; and r represents an integer from 0 to 4.

4. A colored curable composition according to claim 2, further comprising a binder.

5. A colored curable composition according to claim 2, further comprising a crosslinking agent.

6. A colored curable composition according to claim 2, further comprising a polymerizable monomer.

7. A colored curable composition according to claim 2, further comprising a radiation-sensitive compound.

8. A colored curable composition according to claim 7, wherein the radiation-sensitive compound is a photopolymerization initiator.

9. A colored curable composition according to claim 2, further comprising a naphthoquinone diazide compound.

10. A color filter comprising at least one dye represented by the following formula (1-A):

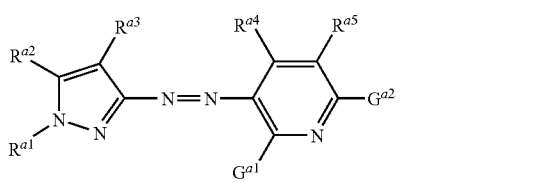

Formula (I-A)

wherein, in the formula (1-A), $R^{a1}$ represents an aryl group; $R^{a2}$ represents a hydrogen atom or an aliphatic group; $R^{a3}$ represents a cyano group; $R^{a4}$ represents an aliphatic group; $R^{a5}$ represents a cyano group; and $G^{a1}$ and $G^{a2}$ each independently represents an aliphatic amino group.

11. A color filter according to claim 10, comprising at least one dye represented by the formula (1-A) and at least one selected from dyes represented by the following formula (2) and dyes represented by the following formula (3):

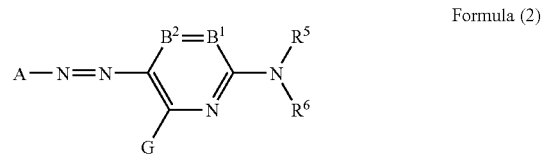

Formula (2)

wherein, in the formula (2), A represents a residue of a 5-membered heterocyclic diazo component A-NH$_2$; $B^1$ represents —$CR^1$= or a nitrogen atom; $B^2$ represents —$CR^2$= or a nitrogen atom; $B^1$ and $B^2$ are not nitrogen atoms at the same time; $R^5$ and $R^6$ each independently represents a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group, or a sulfamoyl group, however, $R^5$ and $R^6$ do not represent hydrogen atoms at the same time; G, $R^1$ and $R^2$ each independently represents a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxyl group, an alkoxy group, an aryloxy group, a silyloxy group, an acyloxy group, a carbamoyloxy group, a heterocyclic oxy group, an alkoxycarbonyloxy group, an aryloxycarbonyloxy group, a substituted amino group substituted with an alkyl, an aryl or a heterocyclic group, an acylamino group, a ureido group, a sulfamoylamino group, an alkoxycarbonylamino group, an aryloxycarbonylamino group, an alkylsulfonylamino group, an arylsulfonylamino group, an aryloxycarbonylamino group, a nitro group, an alkylthio group, an arylthio group, an alkylsulfonyl group, an arylsulfonyl group, an alkylsulfinyl group, an arylsulfinyl group, a sulfamoyl group, a sulfo group or a heterocyclic thio group; or $R^1$ and $R^5$, or $R^5$ and $R^6$ may be mutually bonded to form a 5- or 6-membered ring:

Formula (3)

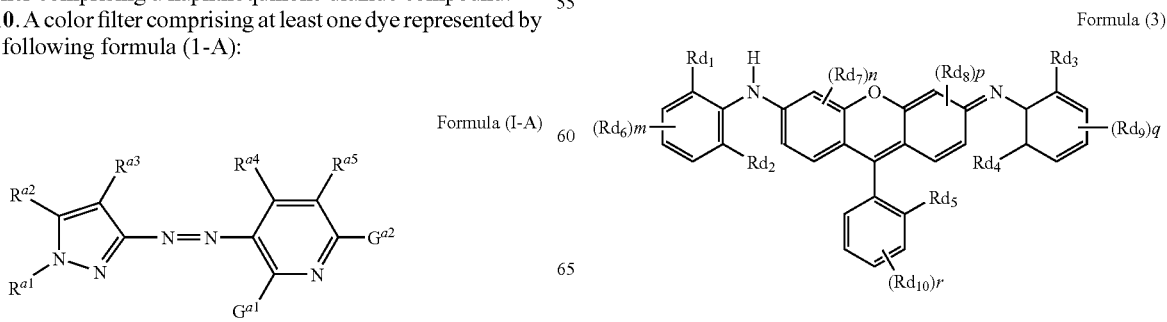

wherein, in the formula (3), $Rd_1$, $Rd_2$, $Rd_3$ and $Rd_4$ each independently represents a hydrogen atom or an aliphatic group; $Rd_5$ represents a sulfo group or a sulfamoyl group; $Rd_6$, $Rd_7$, $Rd_8$, $Rd_9$ and $Rd_{10}$ each independently represents an aliphatic group, an acylamino group, a carboxyl group, an aliphatic oxy group, an aliphatic oxycarbonyl group, a carbamoyl group, a sulfa group, or a sulfamoyl group; m, n, p and q each independently represents an integer from 0 to 3; and r represents an integer from 0 to 4.

12. A method for producing a color filter comprising: coating the colored curable composition according to claim 2 on a substrate, carrying out an exposure through a mask and carrying out a development to form a patterned image.

13. A method for producing a color filter comprising: coating the colored curable composition according to claim 3 on a substrate, carrying out an exposure through a mask and carrying out a development to form a patterned image.

* * * * *